(12) United States Patent
Cho et al.

(10) Patent No.: US 10,303,372 B2
(45) Date of Patent: May 28, 2019

(54) NONVOLATILE MEMORY DEVICE AND OPERATION METHOD THEREOF

(71) Applicant: SAMSUNG ELECTRONICS CO., LTD., Suwon-si (KR)

(72) Inventors: Youngjin Cho, Hwasung (KR);
Sungyong Seo, Hwasung (KR);
Sun-Young Lim, Hwasung (KR);
Uksong Kang, Hwasung (KR);
Chankyung Kim, Hwasung (KR);
Duckhyun Chang, Hwasung (KR);
JinHyeok Choi, Hwasung (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 173 days.

(21) Appl. No.: 15/366,137

(22) Filed: Dec. 1, 2016

(65) Prior Publication Data

US 2017/0153826 A1 Jun. 1, 2017

(30) Foreign Application Priority Data

Dec. 1, 2015 (KR) .................... 10-2015-0170115
Dec. 1, 2015 (KR) .................... 10-2015-0170119
Dec. 1, 2015 (KR) .................... 10-2015-0170123
Dec. 3, 2015 (KR) .................... 10-2015-0171660
Dec. 3, 2015 (KR) .................... 10-2015-0171665

(51) Int. Cl.
*G06F 13/16* (2006.01)
*G06F 3/06* (2006.01)
(Continued)

(52) U.S. Cl.
CPC .......... *G06F 3/0611* (2013.01); *G06F 3/0656* (2013.01); *G06F 3/0679* (2013.01); *G06F 12/0868* (2013.01); *G06F 12/0893* (2013.01); *G11C 11/005* (2013.01); *G11C 16/10* (2013.01); *G11C 16/26* (2013.01);
(Continued)

(58) Field of Classification Search
None
See application file for complete search history.

(56) References Cited

U.S. PATENT DOCUMENTS 5,197,026 A * 3/1993 Butler ................. G11C 7/00
365/185.08
6,545,935 B1 4/2003 Hsu et al.
(Continued)

FOREIGN PATENT DOCUMENTS

JP 5523835 B2 6/2014
KR 10-2014-0063660 A 5/2014

*Primary Examiner* — Brian R Peugh
(74) *Attorney, Agent, or Firm* — Sughrue Mion, PLLC

(57) ABSTRACT

A nonvolatile memory device includes a nonvolatile memory, a volatile memory being a cache memory of the nonvolatile memory, and a first controller configured to control the nonvolatile memory. The nonvolatile memory device further includes a second controller configured to receive a device write command and an address, and transmit, to the volatile memory through a first bus, a first read command and the address and a first write command and the address sequentially, and transmit a second write command and the address to the first controller through a second bus, in response to the reception of the device write command and the address.

19 Claims, 70 Drawing Sheets

(51) Int. Cl.
   *G11C 16/26* (2006.01)
   *G11C 16/10* (2006.01)
   *G06F 12/0868* (2016.01)
   *G06F 12/0893* (2016.01)
   *G11C 11/00* (2006.01)

(52) U.S. Cl.
   CPC .. *G06F 13/1689* (2013.01); *G06F 2212/1021* (2013.01); *G06F 2212/1024* (2013.01); *G06F 2212/214* (2013.01); *G06F 2212/305* (2013.01); *G06F 2212/3042* (2013.01); *G06F 2212/7203* (2013.01); *G11C 2207/2245* (2013.01)

(56) References Cited

U.S. PATENT DOCUMENTS

| | | |
|---|---|---|
| 7,584,335 B2 | 9/2009 | Daniels |
| 7,679,133 B2 | 3/2010 | Son et al. |
| 7,830,732 B2 | 11/2010 | Moshayedi et al. |
| 8,060,719 B2 | 11/2011 | Radke et al. |
| 8,180,981 B2 | 5/2012 | Kapil et al. |
| 8,281,074 B2 | 10/2012 | Jeddeloh |
| 8,397,013 B1 | 3/2013 | Rosenband et al. |
| 8,553,466 B2 | 10/2013 | Han et al. |
| 8,559,235 B2 | 10/2013 | Yoon et al. |
| 8,560,761 B2 | 10/2013 | Tzeng |
| 8,612,676 B2 | 12/2013 | Dahlen et al. |
| 8,654,587 B2 | 2/2014 | Yoon et al. |
| 8,706,968 B2 | 4/2014 | Flynn |
| 8,793,419 B1 | 7/2014 | Yeung et al. |
| 8,837,236 B2 | 9/2014 | Best |
| 8,874,831 B2 | 10/2014 | Lee et al. |
| 8,904,099 B2 | 12/2014 | Chen et al. |
| 8,914,568 B2 | 12/2014 | Chinnaswamy et al. |
| 8,930,647 B1 | 1/2015 | Smith |
| 8,949,502 B2 | 2/2015 | McKnight et al. |
| 9,015,399 B2 | 4/2015 | Brewer et al. |
| 9,087,584 B2 | 7/2015 | Dahlen et al. |
| 9,129,674 B2 | 9/2015 | Ramanujan |
| 9,158,684 B2 | 10/2015 | Lee et al. |
| 9,262,318 B1 * | 2/2016 | Vadlamani ......... G06F 12/0246 |
| 2004/0049637 A1 | 3/2004 | Morikawa |
| 2005/0251617 A1 | 11/2005 | Sinclair et al. |
| 2006/0059316 A1 | 3/2006 | Asher et al. |
| 2007/0186039 A1 * | 8/2007 | Nam .................... G06F 3/0611 711/113 |
| 2008/0126716 A1 | 5/2008 | Daniels |
| 2009/0121271 A1 | 5/2009 | Son et al. |
| 2009/0248957 A1 | 10/2009 | Tzeng |
| 2009/0300269 A1 | 12/2009 | Radke et al. |
| 2009/0313416 A1 | 12/2009 | Nation |
| 2010/0036997 A1 | 2/2010 | Brewer et al. |
| 2010/0088460 A1 | 4/2010 | Jeddeloh |
| 2010/0202239 A1 | 8/2010 | Moshayedi et al. |
| 2010/0293420 A1 | 11/2010 | Kapil et al. |
| 2011/0004731 A1 | 1/2011 | Tsuruta |
| 2011/0022801 A1 | 1/2011 | Flynn |
| 2011/0153916 A1 | 6/2011 | Chinnaswamy et al. |
| 2011/0216603 A1 | 9/2011 | Han et al. |
| 2011/0233648 A1 | 9/2011 | Seol et al. |
| 2011/0246723 A1 | 10/2011 | Van Der Wolf et al. |
| 2012/0051143 A1 | 3/2012 | Yoon et al. |
| 2012/0131253 A1 | 5/2012 | McKnight et al. |
| 2012/0166891 A1 | 6/2012 | Dahlen et al. |
| 2012/0297147 A1 | 11/2012 | Mylly et al. |
| 2013/0024602 A1 | 1/2013 | Sauber et al. |
| 2013/0086309 A1 | 4/2013 | Lee et al. |
| 2013/0086311 A1 | 4/2013 | Huang et al. |
| 2013/0268728 A1 | 10/2013 | Ramanujan et al. |
| 2013/0275682 A1 | 10/2013 | Ramajunan et al. |
| 2013/0279262 A1 | 10/2013 | Yoon et al. |
| 2013/0290597 A1 | 10/2013 | Faber |
| 2013/0304980 A1 | 11/2013 | Nachimuthu et al. |
| 2013/0308383 A1 | 11/2013 | Best |
| 2014/0032818 A1 | 1/2014 | Chang et al. |
| 2014/0040550 A1 | 2/2014 | Nale et al. |
| 2014/0129767 A1 | 5/2014 | Ramanujan et al. |
| 2014/0143577 A1 | 5/2014 | Nachimuthu et al. |
| 2014/0156919 A1 | 6/2014 | Chen et al. |
| 2014/0181364 A1 | 6/2014 | Berke et al. |
| 2014/0204663 A1 | 7/2014 | Faber |
| 2014/0208047 A1 | 7/2014 | Vembu et al. |
| 2014/0244914 A1 | 8/2014 | Tzeng |
| 2014/0297919 A1 | 10/2014 | Nachimuthu et al. |
| 2014/0304475 A1 | 10/2014 | Ramanujan et al. |
| 2014/0337539 A1 | 11/2014 | Lee et al. |
| 2014/0351660 A1 | 11/2014 | Dahlen et al. |
| 2014/0372679 A1 | 12/2014 | Flynn et al. |
| 2015/0003175 A1 | 1/2015 | Ramanujan |
| 2015/0006805 A1 | 1/2015 | Feekes et al. |
| 2015/0006831 A1 | 1/2015 | Keshavamurthy et al. |
| 2015/0016192 A1 | 1/2015 | Rategh et al. |
| 2015/0131388 A1 | 5/2015 | Ware et al. |
| 2015/0153953 A1 | 6/2015 | Jeddeloh |
| 2015/0242313 A1 | 8/2015 | Lee et al. |

\* cited by examiner

[ADD2, ADD4, ADD5 → Cache Hit]

[ADD2, ADD4, ADD5 → Cache Hit]

NONVOLATILE MEMORY DEVICE AND OPERATION METHOD THEREOF

CROSS-REFERENCE TO RELATED APPLICATIONS

This application claims priority from Korean Patent Application Nos. 10-2015-0170123, filed Dec. 1, 2015, 10-2015-0170119, filed Dec. 1, 2015, 10-2015-0170115, filed Dec. 1, 2015, 10-2015-0171665, filed Dec. 3, 2015, and 10-2015-0171660, filed Dec. 3, 2015, in the Korean Intellectual Property Office, the disclosures of which are incorporated herein by reference in their entireties.

BACKGROUND

1. Field

Apparatuses and methods consistent with example embodiments relate to a semiconductor memory, and more particularly, relates to a nonvolatile memory device and an operation method thereof.

2. Description of Related Art

A semiconductor memory refers to a memory device that is implemented using semiconductor such as silicon (Si), germanium (Ge), gallium arsenide (GaAs), indium phosphide (InP), or the like. A semiconductor memory device is roughly divided into a volatile memory device and a nonvolatile memory device.

A volatile memory device refers to a memory device that loses data stored therein at power-off. The volatile memory device includes a static random access memory (SRAM), a dynamic ram (DRAM), a synchronous DRAM or the like. A nonvolatile memory device refers to a memory device that retains data stored therein even at power-off. The nonvolatile memory device includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

Because a response speed and an operation speed of the DRAM are fast, the DRAM is widely used as a main memory of a system. However, because the DRAM is a volatile memory in which data is lost when a power is shut off, a separate device is used to retain data stored in the DRAM. In addition, because the DRAM stores data using capacitors, the size of a unit cell is large, thereby making it difficult to increase a DRAM capacity within a restricted area.

SUMMARY

According to example embodiments, a nonvolatile memory device includes a nonvolatile memory, a volatile memory being a cache memory of the nonvolatile memory, and a first controller configured to control the nonvolatile memory. The nonvolatile memory device further includes a second controller configured to receive a device write command and an address, and transmit, to the volatile memory through a first bus, a first read command and the address and a first write command and the address sequentially, and transmit a second write command and the address to the first controller through a second bus, in response to the reception of the device write command and the address.

According to example embodiments, a nonvolatile memory device includes a nonvolatile memory, a volatile memory being a cache memory of the nonvolatile memory, and a first controller configured to control the nonvolatile memory. The nonvolatile memory device further includes a second controller configured to receive a first device read command and an address, and transmit a first read command and the address to the volatile memory through a first bus, and transmit a second read command and the address to the first controller through a second bus, in response to the reception of the device read command and the address.

According to example embodiments, a nonvolatile memory device includes a nonvolatile memory, a volatile memory being a cache memory of the nonvolatile memory, and a first controller configured to share a memory data line with the volatile memory, and control the nonvolatile memory. The nonvolatile memory device further includes a second controller configured to share a tag data line with the volatile memory and the first controller, receive a first device read command and an address from an external device, and transmit a first read command and the address to the volatile memory through a first bus, and transmit a second read command and the address to the first controller through a second bus, in response to the reception of the device read command and the address. The volatile memory is configured to, in response to the transmission of the first read command and the address, transmit, through the memory data line, first data that is stored in a first area corresponding to a part of the address, of the volatile memory, and transmit, through the tag data line, a tag that is stored in the first area. The second controller is further configured to receive the transmitted tag from the volatile memory through the tag data line, determine whether a cache hit occurs, based on the received tag and the address, and transmit, to the external device, a result of the determination.

According to example embodiments, there is provided an operation method of a nonvolatile memory device including a nonvolatile memory, a volatile memory being a cache memory of the nonvolatile memory, a first controller configured to share a memory data line with the volatile memory, and control the nonvolatile memory, and a second controller configured to control the volatile memory through a first bus, and control the first controller through a second bus, in response to a control of an external device. The method includes receiving, by the second controller, a device write command and an address from the external device, and controlling, by the second controller, the volatile memory and the nonvolatile memory in response to the receiving of the device write command and the address such that first data that is stored in a first area corresponding to a part of the address, of the volatile memory, is selectively stored into the nonvolatile memory based on a first tag that is stored in the first area. The method further includes receiving, by the volatile memory and the first controller, write data from the external device through the memory data line, and controlling, by the second controller, the volatile memory and the first controller such that the received write data is stored in the first area of the volatile memory and/or in a second area corresponding to the address, of the nonvolatile memory.

According to example embodiments, there is provided an operation method of a nonvolatile memory device including a nonvolatile memory, a volatile memory being a cache memory of the nonvolatile memory, a first controller configured to share a memory data line with the volatile memory, and control the nonvolatile memory, and a second controller configured to control the volatile memory through a first bus, and control the first controller through a second bus, in response to a control of an external device. The method includes receiving, by the second controller, a first device read command and an address from the external device, and in response to the receiving of the first device read command and the address, controlling, by the second controller, the volatile memory to transmit first data that is stored in a first area corresponding to a part of the address, of the volatile memory, to the external device through the memory data line, and transmit a tag that is stored in the first area through a tag data line. The method further includes determining, by the second controller, whether a cache hit occurs, based on the transmitted tag and the address, and transmitting, to the external device, a result of the determining.

According to example embodiments, a memory system includes a first memory, a second memory being a cache memory of the first memory, and a memory controller configured to share a data bus with the first memory and the second memory, exchange data with the first memory and the second memory through the data bus, and during a read operation, receive cache information from the second memory, and selectively receive data from the first memory based on the received cache information.

According to example embodiments, a memory system includes a first memory, a second memory being a cache memory of the first memory, and a memory controller configured to share a data bus with the first memory and the second memory, exchange data with the first memory and the second memory through the data bus, and during a write operation, receive cache information from the second memory, and selectively store data from the second memory into the first memory based on the received cache information.

According to example embodiments, a nonvolatile memory device includes a nonvolatile memory, a volatile memory being a cache memory of the nonvolatile memory, and a first controller configured to control the nonvolatile memory. The nonvolatile memory device further includes a second controller configured to receive a device write command and an address from an external device, and in response to the reception of the device write command and the address, control the volatile memory to transmit, to the first controller, first data and a first tag that are stored in a first area corresponding to the address, of the volatile memory, and control the first controller to store the transmitted first data in the nonvolatile memory based on the address and the transmitted first tag.

DETAILED DESCRIPTION

Figure 1:
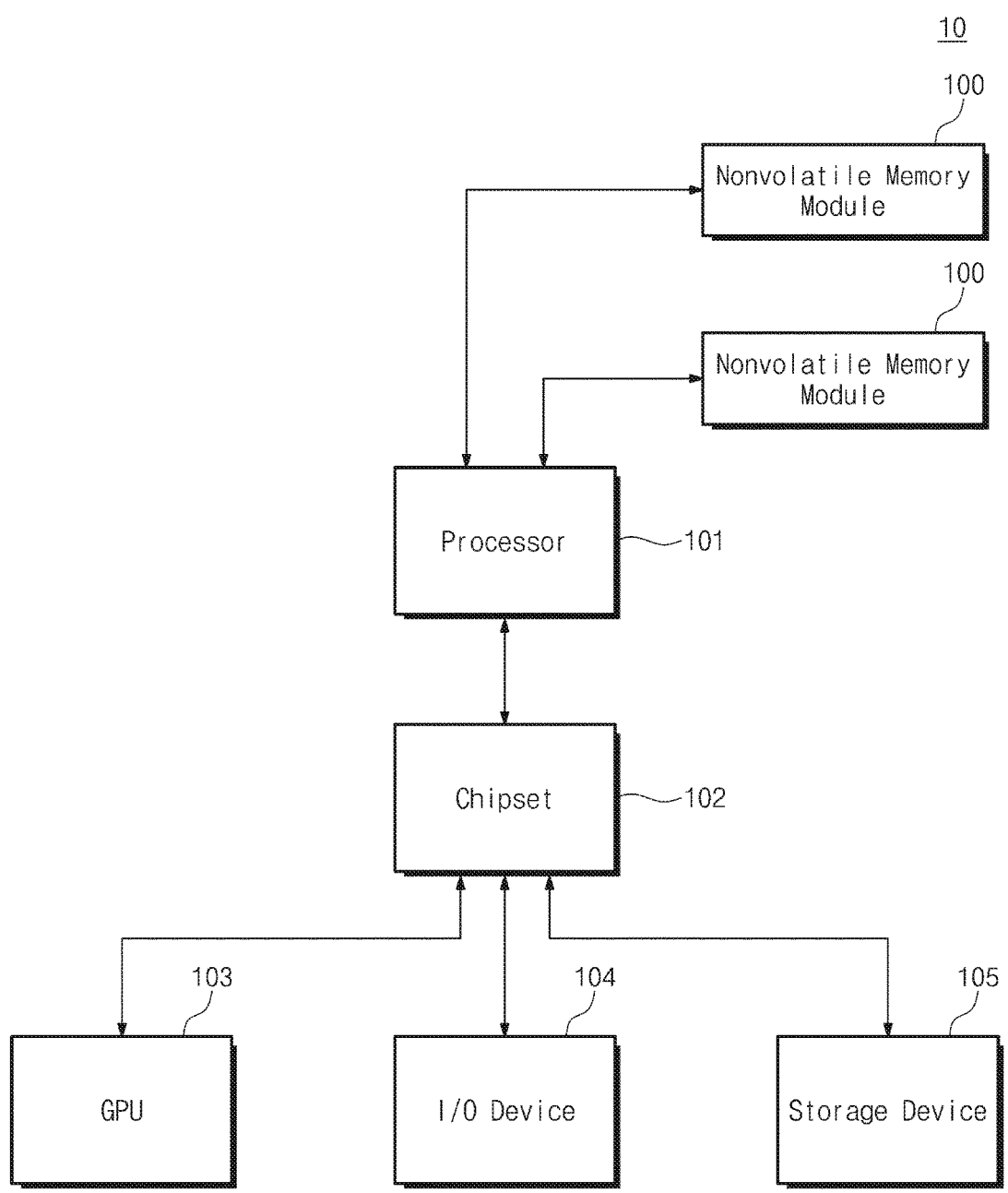
FIG. 1 is a block diagram illustrating a user system according to example embodiments of the inventive concept.

FIG. 1 is a block diagram illustrating a user system according to example embodiments of the inventive concept. Referring to FIG. 1, a user system 10 may include nonvolatile memory modules 100 or nonvolatile memory devices, a processor 101, a chipset 102, a graphic processing unit (GPU) 103, an input/output device (I/O) 104, and a storage device 105. In example embodiments, the user system 10 may be a computing system such as a computer, a notebook, a server, a workstation, a portable communication terminal, a personal digital assistant (PDA), a portable multimedia player (PMP), a smartphone, or a wearable device.

The processor 101 may control an overall operation of the user system 10. The processor 101 may perform various operations of the user system 10 and may process data.

The nonvolatile memory modules 100 may be directly connected to the processor 101. For example, each of the nonvolatile memory modules 100 may have a form of a dual in-line memory module (DIMM) and may be installed in a DIMM socket directly connected to the processor 101 to communicate with the processor 101. In example embodiments, each of the nonvolatile memory module 100 may communicate with the processor 101 based on a NVDIMM protocol.

Each of the nonvolatile memory modules 100 may be used as a main memory or a working memory. Each of the nonvolatile memory modules 100 may include a nonvolatile memory and a volatile memory. The nonvolatile memory includes a memory, which does not lose data stored therein even at power-off, such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM). The volatile memory may include a memory, which loses data stored therein at power-off, such as a static RAM (SRAM), a dynamic RAM (DRAM), or a synchronous DRAM (SDRAM).

In example embodiments, the nonvolatile memory of each nonvolatile memory module 100 may be used as a main memory of the user system 10 or the processor 101, and the volatile memory thereof may be used as a cache memory of the user system 10, the processor 101, or a corresponding nonvolatile memory module 100.

The chipset 102 may be electrically connected to the processor 101 and may control hardware of the user system 10 under control of the processor 101. For example, the chipset 102 may be connected to the GPU 103, the input/output device 104, and the storage device 105 through main buses respectively and may perform a bridge operation about the main buses.

The GPU 103 may perform a series of arithmetic operations for outputting image data of the user system 10. In example embodiments, the GPU 103 may be embedded in the processor 101 in the form of a system-on-chip (SoC).

The input/output device 104 may include various devices that make it possible to input data or an instruction to the user system 10 or to output data to an external device. For example, the input/output device 104 may include user input devices such as a keyboard, a keypad, a button, a touch panel, a touch screen, a touch pad, a touch ball, a camera, a microphone, a gyroscope sensor, a vibration sensor, a piezoelectric element, a temperature sensor, and a biometric sensor and user output devices such as a liquid crystal display (LCD), an organic light emitting diode (OLED) display device, an active matrix OLED (AMOLED) display device, a light emitting diode (LED), a speaker, and a motor.

The storage device 105 may be used as a mass storage medium of the user system 10. The storage device 105 may include mass storage media such as a hard disk drive (HDD), a solid state drive (SSD), a memory card, and a memory stick.

Figure 2:
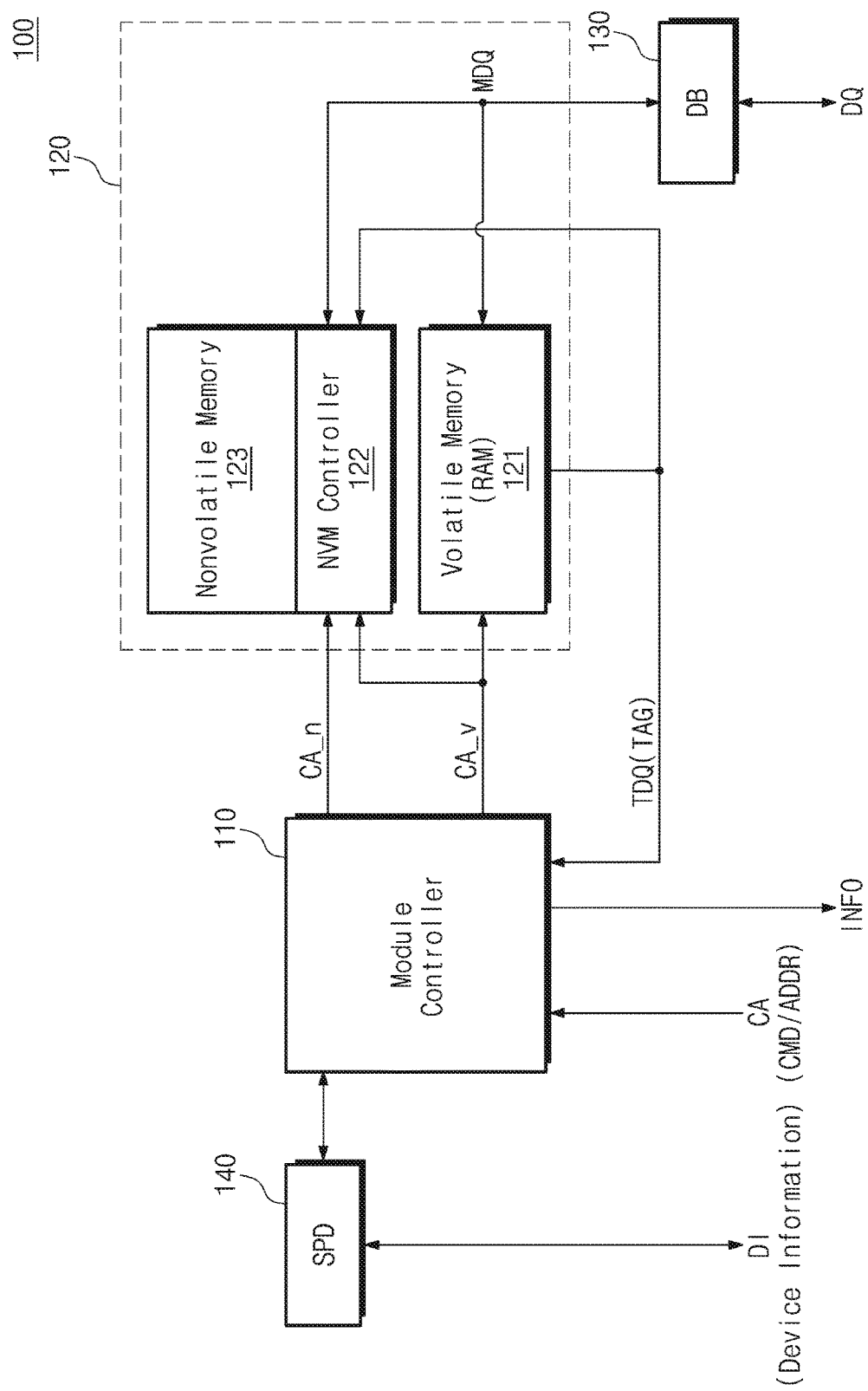
FIG. 2 is a block diagram illustrating the nonvolatile memory module of FIG. 1.

FIG. 2 is a block diagram illustrating the nonvolatile memory module of FIG. 1. Referring to FIG. 2, the nonvolatile memory module 100 may include a module controller 110, a heterogeneous memory device 120, a data buffer (DB) 130, and a serial presence detect chip (SPD) 140.

The module controller 110 may receive a command/address CA from the processor 101 and may control the heterogeneous memory device 120 in response to the received command/address CA. In example embodiments, the module controller 110 may provide the heterogeneous memory device 120 with a command/address CA_n and a command/address CA_v in response to the command/address CA from the processor 101.

In example embodiments, the command/address CA_n may be a command/address for controlling a nonvolatile memory 123 included in the heterogeneous memory device 120, and the command/address CA_v may be a command/address for controlling a volatile memory 121 included in the heterogeneous memory device 120.

Below, for descriptive convenience, the command/address CA from the processor 101 may be referred to as "module command/address", the command/address CA_v provided from the module controller 110 to the volatile memory 121 may be referred to as "volatile memory (VM) command/address", and the command/address CA_n provided from the module controller 110 to a nonvolatile memory (NVM) controller 122 may be referred to as "NVM command/address".

In example embodiments, the NVM command/address CA_n and the VM command/address CA_V may be provided through different command/address buses.

In example embodiments, the module controller 110 may be a register clock driver (RCD).

The heterogeneous memory device 120 may include the volatile memory 121, the NVM controller 122, and the nonvolatile memory 123. The volatile memory 121 may operate in response to the VM command/address CA_v from the module controller 110. The volatile memory 121 may output data and a tag TAG through a memory data line MDQ and a tag data line TDQ respectively in response to the VM command/address CA_v. The volatile memory 121 may write data and a tag respectively received through the memory data line MDQ and the tag data line TDQ based on the VM command/address CA_v.

The NVM controller 122 may operate in response to the NVM command/address CA_n from the module controller 110. For example, on the basis of the NVM command/address CA_n from the module controller 110, the NVM controller 122 may program data received through the memory data line MDQ in the nonvolatile memory 123 or may output data programmed in the nonvolatile memory 123 through the memory data line MDQ.

The NVM controller 122 may perform various operations for controlling the nonvolatile memory 123. For example, the NVM controller 122 may perform operations such as garbage collection, wear leveling, and address conversion, to use the nonvolatile memory 123 effectively. In example embodiments, the NVM controller 122 may further include elements such as an error correction circuit and a randomizer.

In example embodiments, the volatile memory 121 and the NVM controller 122 may share the same memory data line MDQ.

In example embodiments, the volatile memory 121 and the module controller 110 may share the tag data line TDQ. Alternatively, the volatile memory 121, the NVM controller 122, and the module controller 110 may share the tag data line TDQ. The NVM controller 122 may output a tag TAG through the tag data line TDQ.

The data buffer 130 may receive data through the memory data line MDQ and may provide the received data to the processor 101 through a data line DQ. Alternatively, the data buffer 130 may receive data through the data line DQ and may output the received data through the memory data line MDQ. In example embodiments, the data buffer 130 may operate under the control of the module controller 110 (e.g., a buffer command). In example embodiments, the data buffer 130 may distinguish a signal on the memory data line MDQ and a signal on the data line DQ. Alternatively, the data buffer 130 may block a signal between the memory data line MDQ and the data line DQ. That is, a signal of the memory data line MDQ may not affect the data line DQ by the data buffer 130, or a signal of the data line DQ may not affect the memory data line MDQ by the data buffer 130.

In example embodiments, the memory data line MDQ may be a data transmission path among elements included in the nonvolatile memory (e.g., a volatile memory, a nonvolatile memory, a data buffer, etc.), and the data line DQ may be a data transmission path between the nonvolatile memory module 100 and the processor 101. The tag data line TDQ may be a transmission path for sending and receiving a tag TAG.

In example embodiments, each of the memory data line MDQ, the data line DQ, and the tag data line TDQ may include a plurality of wires. Furthermore, each of the memory data line MDQ, the data line DQ, and the tag data line TDQ may include a memory data strobe line MDQS, a data strobe line DQS, and a tag data strobe line TDQS. Below, for ease of illustration, reference numerals and configurations of the memory data strobe line MDQS, the data strobe line DQS, and the tag data strobe line TDQS are omitted. However, example embodiments of the inventive concept may not be limited thereto. For example, elements connected with the memory data strobe line MDQS, the data strobe line DQS, and the tag data strobe line TDQS may send and receive data or tags in synchronization with signals of the memory data strobe line MDQS, the data strobe line DQS, and the tag data strobe line TDQS.

The SPD 140 may be a programmable read only memory device (e.g., an electrically erasable programmable read-only memory (EEPROM)). The SPD 140 may include initial information or device information DI of the nonvolatile memory module 100. In example embodiments, the SPD 140 may include the device information DI such as a module form, a module configuration, a storage capacity, a module type, an execution environment, and the like that are associated with the nonvolatile memory module 100. When the user system 10 including the nonvolatile memory module 100 is booted, the processor 101 may read the device information DI from the SPD 140 and may recognize the nonvolatile memory module 100 based on the device information DI. The processor 101 may control the nonvolatile memory module 100 based on the device information DI read from the SPD 140.

Below, for descriptive convenience, it may be assumed that the volatile memory 121 is a DRAM and that the nonvolatile memory 123 is a NAND flash memory. However, example embodiments of the inventive concept may not be limited thereto. For example, the volatile memory 121 may include another kind of random access memory, and the nonvolatile memory 123 may another kind of nonvolatile memory device.

In example embodiments, the volatile memory 121 may include a plurality of volatile memory chips, each of which is implemented with a separate chip, a separate package, etc. The volatile memory chips may be connected with the module controller 110 or the NVM controller 122 through different memory data lines or tag data lines.

In example embodiments, the processor 101 may use the nonvolatile memory 123 of the nonvolatile memory module 100 as a main memory. That is, the processor 101 may recognize a storage space of the nonvolatile memory 123 as a main memory area. The volatile memory 121 may operate as a cache memory of the processor 101 and the nonvolatile memory 123. In example embodiments, the volatile memory 121 may be used as a write-back cache. That is, the module controller 110 may determine a cache hit or a cache miss in response to the module command/address CA from the processor 101 and may control the volatile memory 121 or the nonvolatile memory 123 based on the determination result, In example embodiments, the cache hit may indicate the case that data corresponding to the module command/address CA received from the processor 101 is stored in the volatile memory 121. The cache miss may indicate the case that no data corresponding to the module command/address CA received from the processor 101 is stored in the volatile memory 121.

In example embodiments, the module controller 110 may determine whether the cache hit or the cache miss occurs, based on the tag TAG. The module controller 110 may determine whether the cache hit or the cache miss occurs, based on a result of comparing the module command/address CA from the processor 101 and the tag TAG.

In example embodiments, the tag TAG may include a part of an address that corresponds to data stored in the volatile memory 121. In example embodiments, the module controller 110 may exchange the tag TAG with the volatile memory 121 through the tag data line TDQ. In example embodiments, when data is written in the volatile memory 121, the tag TAG corresponding to the data may be written together with the data under the control of the module controller 110.

In example embodiments, the volatile memory 121 and the nonvolatile memory 123 may have a direct mapping relation of n:1 ("n" being a natural number). That is, the volatile memory 121 may be a direct mapped cache of the nonvolatile memory 123. For example, a first volatile storage area of the volatile memory 121 may correspond to 1st to nth nonvolatile storage areas of the nonvolatile memory 123. In this case, the size of the first volatile storage area may be the same as that of each of the nonvolatile storage areas. In example embodiments, the first volatile storage area may further include an area for storing additional information (e.g., a tag, an ECC, dirty information, etc.).

The nonvolatile memory module 100 may further include a separate memory. The separate memory may store information, which is used in the NVM controller 122, such as data, a program, and software. For example, the separate memory may store information, which is managed by the NVM controller 122, such as a mapping table and a flash translation layer (FTL). Alternatively, the separate memory may be a buffer memory that temporarily stores data read from the nonvolatile memory 123 or data to be stored in the nonvolatile memory 123.

Below, a write operation and a read operation of the nonvolatile memory module 100 will be described with reference to FIGS. 3 to 8. Below, for descriptive convenience, "_v" may be attached to elements (e.g., data, a tag, a command/address, etc.) associated with the volatile memory 121. For example, a VM command/address that is output from the module controller 110 to control the volatile memory 121 may be expressed by "CA_v", and data that is output from the volatile memory 121 under the control of the module controller 110 may be expressed by "DT_v". In more detail, a VM write command for writing data in the volatile memory 121 may be expressed by "WR_v", and a VM read command for reading data from the volatile memory 121 may be expressed by "RD_v".

Likewise, "_n" may be attached to elements (e.g., data, a tag, a command/address, etc.) associated with the nonvolatile memory 123. For example, an NVM command/address that is output from the module controller 110 to control the nonvolatile memory 123 may be expressed by "CA_n", and data that is output from the nonvolatile memory 123 under the control of the module controller 110 or the NVM controller 122 may be expressed by "DT_n". In more detail, an NVM write command for writing data in the nonvolatile memory 123 may be expressed by "WR_n", and an NVM read command for reading data from the nonvolatile memory 123 may be expressed by "RD_n".

Figure 3:
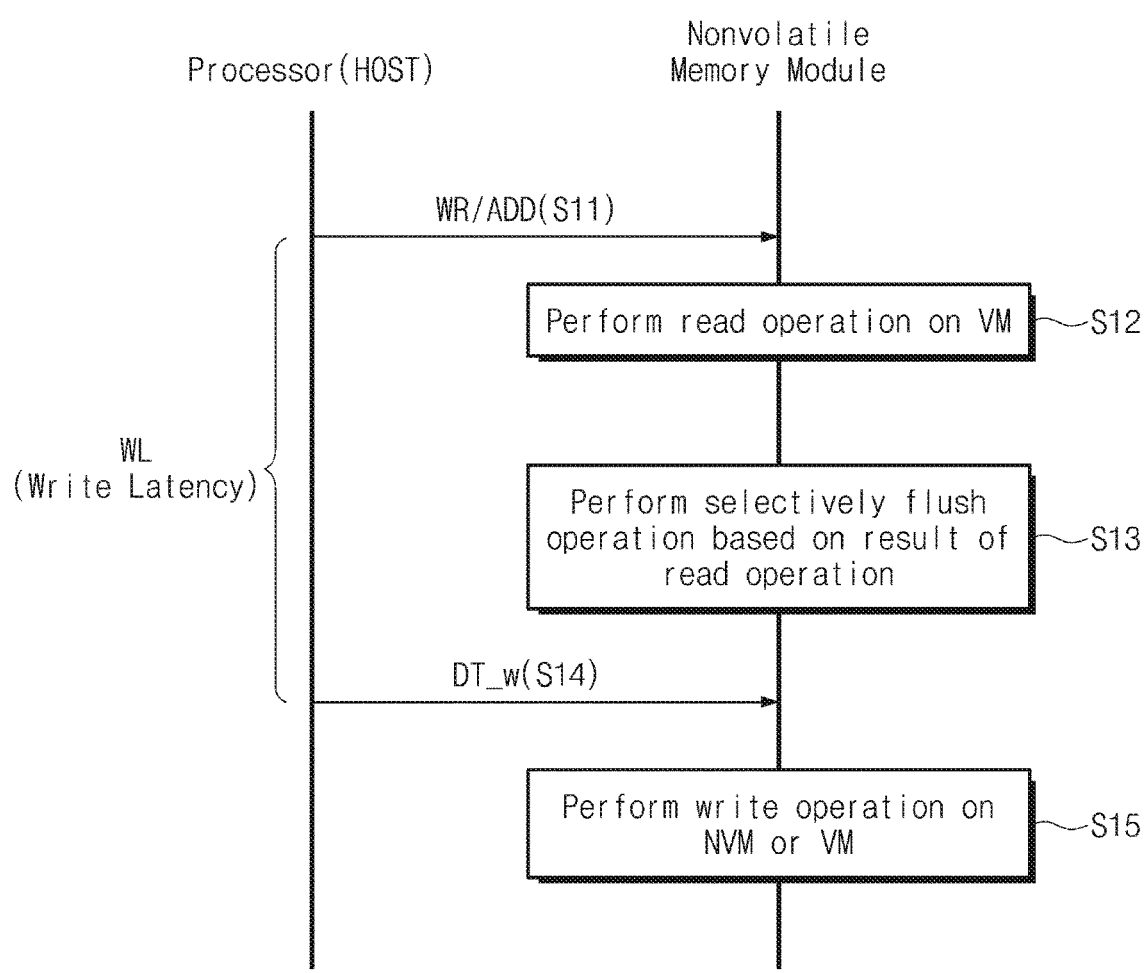
FIG. 3 is a flowchart illustrating a write operation of the nonvolatile memory module of FIG. 2.

FIG. 3 is a flowchart illustrating a write operation of the nonvolatile memory module of FIG. 2. Referring to FIGS. 1 to 3, in step S11, the processor 101 may send a module write command and address (WR/ADD). For example, to write data DT_w in the nonvolatile memory module 100, the processor 101 may send the module write command WR and the address ADD to the nonvolatile memory module 100. In example embodiments, a module write command and address (WR/ADD) may include an address ADD that corresponds to the write data DT_w. The address ADD corresponding to the write data DT_w may be a logical address (or a memory address) corresponding to a storage space of the nonvolatile memory module 100, that is, a part of a storage space of the nonvolatile memory 123.

In step S12, the nonvolatile memory module 100 may perform a read operation about the volatile memory 121 in response to the received module write command and address (WR/ADD). For example, the nonvolatile memory module 100 may read data and a tag TAG from an area, which corresponds to the received address ADD or to a part of the received address ADD, among an area of the volatile memory 121. In example embodiments, the nonvolatile memory module 100 may compare the read tag TAG and the address ADD and may determine whether a cache hit or a cache miss occurs, based on the comparison result.

In step S13, the nonvolatile memory module 100 may selectively perform a flush operation based on the result of the read operation performed in step S12. For example, when the result of the read operation indicates the cache miss, the nonvolatile memory module 100 may perform a flush operation such that data read from the volatile memory 121 is stored in the nonvolatile memory 123. In example embodiments, as described with reference to FIG. 2, the NVM controller 122, which controls the nonvolatile memory 123, and the volatile memory 121 may share the memory data line MDQ. That is, when the memory data line MDQ is driven with a voltage by data read from the volatile memory 121, the NVM controller that controls the nonvolatile memory 123 may receive (or detect) data read from the volatile memory 121 through the memory data line MDQ. The NVM controller 122 may program the received data in the nonvolatile memory 123.

In example embodiments, when the result of the read operation indicates the cache hit, the nonvolatile memory module 100 may not perform the flush operation. Alternatively, when the result of the read operation indicates the cache hit and when the read data is dirty data, the nonvolatile memory module 100 may perform the flush operation.

In example embodiments, operations of the nonvolatile memory module 100 such as the flush operation, determination of the cache hit or cache miss, and determination of dirty data may be performed by the NVM controller 122.

In step S14, the processor 101 may send the write data DT_w to the nonvolatile memory module 100. In example embodiments, an operation of step S10 may be performed after a time elapses from step S11. That is, the processor 101 may send the module write command and address (WR/ADD) to the nonvolatile memory module 100 and may send the write data DT_w to the nonvolatile memory module 100 after the time elapses. In this case, the time may be a write latency WL. In example embodiments, the write latency WL may be a time or a clock period that is determined according to the operating characteristic of the nonvolatile memory module 100. Information about the write latency WL may be stored in the SPD 140 and may be provided as the device information DI to the processor 101. The processor 101 may send the write data DT_w based on the device information DI.

In step S15, the nonvolatile memory module 100 may write or program the received write data DT_w in the volatile memory 121 or the nonvolatile memory 123.

Figure 4:
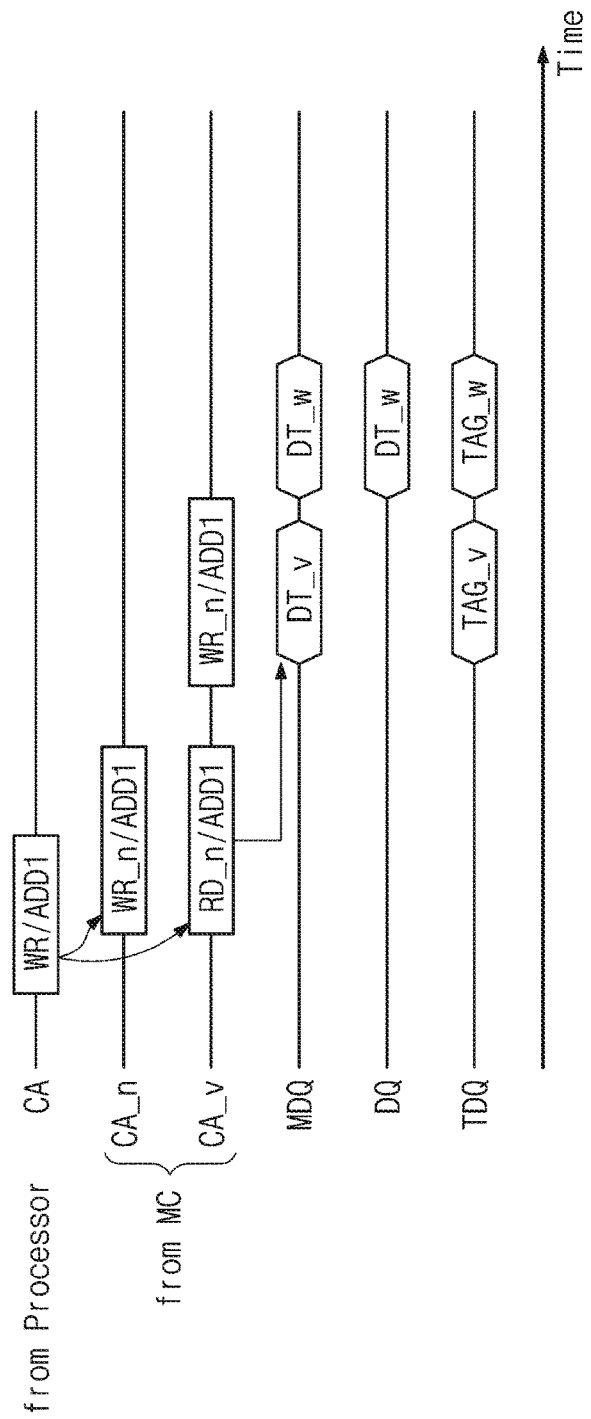
FIG. 4 is a timing diagram for describing, in detail, the operation method of FIG. 3.

FIG. 4 is a timing diagram for describing, in detail, the operation method of FIG. 3. In example embodiments, sizes and timings about commands/ADDresses, data, tags, etc. may not be limited to a timing diagram illustrated in FIG. 4.

Referring to FIGS. 1 to 4, the nonvolatile memory module 100 may receive a module write command and first address (WR/ADD1) from the processor 101. The nonvolatile memory module 100 may output the NVM command/address CA_n and the VM command/address CA_n in response to the received module write command and first address (WR/ADD1). In this case, the NVM command/address CA_n may include an NVM write command and first address (WR_v/ADD1), and the VM command/address CA_v may include a VM read command and first address (RD_v/ADD1) and a VM write command and first address (WR_v/ADD1).

The volatile memory 121 of the nonvolatile memory module 100 may output data DT_v and a tag TAG_v that are stored in an area, which corresponds to the first address ADD1, among an area of the volatile memory 121 in response to the VM read command RD_v. For example, as described above, the volatile memory 121 may drive a voltage of the memory data line MDQ based on data DT_v to output the data DT_v through the memory data line MDQ. The volatile memory 121 may drive a voltage of the tag data line TDQ based on a tag TAG to output the tag TAG through the tag data line TDQ.

The processor 101 may output the write data DT_w through the data line DQ. The nonvolatile memory module 100 may provide the write data DT_w received through the data line DQ to the volatile memory 121 or the NVM controller 122 through the memory data line MDQ and may provide the write data DT_w (or the tag TAG_w corresponding to the first address ADD1) to the volatile memory 121 through the tag data line TDQ. The volatile memory 121 or the NVM controller 122 may perform a program operation or a write operation based on the received signals.

The flush operation may be selectively performed according to the tag TAG_v read from the volatile memory 121.

Figure 5:
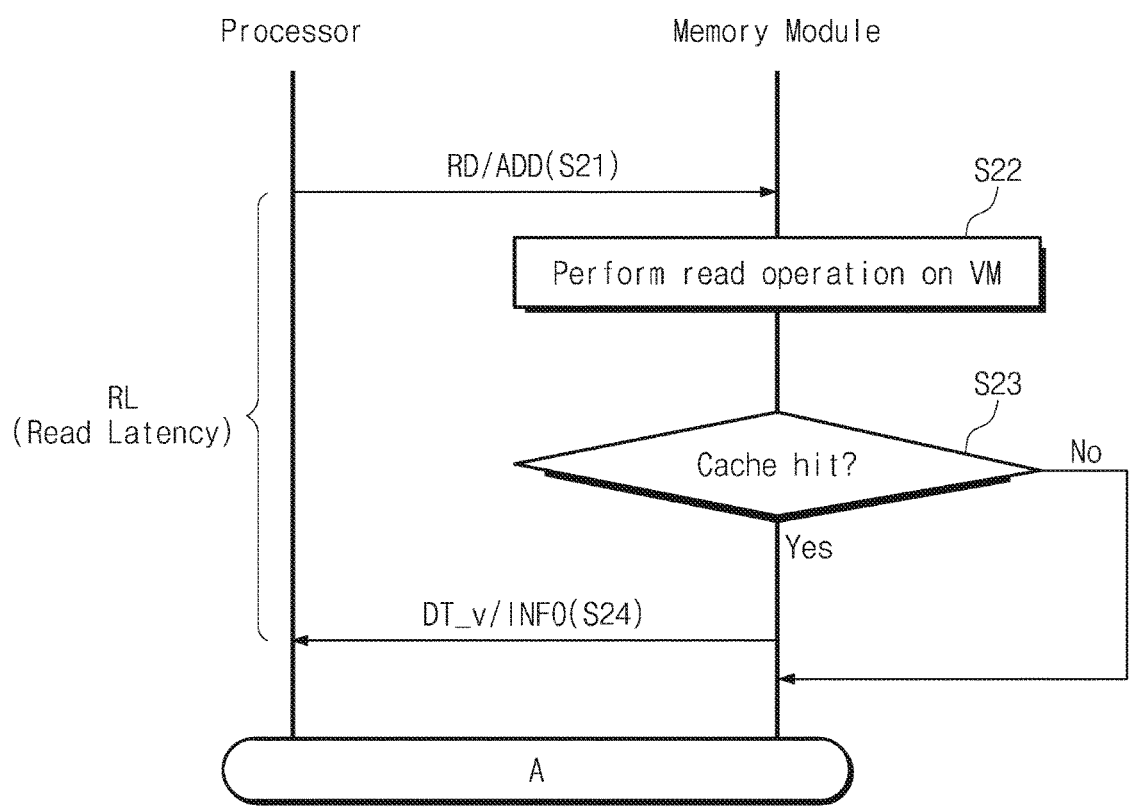
FIG. 5 is a flowchart illustrating a read operation of the nonvolatile memory module 100 of FIG. 2.

FIG. 5 is a flowchart illustrating a read operation of the nonvolatile memory module 100 of FIG. 2. Referring to FIGS. 1, 2, and 5, in step S21, the processor 101 may send a module read command and address (RD/ADD).

In step S21, the nonvolatile memory module 100 may perform a read operation about the volatile memory 121 in response to the received module read command and address (RD/ADD). For example, the module read command and address (RD/ADD) may include a read command for reading data stored in the nonvolatile memory module 1000 and a read address corresponding to the read data. The nonvolatile memory module 100 may read data and a tag stored in an area, which corresponds to the read address, among an area of the volatile memory 121.

In step S22, the nonvolatile memory module 100 may determine whether a cache hit or a cache miss occurs, based on a read result. As described above, the tag TAG may include partial information of an address. The nonvolatile memory module 100 may compare the tag TAG and the received address and may determine whether a cache hit or a cache miss occurs, based on the comparison result. When a part of the received address is the same as the tag TAG, the nonvolatile memory module 100 may determine that the cache hit occurs. When a part of the received address is different from the tag TAG, the nonvolatile memory module 100 may determine that the cache miss occurs.

In example embodiments, a read operation that is performed when the cache miss occurs will be described with reference to FIGS. 7 and 8.

When the cache hit occurs, in step S23, the nonvolatile memory module 100 may send the data read from the volatile memory 121 and cache information INFO to the processor 101. The cache information INFO may include information about whether the output data corresponds to the cache hit or the cache miss. The processor 101 may determine whether data DT_v received through the cache information INFO is valid data. That is, the nonvolatile memory module 100 may provide the processor 101 with information about the cache hit H as the cache information INFO so that the processor 101 may recognize the read data as valid data.

In example embodiments, an operation of step S24 may be performed after a time elapses from step S21. That is, the processor 101 may send the module read command and address (RD/ADD) to the nonvolatile memory module 100 and may receive the read data from the nonvolatile memory module 100 after the time elapses. In this case, the time may be a read latency RL. The read latency RL may be a time or a clock period that is determined according to the operating characteristic of the nonvolatile memory module 100. Information about the read latency RL may be stored in the SPD 140 and may be provided as the device information DI to the processor 101. The processor 101 may control the nonvolatile memory module 100 based on the read latency RL.

Figure 6:
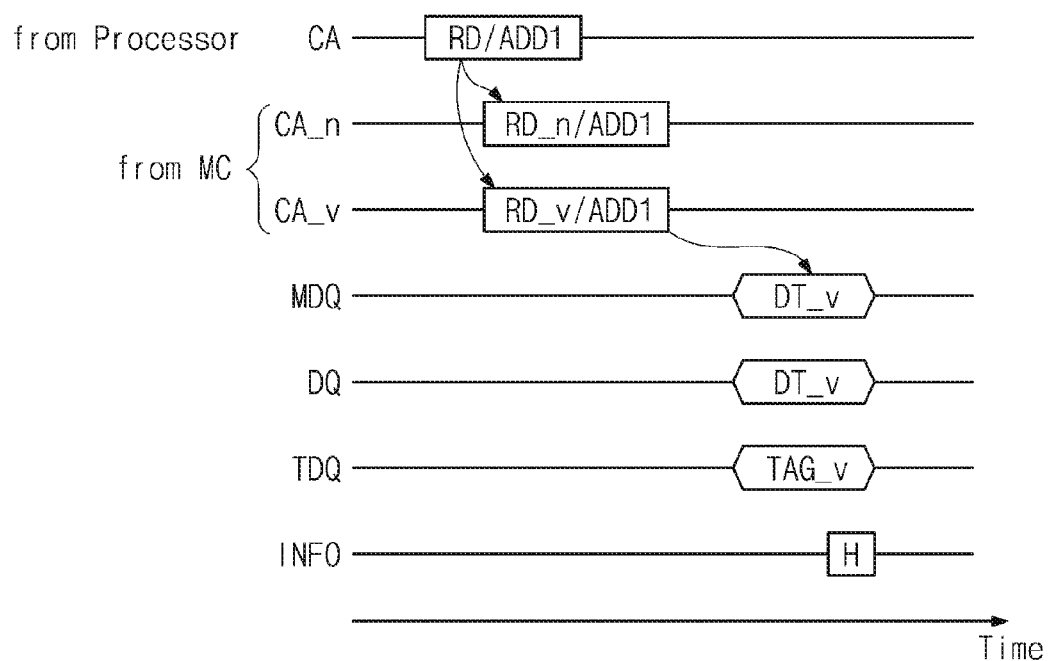
FIG. 6 is a timing diagram for describing, in detail, an operation of FIG. 5.

FIG. 6 is a timing diagram for describing, in detail, an operation of FIG. 5. Referring to FIGS. 1, 2, 5, and 6, the nonvolatile memory module 100 may a module read command and first address (RD/ADD1) from the processor 101 and may output an NVM command/address CA_n and a VM command/address CA_v in response to the received signal. In this case, the NVM command/address CA_n may include an NVM read command and first address (RD_n/ADD1) for reading data stored in the nonvolatile memory 123. The VM command/address CA_v may include a VM read command and first address (RD_v/ADD1) for reading data stored in the volatile memory 121.

The volatile memory 121 may output data DT_v and a tag TAG_V that are stored in an area, which corresponds to the first address ADD1, among an area of the volatile memory 121 in response to the VM read command and first address (RD_v/ADD1). For example, as described above, the volatile memory 121 may output the data DT_v through the memory data line MDQ by driving a voltage of the memory data line MDQ on the basis of data DT_v. The volatile memory 121 may drive a voltage of the tag data line TDQ on the basis of the tag TAG_v to output the tag TAG_v through the tag data line TDQ.

The module controller 110 may receive the tag TAG_v through the tag data line TDQ and may determine whether a cache hit or a cache miss occurs, based on a result of comparing the received tag TAG_v and the first address ADD1.

When the cache hit occurs, the nonvolatile memory module 100 may output the data DT_v read from the volatile memory 121 and may output cache information INFO including a cache hit H. The processor 101 may receive the cache information INFO including the cache hit (H) information so that it may recognize the data DT_v received through the cache information INFO as valid data.

Figure 7:
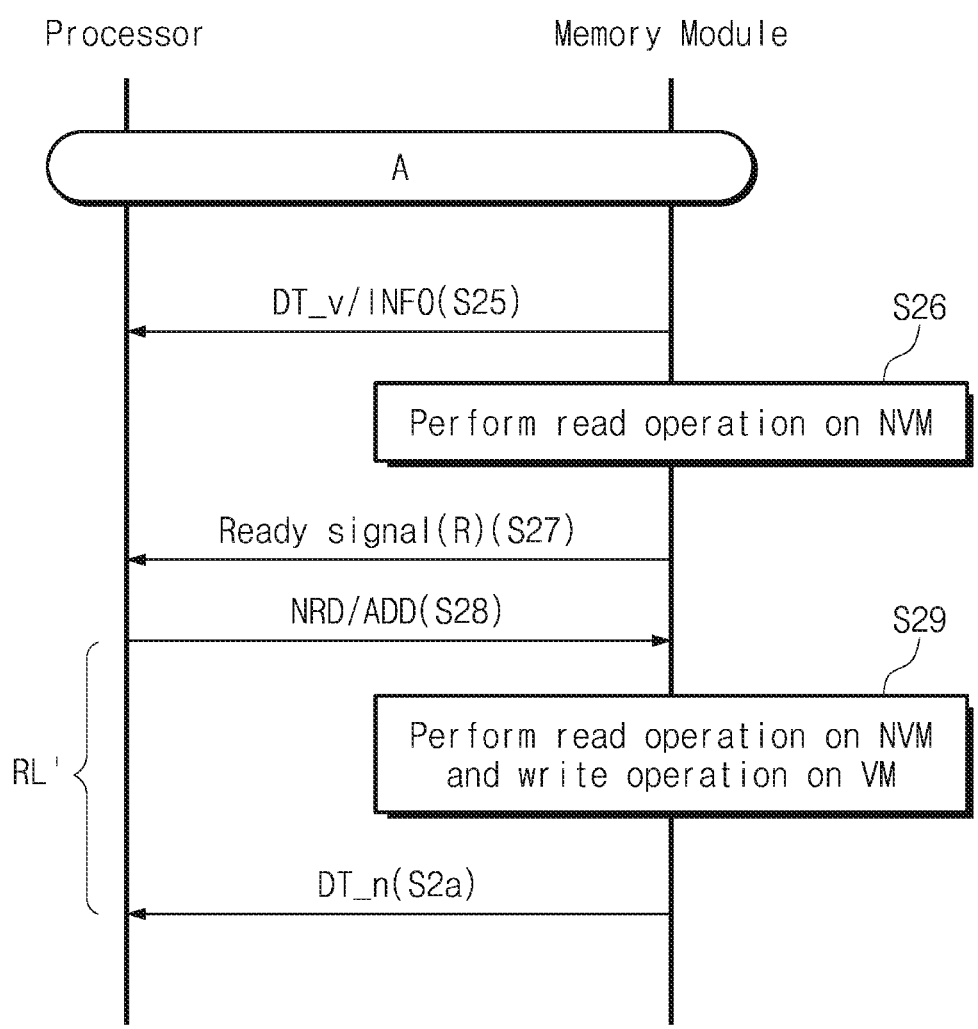
FIG. 7 is a flowchart illustrating another write operation of the nonvolatile memory module of FIG. 2.

FIG. 7 is a flowchart illustrating another write operation of the nonvolatile memory module of FIG. 2. A read operation when a cache miss occurs will be described with reference to FIG. 7.

Referring to FIGS. 1, 2, 5, and 7, when a determination result of step S23 indicates a cache miss, an operation of step S25 may be performed. In step S25, the nonvolatile memory module 100 may send data read from the volatile memory 121 and cache information INFO to the processor 101. In this case, the cache information INFO may include information about a cache miss M.

In example embodiments, as described above, an operation of step S25 may be performed after a read latency RL elapses from a point in time when a module read command and address (RD/ADD) is received.

In step S26, the nonvolatile memory module 100 may perform a pre-read operation about the nonvolatile memory 123. In example embodiments, the pre-read operation may indicate an operation in which the NVM controller 122 reads data from the nonvolatile memory 123 and stores the read data in a data buffer included in the NVM controller 122. Alternatively, the pre-read operation may indicate an operation for preparing read data to allow the NVM controller 122 to output data from the nonvolatile memory 123 within the read latency RL based on a command of the processor 101. That is, when the pre-read operation about the nonvolatile memory 123 is completed, the nonvolatile memory module 100 may output data, which is read from the nonvolatile memory 123, within the read latency RL in response to the command from the processor 101.

In example embodiments, the pre-read operation may be performed while operations of steps S22 to S25 are performed. Alternatively, when the cache miss occurs, the pre-read operation may be performed by the NVM controller 122. For example, the NVM controller 122 may receive a first address ADD1 from the module controller 110 and may receive a tag TAG through the tag data line TDQ. The nonvolatile memory module 122 may compare the tag TAG and the address ADD1 and may determine whether a cache hit or a cache miss occurs, based on the comparison result. The NVM controller 122 may perform the pre-read operation based on the determination result. In example embodiments, the NVM controller 122 may determines a cache miss or a cache hit after a tag TAG_v is output from the volatile memory 121.

After the pre-read operation is completed, in step S27, the nonvolatile memory module 100 may provide a ready signal R to the processor 101. In example embodiments, the ready signal R may be a signal indicating that the nonvolatile memory module 100 completes the pre-read operation. The ready signal R may be provided through a signal line through which the cache information INFO is transmitted or through a separate signal line.

In step S28, the processor 101 may provide the nonvolatile memory module 100 with a read command and address (NRD/ADD) in response to the ready signal R. In example embodiments, the module read command NRD may be different from the module read command RD of step S21. The module read command NRD may be a command/address for reading data from the nonvolatile memory 123.

In step S29, the nonvolatile memory module 100 may perform a read operation about the nonvolatile memory 123 and a write operation about the volatile memory 121 in response to the module read command and address (NRD/ADD). For example, the NVM controller 122 of the nonvolatile memory module 100 may drive the memory data line MDQ based on data that is prepared during the pre-read operation. The volatile memory 121 may store data received from the NVM controller 122 through the memory data line MDQ (i.e., data output from the nonvolatile memory 123). In this case, the write operation of the volatile memory 121 may be a read caching operation.

In step S2a, the nonvolatile memory module 100 send data DT_n from the nonvolatile memory 123 to the processor 101. For example, the nonvolatile memory module 100 may output the data DT_n, which is received from the nonvolatile memory 123, through the data line DQ. In example embodiments, the operation of step S2a may be performed after a time elapses from an operation of step S28. The time may be a read latency RL'. In example embodiments, the read latency RL' of FIG. 7 may be different from the read latency RL of FIG. 5. The read latencies RL and RL' may be stored in the SPD 140 and may be provided as the device information DI to the processor 101.

Figure 8:
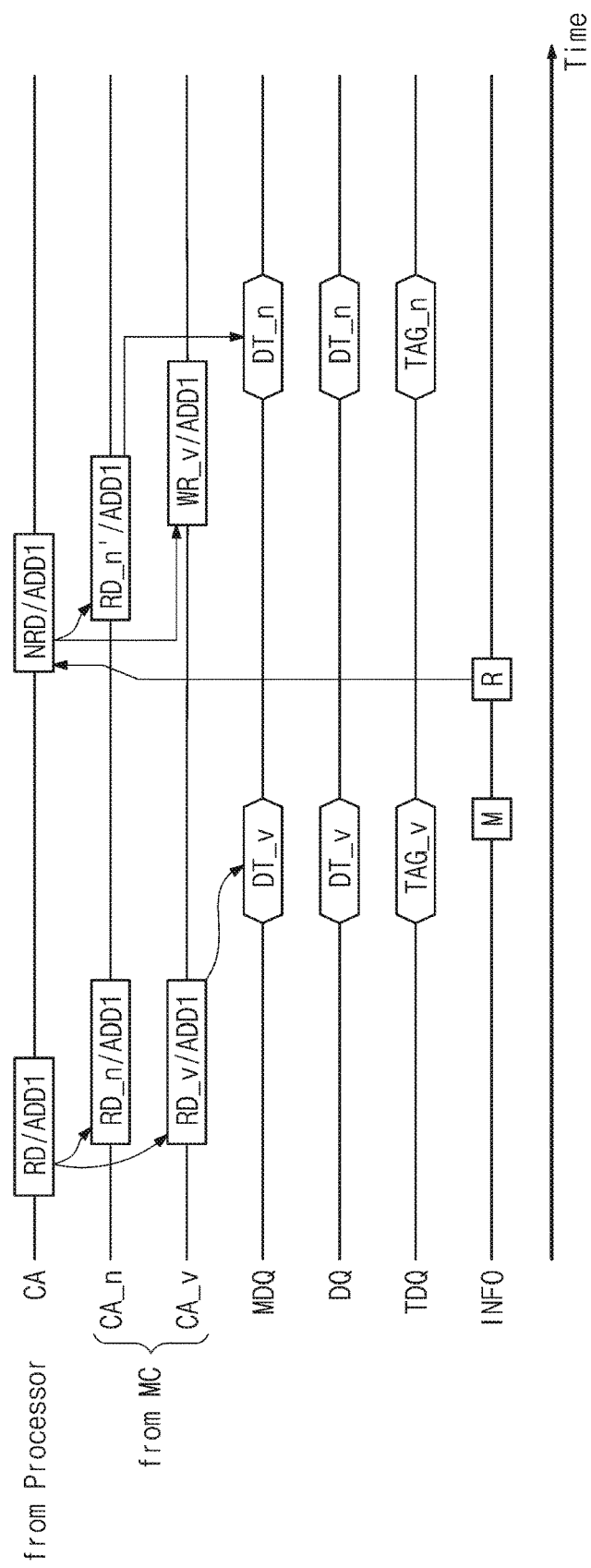
FIG. 8 is a timing diagram for describing, in detail, the read operation of FIG. 7.

FIG. 8 is a timing diagram for describing, in detail, the read operation of FIG. 7. For descriptive convenience, a duplicated description about the above-described elements may be omitted.

Referring to FIGS. 1, 2, 5, 7, and 8, the nonvolatile memory module 100 may receive a module read command and first address (RD/ADD1) from the processor 101. The module controller 110 of the nonvolatile memory module 100 may provide an NVM read command and first address (RD_n/ADD1) to the NVM controller 122 and a VM read command and first address (RD_v/ADD1) to the volatile memory 121 in response to the module read command and first address (RD/ADD1).

The volatile memory 121 may output data DT_v and a tag TAG_v that are stored in an area, which corresponds to the first address ADD1, among an area of the volatile memory 121 through the memory data line MDQ in response to the VM read command and first address (RD_v/ADD1). That is, the volatile memory 121 may drive voltages of the memory data line MDQ and the tag data line TDQ respectively based on the data DT_v and the tag TAG_v. The data DT_v on the memory data line MDQ may be output through the data line DQ under control of the module controller 110 and the data buffer 130.

The module controller 110 may compare the tag TAG_v and the first address ADD1 and may determine whether the cache hit or the cache miss occurs, based on the comparison result. When the cache miss occurs, the module controller 110 may send the cache information INFO about the cache miss M to the processor 101. In this case, the processor 101 may recognize that data DT_v received through the data line DQ is the cache miss M.

The nonvolatile memory system A200 may perform the pre-read operation. In example embodiments, the NVM controller 122 may prepare data of an area, which corresponds to a first address ADD1 among an area of the nonvolatile memory 123 in response to a nonvolatile memory read command and the first address ADD1 from the module controller 110. When the pre-read operation is completed, the module controller 110 may send the ready signal R to the processor 101. In example embodiments, the ready signal R may be provided to the processor 101 through the same line as the cache information INFO, through a separate signal line, or through the data line DQ.

The processor 101 may send a module read command and first address (NRD/ADD1) to the nonvolatile memory module 100 in response to the ready signal R. The nonvolatile memory module 100 may provide an NVM read command and first address (RD_n'/ADD1) to the NVM controller 122 in response to the module read command and first address (NRD/ADD1). In example embodiments, the NVM read command that is issued according to the module read command NRD may be different from the NVM read command RD_n that is issued according to the module read command RD.

In example embodiments, each of the module read commands NRD and RD may be a command that is defined by a communication protocol between the processor and the nonvolatile memory module 100.

The NVM controller 122 may output data DT_n, which is prepared during the pre-read operation, through the memory data line MDQ in response to the NVM read command and first address (RD_n'/ADD1). In example embodiments, the NVM controller 122 may output the data DT_n and a tag TAG_n correspond thereto through the tag data line TDQ. In example embodiments, the tag TAG_n corresponding to the data DT_n may include a part of the first address ADD1 corresponding to the data DT_n. The data DT_n on the memory data line MDQ may be output to the data line DQ under control of the module controller 110 and the data buffer 130.

In example embodiments, the nonvolatile memory module 100 may perform read caching while the data DT_n is output. For example, the module controller 110 may provide the volatile memory 121 with a VM write command and first address (WR_v/ADD1) in response to a nonvolatile memory read command/address (NRD/ADD1).

In example embodiments, a time may exist between the VM write command and first address (WR_v/ADD1) and an NVM read command and first address (RD_n'/ADD1). That is, the VM write command and first address (WR_v/ADD1) may be provided to the volatile memory 121 in synchronization with a point in time when the NVM controller 122 outputs the data DT_n through the memory data line MDQ in response to the NVM read command and first address (RD_n'/ADD1).

The volatile memory 121 may write the data DT_n on the memory data line MDQ and the tag TAG_n on the tag data line TDQ in an area, which corresponds to the first address ADD1 among an area of the volatile memory 121 in response to the VM write command and first address (WR_v/ADD1). Through the above-described read caching, a cache hit rate of the nonvolatile memory module may increase.

The above-described structures, write operations, or read operations of the nonvolatile memory module 100 are only an example and are variously modified or changed without departing from the scope of the inventive concept.

Figure 9:
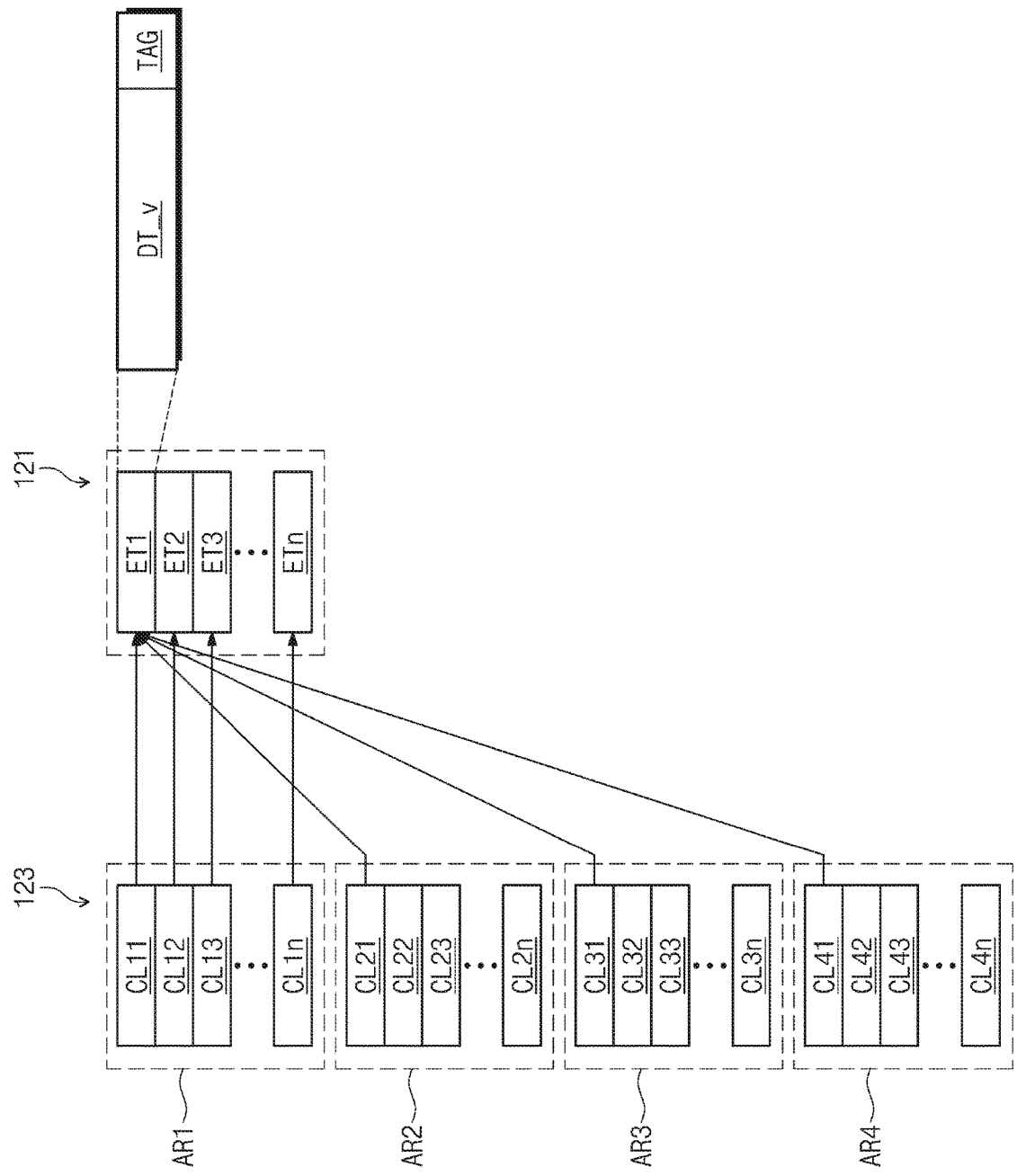
FIG. 9 is a drawing for describing a cache structure of the volatile memory of FIG. 2.

FIG. 9 is a drawing for describing a cache structure of the volatile memory of FIG. 2. For descriptive convenience, elements that are not used to describe a cache structure of the volatile memory 121 may be omitted. Furthermore, it is assumed that a storage area of the nonvolatile memory 123 is divided into first to fourth areas AR1 to AR4. The first to fourth areas AR1 to AR4 may be areas that are logically divided. The storage area of the nonvolatile memory 123 may further include a storage space as well as the first to fourth areas AR1 to AR4.

Referring to FIGS. 2 and 9, an access speed of the volatile memory 121 may be faster than that of the nonvolatile memory 123. That is, a part of data stored in the nonvolatile memory 123 may be stored in the volatile memory 121 so that a speed in which an access operation is performed according to a request of the module controller 110 or the processor 101 may be improved. For example, the volatile memory 121 may be used as a cache memory of the nonvolatile memory 123. That is, the volatile memory 121 may store a part of data stored in the nonvolatile memory 123 and may output the stored data in response to according to a request of the module controller 110 or the processor 101.

In example embodiments, the volatile memory 121 may have a direct mapping relation with the nonvolatile memory 123. For example, the volatile memory 121 may include a plurality of entries ET1 to ETn. One entry ET may indicate a storage space in which data and a tag TAG of a cache line unit are stored. The cache line unit may indicate a minimum access unit of a request of the module controller 110 or the processor 101. The volatile memory 121 may have a storage capacity that corresponds to the plurality of entries ET1 to ETn.

The nonvolatile memory device 1100 may include first to fourth areas AR1 to AR4. The first area AR1 may include a plurality of cache lines CL11 to CL1n, the second area AR2 may include a plurality of cache lines CL21 to CL2n, the third area AR3 may include a plurality of cache lines CL31 to CL3n, and the fourth area AR4 may include a plurality of cache lines CL41 to CL4n. In example embodiments, each of the cache lines CL11 to CL1n, CL21 to CL2n, CL31 to CL3n, and CL41 to CL4n may indicate a storage space of a data access unit corresponding to a request of the processor 101 or the module controller 110.

For example, the first area AR1 may include the cache lines CL11 to CL1n. The cache lines CL11 to CL1n may correspond to the entries EN1 to ETn, respectively. That is, the first cache line CL11 may correspond to the first entry ET1, and the second cache line CL12 may correspond to the second entry ET2. The second area AR1 may include the cache lines CL21 to CL2n, which correspond to the plurality of entries ET1 to ETn, respectively. Likewise, the third area AR3 may include the cache lines CL31 to CL3n, which correspond to the plurality of entries ET1 to ETn, respectively. The fourth area AR4 may include the cache lines CL41 to CL4n, which correspond to the plurality of entries ET1 to ETn, respectively.

As described above, the volatile memory 121 may have a direct mapping relation with the nonvolatile memory 123. The first entry ET1 of the volatile memory 121 may correspond to the cache lines CL11, CL21, CL31, and CL41 of the first to fourth areas AR1 to AR4 and may store data DT_v stored in one among the cache lines CL11, CL21, CL31, and CL41 of the first to fourth areas AR1 to AR4. In other words, the data DT_v stored in the first entry ET1 may correspond to one among the cache lines CL11, CL21, CL31, and CL41 of the first to fourth areas AR1 to AR4.

The first entry ET1 may include a tag TAG about the stored data DT_v. In example embodiments, the tag TAG may be information indicating whether the data DT_v stored in the first entry ET1 corresponds to any one among the cache lines CL11, CL21, CL31, and CL41 of the first to fourth areas AR1 to AR4.

In example embodiments, each of the cache lines CL11 to CL1n, CL21 to CL2n, CL31 to CL3n, and CL41 to CL4n may be selected or distinguished by an address ADD provided from the processor 101. That is, at least one among the plurality of cache lines CL11 to CL1n, CL21 to CL2n, CL31 to CL3n, and CL41 to CL4n may be selected by the address ADD provided from the processor 101, and an access operation about the selected cache line may be performed.

Each of the plurality of entries ET1 to ETn may be selected or distinguished by at least a part of the address ADD provided from the processor 101. That is, at least one among the plurality of entries ET1 to ETn may be selected by at least a part of the address ADD provided from the processor 101, and an access operation about the selected entry may be performed.

The tag TAG may include at least a part of the address ADD provided from the processor 101 or the rest thereof. For example, the case that at least one among the plurality of entries ET1 to ETn is selected by the address ADD and a tag TAG_v from the selected entry is included in the address ADD may be determined as being a cache hit H. For example, the case that at least one among the plurality of entries ET1 to ETn is selected by the address ADD and a tag TAG_v from the selected entry is not included in the address ADD may be determined as being a cache miss M.

As described above, the nonvolatile memory module 100 may use the volatile memory 121 as a cache memory so that the performance of the nonvolatile memory module 100 may be improved. In this case, the nonvolatile memory module 100 may determine whether a cache hit or a cache miss occurs, based on a tag TAG stored in the volatile memory 121.

Figure 10:
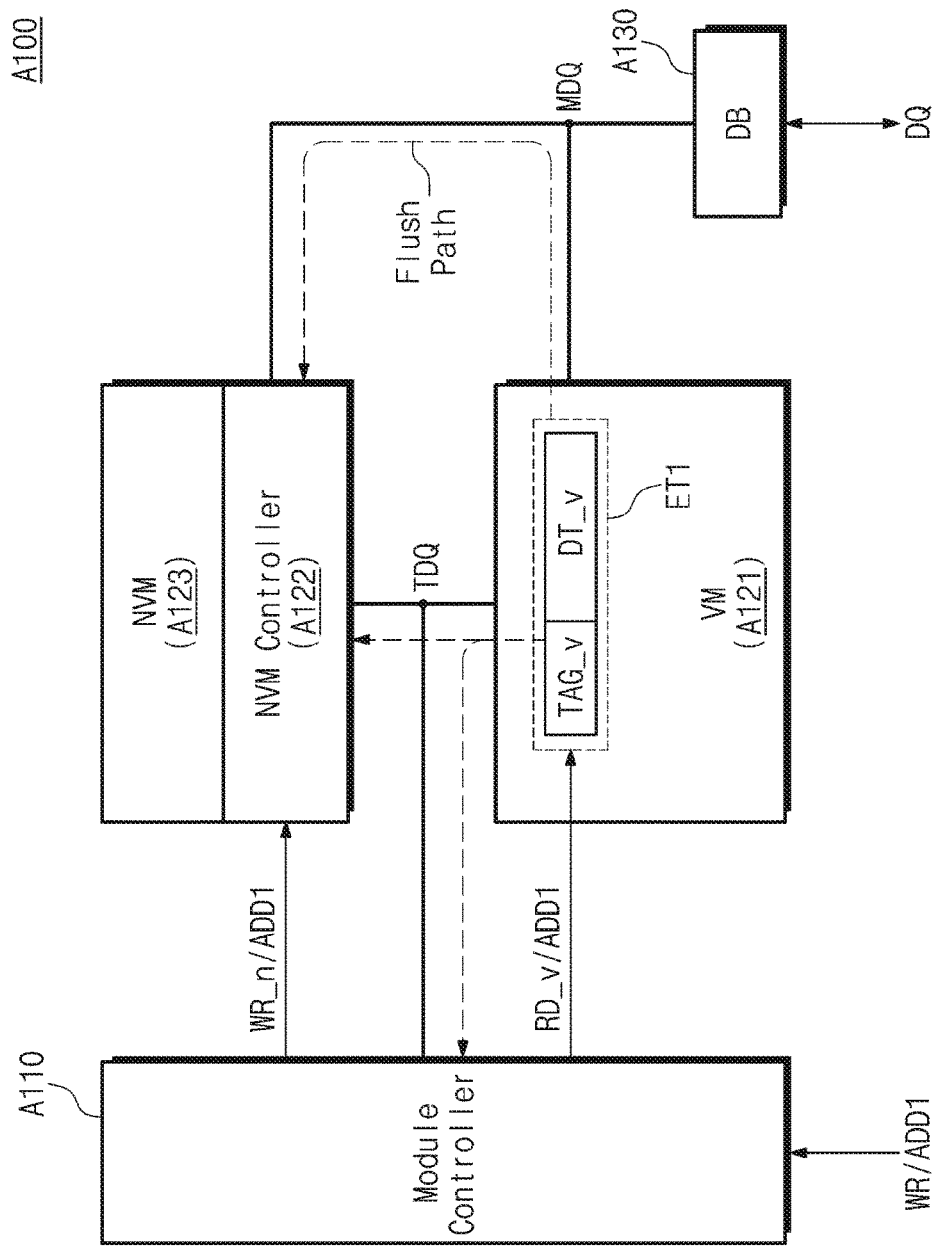
FIGS. 10 and 11 are block diagrams for describing, in detail, a write operation of FIG. 3.
Figure 11:
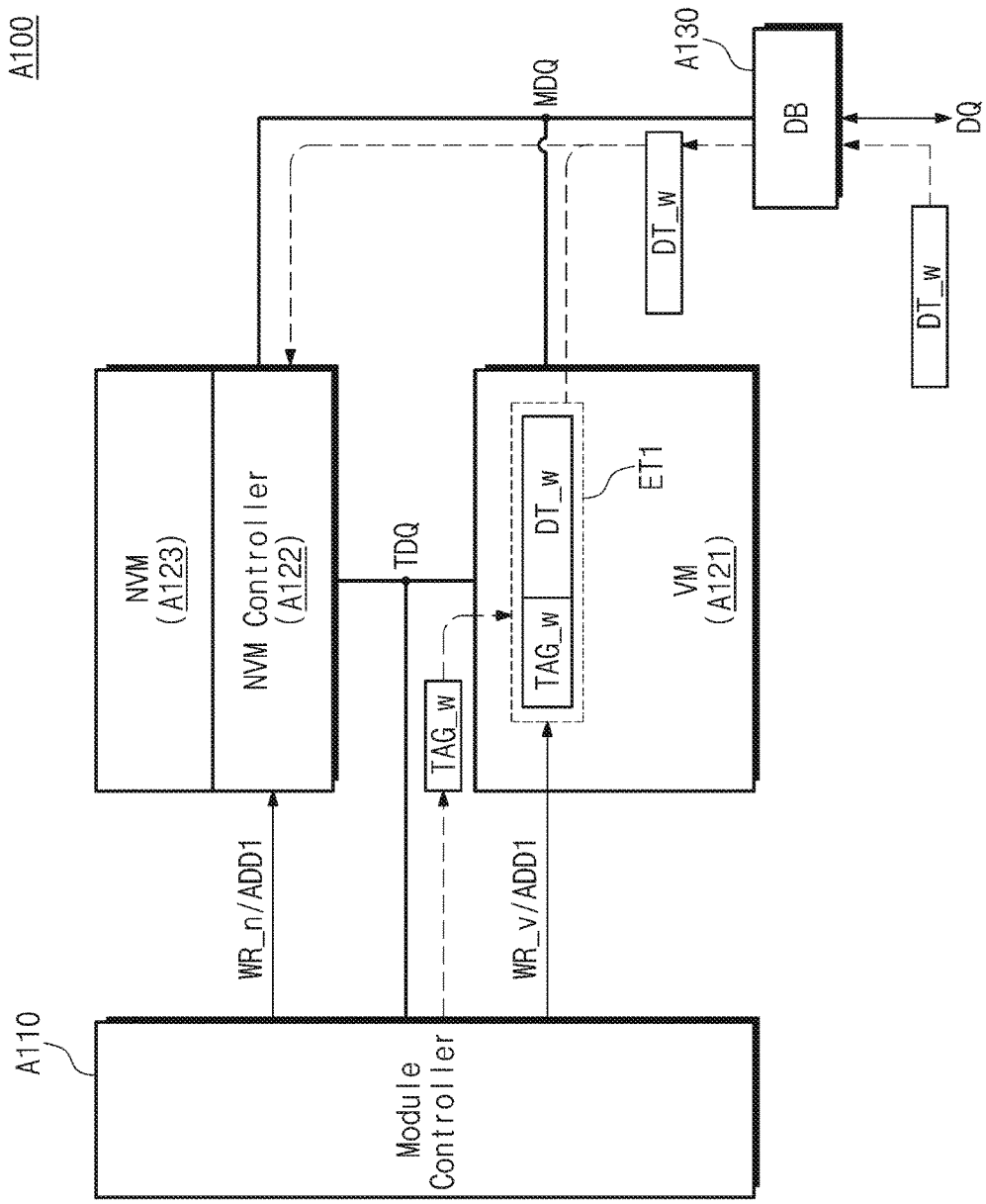

FIGS. 10 and 11 are block diagrams for describing, in detail, a write operation of FIG. 3. Referring to FIGS. 1, 10, and 11, the nonvolatile memory module A100 may include a module controller A110, a volatile memory A121, an NVM controller A122, a nonvolatile memory A123, and a data buffer A130. In example embodiments, the nonvolatile memory module A100 of FIG. 10 may be a device or module that is substantially the same as or similar to the nonvolatile memory module 100 of FIGS. 1 and 2. For descriptive convenience, a detailed description about above-described components may be omitted.

The module controller A110 may receive a module write command and first address (WR/ADD1) from the processor 101. The module controller A110 may provide an NVM write command and first address (WR_n/ADD1) to the NVM controller A122 and a VM read command and first address (RD_v/ADD1) to the volatile memory A121 in response to the module write command and first address (WR/ADD1).

In example embodiments, at least a part of the first address ADD1 is assumed as corresponding to the first entry ET1 of the volatile memory A121. That is, on the basis of the VM read command and first address (RD_v/ADD1), the volatile memory A121 may select or activate the first entry ET1 and may output data DT_v and a tag TAG_v that are stored in the first entry ET1.

The tag TAG_v stored in the first entry ET1 may be provided to the module controller A110 and the NVM controller A122 through the tag data line TDQ. The data DT_v stored in the first entry ET1 may be output through the memory data line MDQ.

In example embodiments, the NVM controller A122 may compare the first address ADD received from the module controller A110 and the tag TAG_v received through the tag data line TDQ and may determine whether a cache miss or a cache hit occurs, based on the comparison result. When the cache miss occurs, the NVM controller A122 may receive (or fetch) the data DT_v provided through the memory data line MDQ and may write the received data DT_v to the nonvolatile memory A123. That is, when the cache miss occurs during a write operation of the nonvolatile memory module A100, the NVM controller A122 may perform the flush operation.

In example embodiments, when the cache hit occurs, the nonvolatile memory module A100 may not perform the flush operation.

In example embodiments, the data DT_v of the first entry ET1 illustrated in FIG. 10 may not be provided to the processor 101. For example, the data DT_v may be output through the memory data line MDQ, but it may not be provided to the processor 101 through the data buffer A130. Alternatively, in the case in which the data buffer A130 is absent in the nonvolatile memory module A100, even though the data DT_v is provided through the data line DQ, the processor 101 may ignore the data DT_v provided through the data line DQ. The reason is that the processor 101 recognizes a write operation about the nonvolatile memory module A100.

As illustrated in FIG. 11, the module controller A110 may provide the VM write command and first address (WR_v/ADD1) to the volatile memory A121. As described above, at least a part of the first address ADD1 may correspond to the first entry ET1. That is, the volatile memory A121 may select or activate the first entry ET1 in response to the VM write command and first address (WR_v/ADD1).

The write data DT_w may be provided through the data line DQ, the data buffer A130, and the memory data line MDQ. In example embodiments, the write data DT_w may be provided to the processor 101 after a write latency WL elapses from a point in time when a module write command/address CA_WR is received.

The module controller A110 may provide a write tag TAG_w to the volatile memory A121 through the tag data line TDQ. The write tag TAG_w may include at least a part of the first address ADD1.

That is, on the basis of the VM write command and first address (WR_v/ADD1), the volatile memory A121 may select the first entry ET1 and may write the write data DT_w and a write tag TAG_w in the first entry ET1.

In example embodiments, the NVM controller A122 may receive the write data DT_w through the memory data line MDQ and may program the received data DT_w in the nonvolatile memory A123.

As described above, during a write operation, the nonvolatile memory module A100 may read the tag TAG_v stored in the volatile memory A121, may determine whether a cache hit or a cache miss occurs, based on the read tag TAG_v, and may perform the flush operation based on the determination result.

Figure 12:
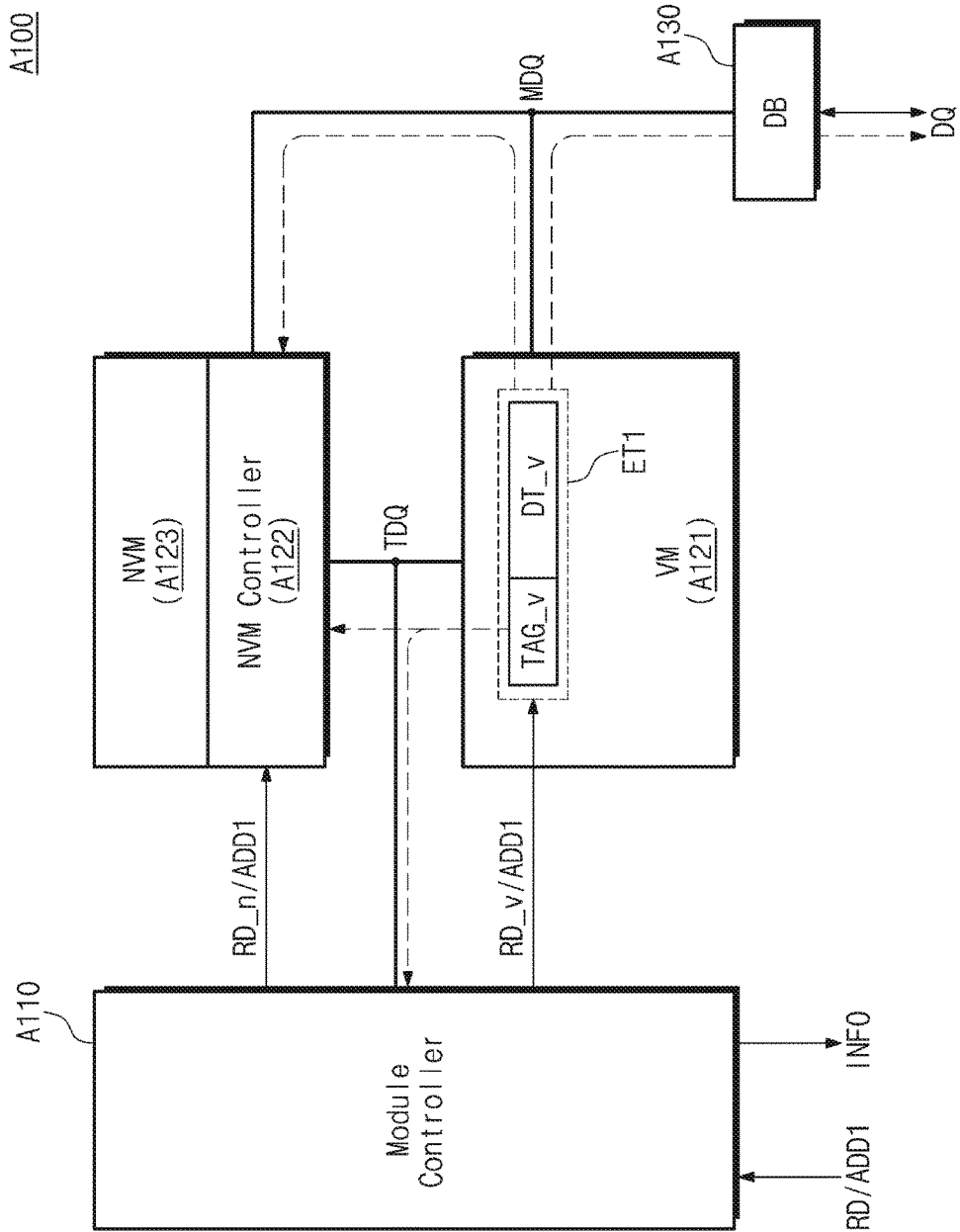
FIGS. 12 and 13 are block diagrams for describing, in detail, a read operation of FIGS. 5 and 7.
Figure 13:
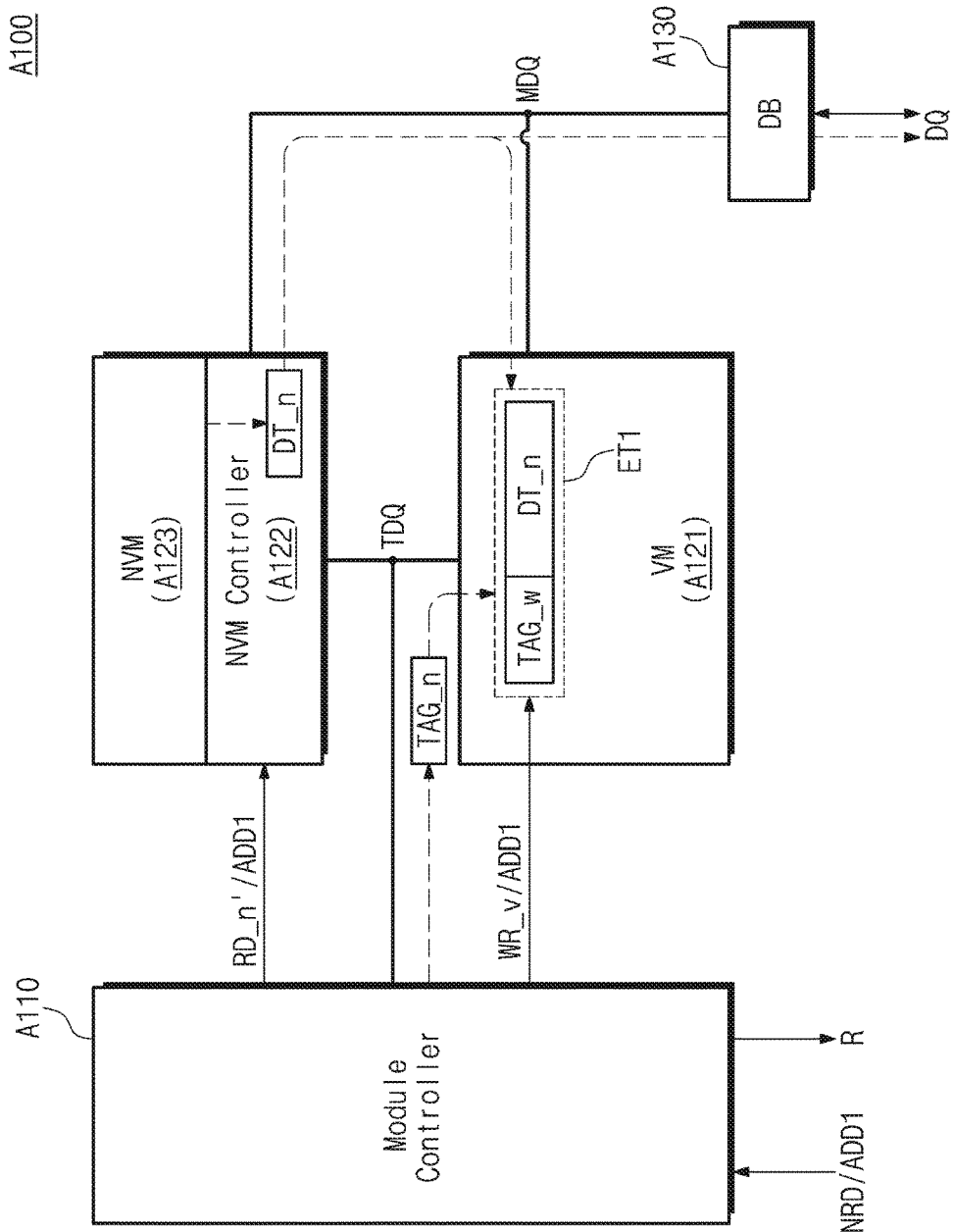

FIGS. 12 and 13 are block diagrams for describing, in detail, a read operation of FIGS. 5 and 7. Referring to FIGS. 1, 12, and 13, the nonvolatile memory module A100 may include the module controller A110, the volatile memory A121, the NVM controller A122, the nonvolatile memory A123, and the data buffer A130. For descriptive convenience, a detailed description about above-described components may be omitted.

As illustrated in FIG. 12, the module controller A110 may receive a module read command and first address (RD/ADD1) from the processor 101 and may provide a VM read command and first address (RD_v/ADD1) to the volatile memory A121 and an NVM read command and first address (RD_n/ADD1) to the NVM controller A121 in response to the received signal.

As described above, at least a part of the first address ADD1 (i.e., the remaining address bits other than bits, which are associated with a tag TAG, among bits of the first address ADD1) may correspond to the first entry ET1 of the volatile memory A121.

That is, on the basis of the VM read command and first address (RD_v/ADD1), the volatile memory A121 may select the first entry ET1 and may output data DT_v and a tag TAG_v that are stored in the first entry ET1. For example, the volatile memory A121 may send the tag TAG_v to the NVM controller A121 and the module controller A110 through the tag data line TDQ and may output the data DT_v through the memory data line MDQ.

The module controller A110 may compare the first address ADD received from the processor 101 and the tag TAG_v received through the tag data line TDQ and may determine whether a cache miss or a cache hit occurs, based on the comparison result. For example, the case that at least a part of the first address ADD1 is the same as the tag TAG_v may be determined by the module controller A110 as being a cache hit, and the module controller A110 may output the cache information INFO about the cache hit. For example, the case that at least a part of the first address ADD1 is not the same as the tag TAG_v may be determined by the module controller A110 as being a cache miss, and the module controller A110 may output the cache information INFO about the cache miss.

In example embodiments, as described with reference to FIGS. 6 and 8, the cache information INFO may be provided to the processor 101 together with the data DT_v. The processor 101 may determine whether the received data DT_v is valid data, based on the cache information INFO. For example, when the cache information INFO indicates a cache hit, the processor 101 may determine the received data DT_v as valid data. When the cache information INFO indicates a cache miss, the processor 101 may determine the received data DT_v as invalid data. In this case, the processor 101 may perform any other operation to obtain valid data.

Example embodiments illustrated in FIG. 13 shows an operation corresponding to the case that a cache miss occurs during a read operation of the nonvolatile memory module A100. As illustrated in FIG. 13, when a cache miss occurs, the NVM controller A122 may recognize the occurrence of the cache miss. For example, as described above, the NVM controller A122 may receive the tag TAG_v through the tag data line TDQ and may recognize the occurrence of the cache miss, based on a result of comparing the received tag TAG_v and at least a part of the first address ADD1.

In this case, the NVM controller A122 may read data DT_n corresponding to the first address ADD1 from the nonvolatile memory A123 and may prepare the read data DT_n. In example embodiments, to prepare data may mean to store data in a separate buffer or storage circuit such that the NVM controller A122 outputs the data within a time (e.g., the read latency RL) in response to a command of the module controller A110.

After the NVM controller A122 prepares the data DT_n, the module controller A110 may provide the ready signal R to the processor 101. In example embodiments, the ready signal R may be provided to the processor 101 through the same line as the cache information INFO. Alternatively, the ready signal R may be provided to the processor 101 through a separate signal line.

The processor 101 may provide the module read command and first address (NRD/ADD1) for reading cache-missed data to the module controller A110 in response to the ready signal R. In this case, the module read command NRD of FIG. 13 may be different from the module read command RD of FIG. 12. For example, the module read command NRD of FIG. 13 may be a command and address that is used to read data DT_n stored in the nonvolatile memory A123 of the nonvolatile memory module A110.

The module controller A110 may provide an NVM read command and first address (RD_n'/ADD1) to the NVM controller A122 and a VM write command and first address (WR_v/ADD1) to the volatile memory A121 in response to the module read command and first address (NRD/ADD1). The NVM controller A122 may output the prepared data DT_n through the memory data line MDQ in response to the NVM read command and first address (RD_n'/ADD1).

The data DT_n output through the memory data line MDQ may be provided to the data buffer A130, and the data buffer A130 may output the data DT_n through the data line DQ under control of the module controller A110. In example embodiments, the data DT_n may be output to the data signals DQ after a time (e.g., the read latency RL) elapses from a point in time when the module read command and first address (NRD/ADD1) is provided to the nonvolatile memory module A100.

In example embodiments, the volatile memory A121 may write the write tag TAG_w and the data DT_n in the first entry ET1 in response to the VM write command and first address (WR_v/ADD1). For example, the module controller A110 may output the write tag TAG_w through the tag data line TDQ. The write tag TAG_w may include at least a part of the first address ADD1. The write tag TAG_w may be a tag that corresponds to the data DT_n from the nonvolatile memory A123. The volatile memory A121 may select the first entry ET1 in response to the VM write command and first address (WR_v/ADD1). The volatile memory A121 may write the write tag TAG_w received through the tag data line TDQ and the data DT_n received through the memory data line MDQ in the first entry ET1. That is, the volatile memory A121 may perform the read caching operation.

Figure 14:
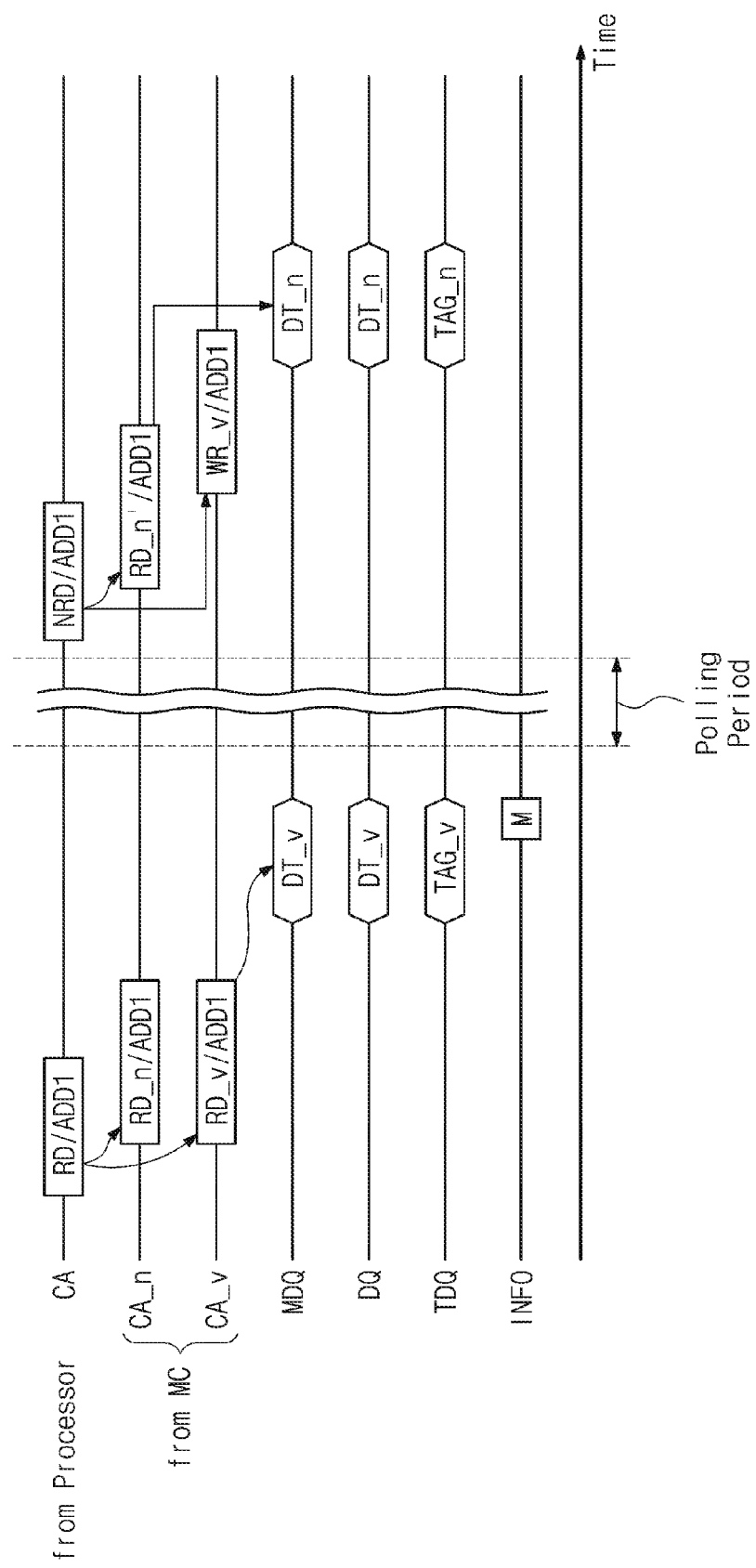
FIG. 14 is a flowchart illustrating a read operation of the nonvolatile memory module of FIG. 2, according to example embodiments of the inventive concept.

FIG. 14 is a flowchart illustrating a read operation of the nonvolatile memory module of FIG. 2, according to example embodiments of the inventive concept. For descriptive convenience, a detailed description about above-described components may be omitted. Referring to FIGS. 2 and 14, the nonvolatile memory module A100 may receive a module read command and first address (RD/ADD1) and may send a VM read command and first address (RD_v/ADD1) to the volatile memory A121 and an NVM read command and first address (RD_n/ADD1) to the NVM controller A121 respectively in response to the received signal (RD/ADD1).

The volatile memory A121 may output data DT_v and a tag TAG_v in response to the VM read command and first address (RD_v/ADD1). In this case, the tag TAG_v may be different from at least a part of the first address ADD1. This may mean that a cache miss M occurs. The module controller A110 may send the cache information INFO about the cache miss M to the processor 101.

In example embodiments, unlike a read operation of FIG. 8, in example embodiments of FIG. 14, the module controller A110 may not provide the ready signal R separately. In this case, the processor 101 may periodically poll status information of the nonvolatile memory module A110 to recognize a data-ready state. In example embodiments, an operation of polling status information of the nonvolatile memory module A100 may be accomplished by accessing a separate status register included in the nonvolatile memory module A110 at the processor 101 or accessing an area of the nonvolatile memory module A100 at the processor 101.

When recognizing, through a periodic polling operation or a status read operation, that data is prepared in the nonvolatile memory module A100, the processor 101 may provide the module read command and first address (NRD/ADD1) to the nonvolatile memory module A100. An operation that the nonvolatile memory module A100 performs in response to the module read command and first address (NRD/ADD1) is described with reference to FIG. 13, and a detailed description thereof is thus omitted.

As described above, even though the nonvolatile memory module A100 does not provide the ready signal R upon the occurrence of the cache miss, a read operation may be performed normally through the polling operation of the processor 101.

Figure 15:
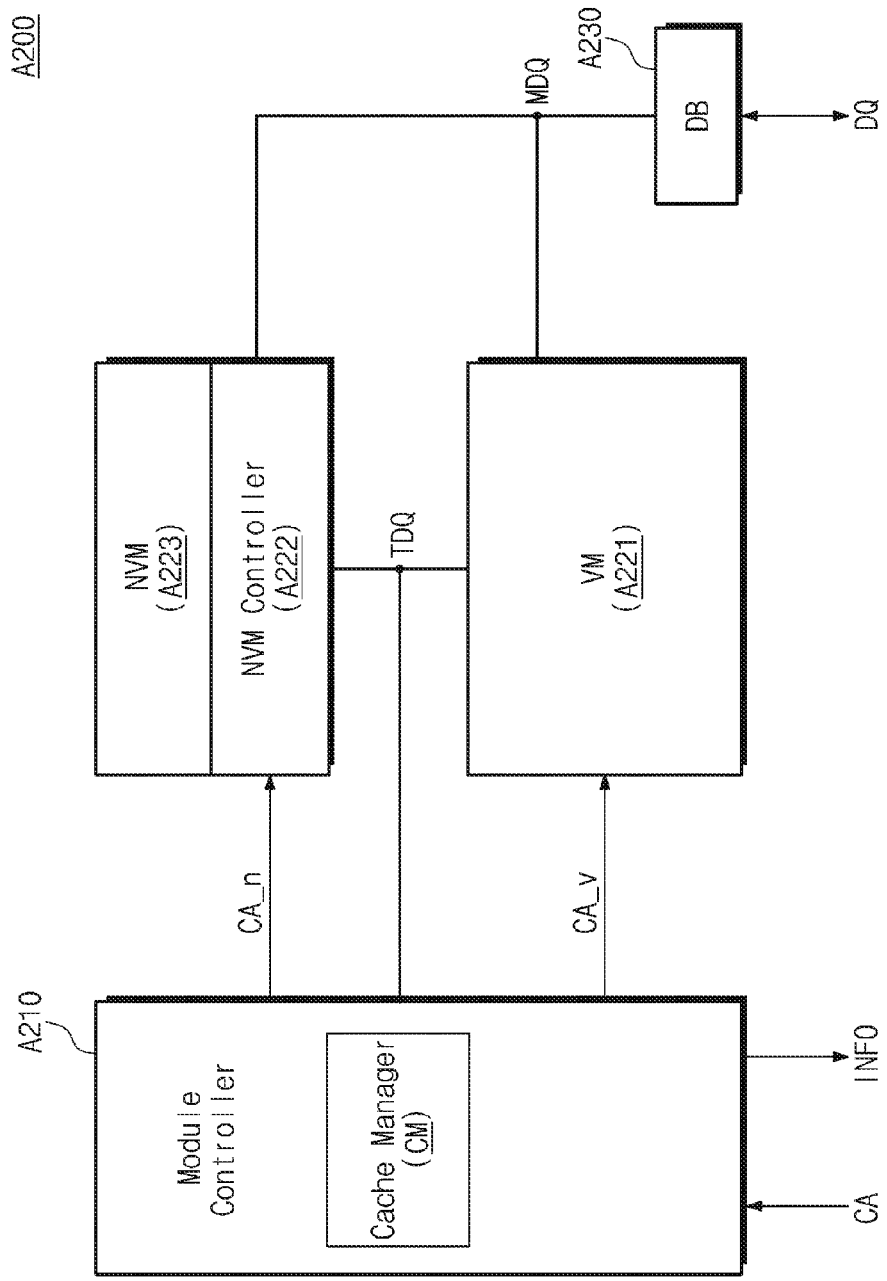
FIG. 15 is a block diagram illustrating the nonvolatile memory module of FIG. 2, according to example embodiments of the inventive concept.

FIG. 15 is a block diagram illustrating the nonvolatile memory module of FIG. 2, according to example embodiments of the inventive concept. Referring to FIG. 15, the nonvolatile memory module A200 may include a module controller A210, a volatile memory A221, an NVM controller A222, a nonvolatile memory A223, and a data buffer A230. For descriptive convenience, a detailed description about above-described components may be omitted.

Unlike the module controller A110 of the nonvolatile memory module A100 of FIG. 10, the module controller A210 of the nonvolatile memory module A200 of FIG. 15 may further include a cache manager CM.

The cache manager CM may manage the volatile memory A221 as a cache memory of the nonvolatile memory A223 effectively. For example, when a cache miss occurs during a read operation of the nonvolatile memory module A100, the cache manager CM may manage cache-missed address information. Afterwards, when a read operation about the cache-missed address is performed, the cache manager CM may control an NVM command/address CA_n and a VM command/address CA_v such that data corresponding to the cache-missed address is output from the nonvolatile memory A223.

That is, as described with reference to FIG. 13, even though the processor 101 does not provide a separate module read command/address $CA_{13}$ NRD for reading data from the nonvolatile memory A223, during the read operation about the cache-missed address, the cache manager CM may control the NVM command/address CA_n and the VM command/address CA_v such that data is output from the nonvolatile memory A223.

Figure 16:
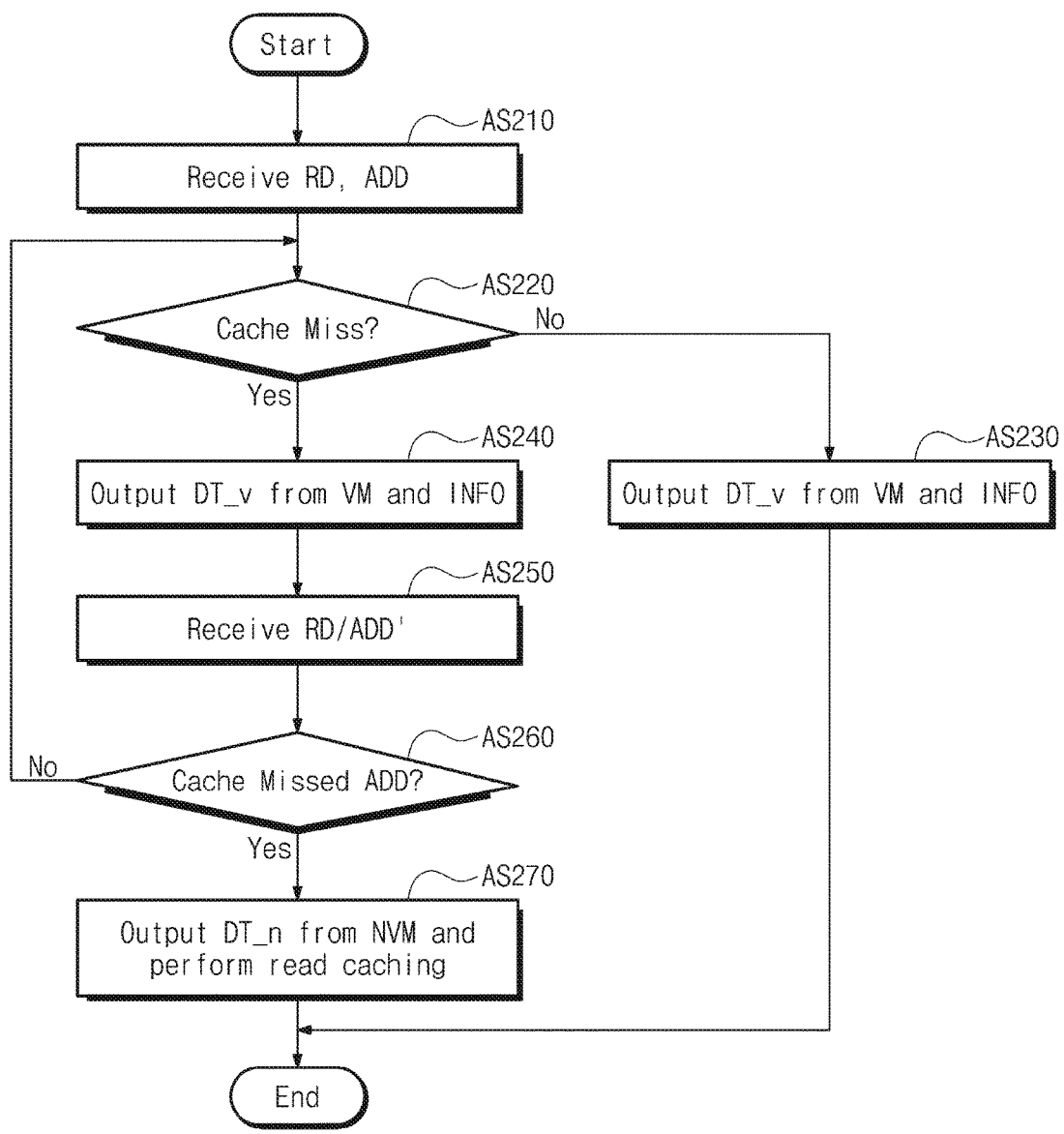
FIG. 16 is a flowchart illustrating a read operation of the nonvolatile memory module of FIG. 15.

FIG. 16 is a flowchart illustrating a read operation of the nonvolatile memory module of FIG. 15. For descriptive convenience, a detailed description about above-described components may be omitted.

Referring to FIGS. 1, 15, and 16, in step AS210, the nonvolatile memory module A200 may receive a module read command and address (RD/ADD) from the processor 101.

In step AS220, the nonvolatile memory module A200 may determine whether a cache hit or a cache miss occurs. For example, as described above, the nonvolatile memory module A200 may determine whether a cache hit or a cache miss occurs, based on a tag stored in an entry, which corresponds to the address ADD received from the processor 101, among a plurality of entries of the volatile memory A221.

If no cache miss occurs (i.e., if the cache hit occurs), in step AS230, the nonvolatile memory module A200 may output data DT_v of the volatile memory A221 and cache information INFO. For example, the nonvolatile memory module A200 may provide the processor 101 with data DT_v stored in an entry corresponding to the address ADD received from the processor 101 and the cache information INFO. In this case, the cache information INFO may include information about a cache miss M.

If the cache miss occurs, in step AS240, the nonvolatile memory module A200 may output data DT_v of the volatile memory A221 and cache information INFO. In example embodiments, the cache information INFO of step AS240 may include information about a cache miss M.

In step AS250, the nonvolatile memory module A200 may receive a module read command and address (RD/ADD') from the processor 101.

In step AS260, the nonvolatile memory module A200 may determine whether the address ADD' received in step AS250 is a previously cache-missed address. For example, if the determination result of step AS220 indicates that the cache miss occurs, the cache manager CM may manage information about the cache-missed address information. The cache manager CM may compare the received address and the cache-missed address to determine whether the received address is the cache-missed address.

If the received address is not the cache-missed address, the nonvolatile memory module A200 may perform an operation of step AS220.

If the received address is the cache-missed address, in step AS270, the nonvolatile memory module A200 may output data DT_n of the nonvolatile memory A223. Furthermore, the nonvolatile memory module A200 may perform the read caching operation. For example, when a cache-missed address is received, data corresponding to the received address ADD' may be absent in the volatile memory A221. That is, the nonvolatile memory module A200 may control an NVM command/address such that data DT_n corresponding to the received address ADD' is output from the nonvolatile memory A223.

Figure 17:
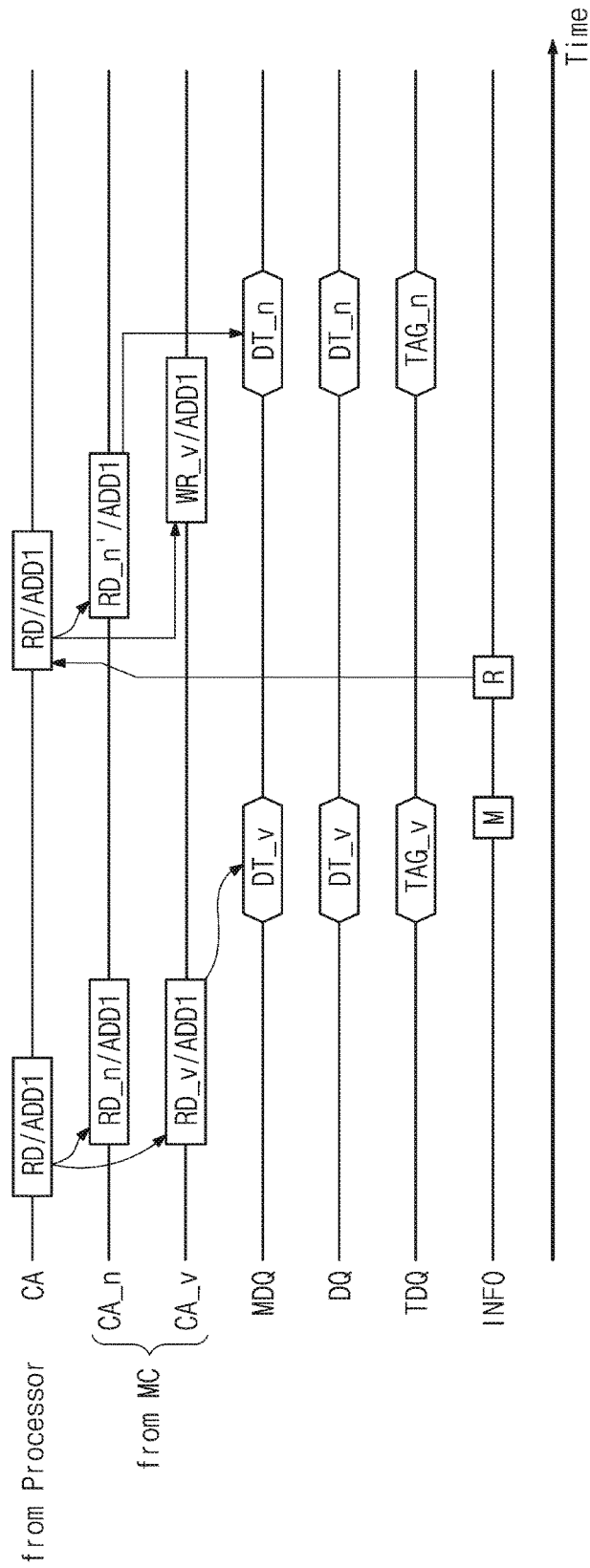
FIG. 17 is a timing diagram for describing a read operation of FIG. 16.

FIG. 17 is a timing diagram for describing a read operation of FIG. 16. For descriptive convenience, a detailed description about above-described components may be omitted. Referring to FIGS. 15 to 17, after a cache miss M occurs, the nonvolatile memory module A200 may send the ready signal R to the processor 101. In example embodiments, the ready signal R may be a signal indicating that data corresponding to a cache-missed address is prepared.

Afterwards, the processor 101 may provide the nonvolatile memory module A200 with a module read command and first address (RD/ADD1) in response to the ready signal R. In this case, the module read command and first address (RD/ADD1) may be the same as a previous module read command and first address (RD/ADD1).

As described above, the first address ADD1 may be a cache-missed address. The cache manager CM may manage information about the cache-missed address. The cache manager CM may recognize that the first address ADD1 received is the cache-missed address and may control the NVM command/address CA_n and the VM command/address CA_v in response to the module read command and first address (RD/ADD1) such that data DT_n is output from the nonvolatile memory A223.

As described above, because the cache manager CM manages the cache-missed address, even though a separate command for reading data from the nonvolatile memory A223 is not provided, the nonvolatile memory module A200 may perform a normal read operation.

Figure 18:
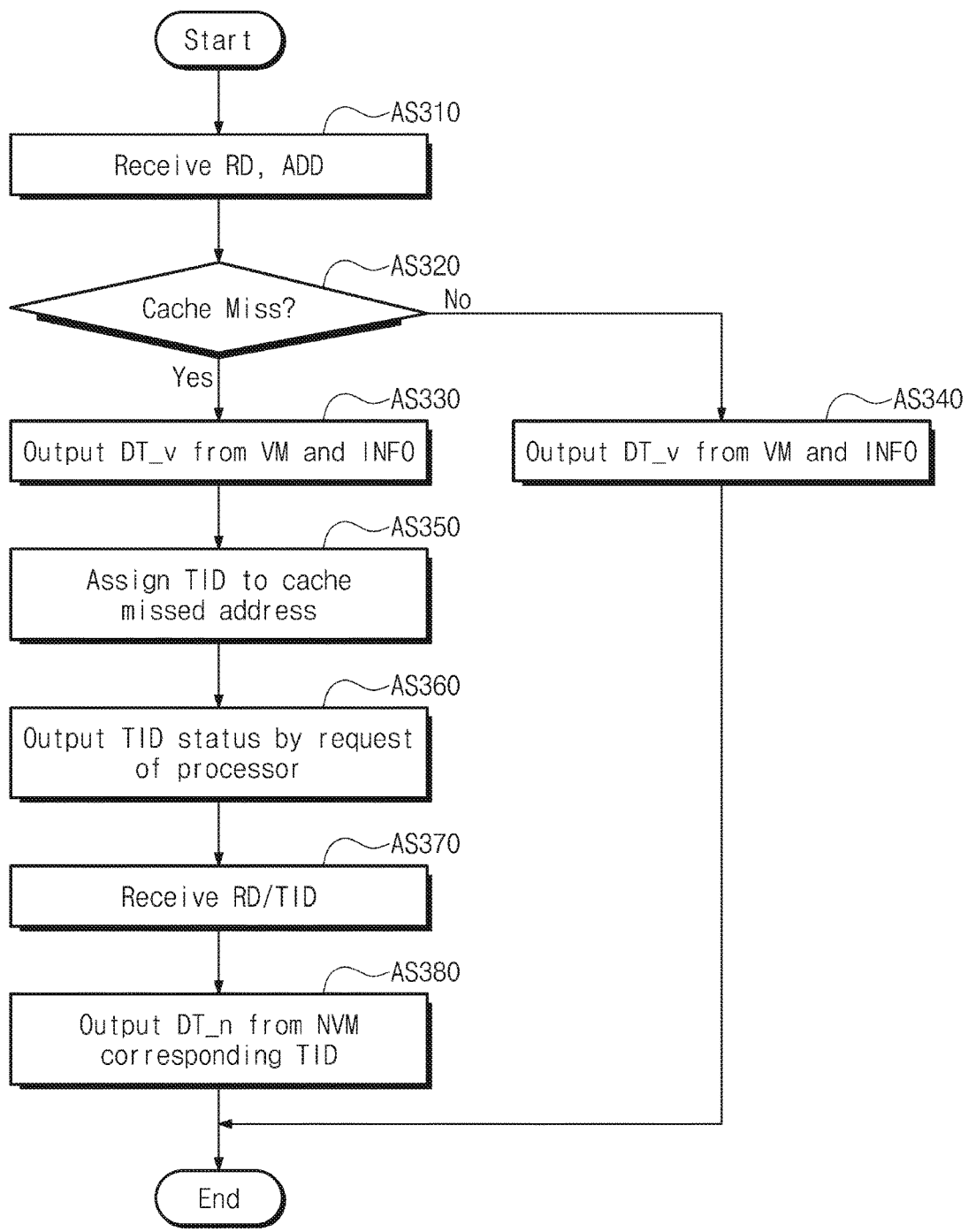
FIG. 18 is a flowchart illustrating a read operation of the nonvolatile memory module of FIG. 15, according to example embodiments of the inventive concept.

FIG. 18 is a flowchart illustrating a read operation of the nonvolatile memory module of FIG. 15, according to example embodiments of the inventive concept. Referring to FIGS. 1, 15, and 18, the nonvolatile memory module A200 may perform operations of steps AS310 to AS340. Operations of steps AS310 to AS340 may be similar to those of steps AS210 to AS240 of FIG. 16, and a detailed description thereof is thus omitted.

In step AS350, the nonvolatile memory module A200 may assign transaction identification TID to a cache-missed address. For example, the cache manager CM may assign the transaction identification TID to the cache-missed address. In example embodiments, the transaction identification TID may monotonically increase whenever a cache-missed address occurs.

In step AS360, the nonvolatile memory module A200 may output status information of the transaction identification TID in response to a request of the processor 101. For example, when a cache miss occurs during a read operation about the first address ADD1 data DT_n may be prepared such that data corresponding to the first address ADD1 is output from the nonvolatile memory A223. When the data DT_n is prepared, the cache manager CM may output status information of the transaction identification TID corresponding to the first address ADD1 as a state of "ready". The processor 101 may receive the status information of the transaction identification TID and may recognize that data corresponding to the transaction identification TID is prepared.

In example embodiments, the status information about a plurality of transaction identification TID may be implemented in the form of bitmap, and the nonvolatile memory module A200 may send the status information about the plurality of transaction identification TID at the same time in response to a request of the processor 101.

In step AS370, the nonvolatile memory module A200 may receive a module a module read command and transaction identification (RD, TID) from the processor 101. For example, the processor 101 may receive the status information of the transaction identification TID and may recognize the prepared transaction identification TID based on the received status information. To read data corresponding to the prepared transaction identification TID, the processor 101 may send the module read command and transaction identification (RD, TID) to the nonvolatile memory module A200.

In AS380, the nonvolatile memory module A200 may output data corresponding to the transaction identification TID from the nonvolatile memory in response to the module read command and transaction identification (RD, TID). For example, the nonvolatile memory module A200 may control the NVM command/address CA_n and the VM command/address CA_v such that data corresponding to the received transaction identification TID is output from the nonvolatile memory A223. In example embodiments, data from the nonvolatile memory A223 and the transaction identification TID corresponding thereto may be together sent to the processor 101.

Figure 19:
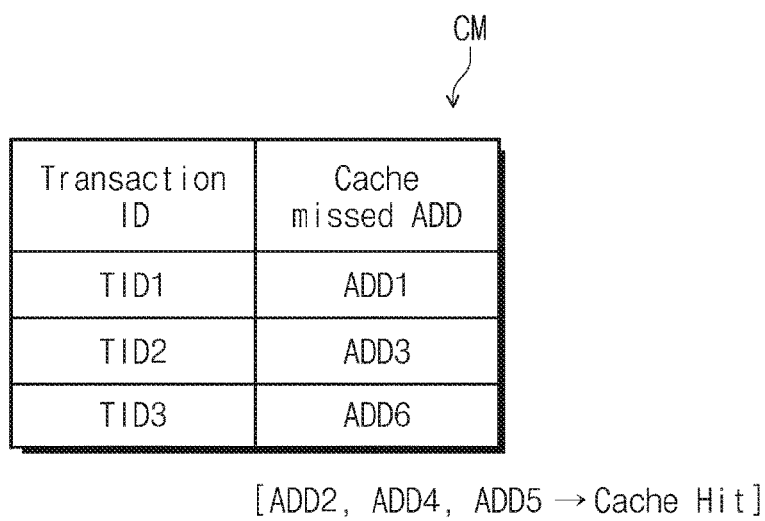
FIG. 19 is a diagram for describing a transaction identification assigning operation according to a read operation of FIG. 18.

FIG. 19 is a diagram for describing a transaction identification assigning operation according to a read operation of FIG. 18. Referring to FIGS. 1, 15, and 19, the cache manager CM of the nonvolatile memory module A200 may manage transaction identifications TID about cache-missed addresses.

For example, the nonvolatile memory module A200 may sequentially perform read operations about first to sixth addresses ADD1 to ADD6 in response to a request of the processor 101. A cache miss may occur during a read operation about the first address ADD1 In this case, the cache manager CM may assign a first transaction identification TID1 to the first address ADD1 cache-missed. Afterwards, a cache hit may occur during a read operation about the second address ADD2. In this case, the cache manager CM may not perform a separate operation. Afterwards, a cache miss may occur during a read operation about the third address ADD3. In this case, the cache manager CM may assign a second transaction identification TID2 to the third address ADD3 cache-missed. A cache hit may occur when each of read operations about the fourth and fifth addresses ADD4 and ADD5 is performed; when a cache miss occurs during a read operation about the sixth address ADD6, the cache manager CM may assign a third transaction identification TID3 to the sixth address ADD6. Each of the first to third transaction identifications TID1, TID2, and TID3 may be implemented to be increased monotonically.

That is, the cache manager CM may manage cache-missed addresses, and whenever a cache miss occurs, the cache manager CM may assign a transact identification TID to the cache-missed address. In this case, the transaction identification may increase monotonically.

Figure 20:
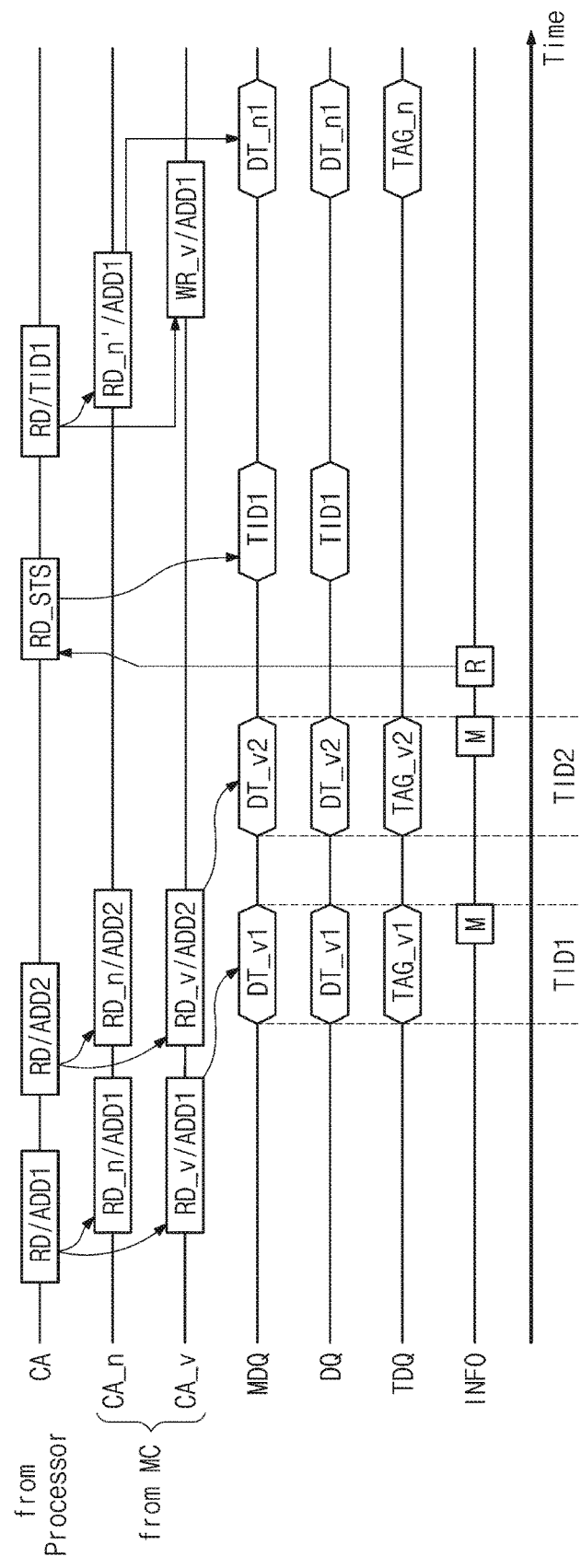
FIG. 20 is a timing diagram for describing, in detail, the read operation of FIG. 18.

FIG. 20 is a timing diagram for describing, in detail, the read operation of FIG. 18. For descriptive convenience, a detailed description about above-described components may be omitted. Referring to FIGS. 1, 15, 18, and 20, the nonvolatile memory module A200 may receive a module read command and first address (RD/ADD1) and a module read command and second address (RD/ADD2) from the processor 101.

The module controller A210 of the nonvolatile memory module A200 may provide an NVM read command and first address (RD_n/ADD1) to the NVM controller A222 and a VM read command and first address (RD_v/ADD1) to the volatile memory A221 in response to the module read command and first address (RD/ADD1). The volatile memory A221 may output first data DT_v1 and a first tag TAG_v1 in response to the VM read command and first address (RD_v/ADD1). Likewise, the module controller A210 of the nonvolatile memory module A200 may provide an NVM read command and second address (RD_n/ADD2) to the NVM controller A222 and a VM read command and second address (RD_v/ADD2) to the volatile memory A221 in response to the module read command and second address (RD/ADD2). The volatile memory A221 may output second data DT_v2 and a second tag TAG_v2 in response to the VM read command and second address (RD_v/ADD2).

The first and second data DT_v1 and DT_v2 from the volatile memory A221 may not be data corresponding to the first and second addresses ADD1 and ADD2. That is, a cache miss may occur during read operations about the first and second addresses ADD1 and ADD2. In this case, the cache manager CM may assign a first transaction identification TID1 and a second transaction identification TID2 to the first address ADD1 and the second address ADD2, respectively.

As described above, the NVM controller A222 may receive the first and second tags Tag TAG_v1 and TAG_v2 and may recognize that a cache miss occurs, based on the first and second tags Tag TAG_v1 and TAG_v2. In this case, the NVM controller A222 may prepare data corresponding to the first and second addresses ADD1 and ADD2 from the nonvolatile memory A223.

In example embodiments, when the NVM controller A22 prepares data DT_n1 corresponding to the first address ADD1 firstly, the nonvolatile memory module A200 may provide the ready signal R to the processor 101. The processor 101 may provide the nonvolatile memory module A200 with a status read command RD_STS in response to the ready signal R.

The nonvolatile memory module A200 may send status information about a transaction identification TID to the processor 101 through a memory data line MDQ and a data signal DQ in response to the status read command RD_STS. In example embodiments, the status read command RD_STS may be a command that is previously defined to read an area, a status register, or a multi-purpose register of the nonvolatile memory module A200. In example embodiments, the status information about the transaction identification TID may be stored in the area, status register, or multi-purpose register of the nonvolatile memory module A200. In example embodiments, the status information about the transaction identification TID may be implemented in the form of bitmap.

In example embodiments, the nonvolatile memory module A200 may send information about complete preparation of the first transaction identification TID1 as status information about a transaction identification TID. The processor 101 may provide the nonvolatile memory module A200 with a module read command and first transaction identification TID1 in response to the received status information.

Responsive to the module read command and first transaction identification (RD/TID1), the nonvolatile memory module A200 may provide the NVM command/address CA_n and the VM command/address CA_v such that data DT_n corresponding to the first transaction identification TID1 is output from the nonvolatile memory A223. In example embodiments, as described with reference to FIG. 13, a read caching operation may be performed together with the above-described operation.

In example embodiments, the NVM controller A222 may include information about a cache-missed address and a transaction identification, and the NVM command/address CA_n may include an NVM read command and first transaction identification. That is, the NVM controller A222 may output data DT_n (i.e., data corresponding to the first address ADD1) corresponding to the first transaction identification TID1 based on the information about a cache-missed address and a transaction identification.

Figure 21:
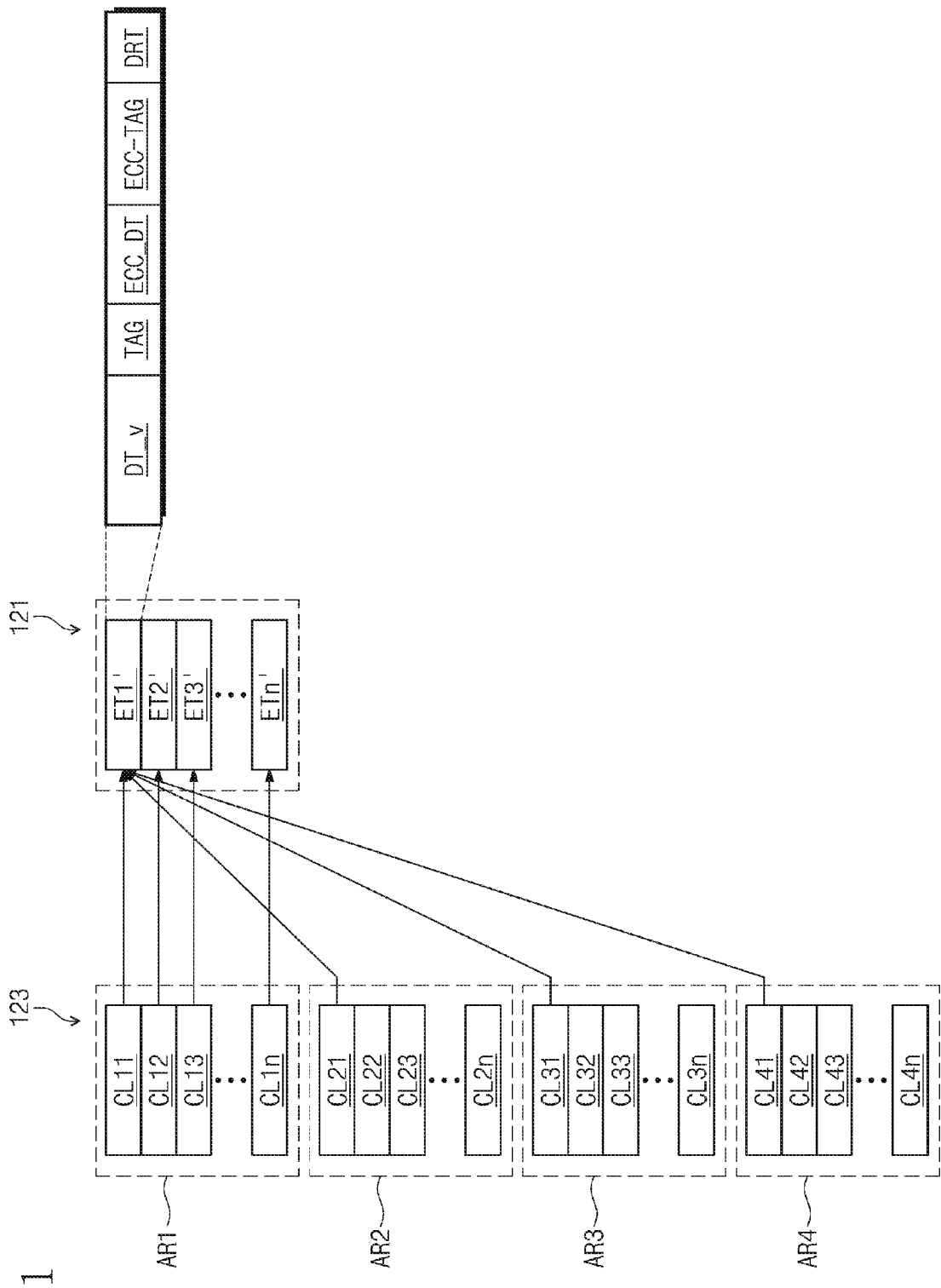
FIG. 21 is a drawing illustrating, in detail, a tag according to example embodiments of the inventive concept.

FIG. 21 is a drawing illustrating, in detail, a tag according to example embodiments of the inventive concept. For descriptive convenience, a detailed description about elements described with reference to FIG. 9 is omitted.

Referring to FIGS. 2 and 21, the volatile memory 121 may include a plurality of entries ET1' to ETn'. The nonvolatile memory 123 may include the first to fourth areas AR1 to AR4. The first area AR1 may include a plurality of cache lines CL11 to CL1n, the second area AR2 may include a plurality of cache lines CL21 to CL2n, the third area AR3 may include a plurality of cache lines CL31 to CL3n, and the fourth area AR4 may include a plurality of cache lines CL41 to CL4n.

In example embodiments, unlike the plurality of entries ET1 to ETn described with reference to FIG. 9, each of the plurality of entries ET1' to ETn' may include data DT_v, a tag TAG, a data error correction code ECC_DT, a tag error correction code ECC_TAG, and dirty information DRT.

The tag TAG may be at least a part of an address corresponding to data DT_v stored in the same entry. The data error correction code ECC_DT may be an error correction code about the data DT_v stored in the same entry. The tag error correction code ECC_TAG may be an error correction code about the tag TAG stored in the same entry. The dirty information DRT may indicate dirty information about the data DT_v stored in the same entry.

In example embodiments, the tag TAG, the data error correction code ECC_DT, the tag error correction code ECC_TAG, and the dirty information DRT may be stored in tag-dedicated volatile memories, respectively. During a read operation or during a read operation of unit data, the tag TAG, the data error correction code ECC_DT, the tag error correction code ECC_TAG, and the dirty information DRT may be provided to a module controller, an NVM controller, or a tag control circuit through the tag data line TDQ.

In example embodiments, during a read operation or a write operation, the nonvolatile memory module 100 may selectively perform a flush operation or a read caching operation based on the tag TAG and the dirty information DRT. In example embodiments, the flush operation may refer to an operation of programming data of the volatile memory 121 in the nonvolatile memory 123, and the read caching operation may refer to an operation of writing data of the nonvolatile memory 123 in the volatile memory 121.

In example embodiments, during a write operation of the nonvolatile memory module 100, the nonvolatile memory module 100 may determine whether a cache hit or a cache miss occurs, based on the tag TAG. When the cache hit occurs, the nonvolatile memory module 100 may not skip the flush operation. When the cache miss occurs, the nonvolatile memory module 100 may selectively perform the flush operation based on the dirty information DRT. For example, when the cache miss occurs and when data of the volatile memory 121 is at a dirty state, the nonvolatile memory module 100 may perform the flush operation to secure integrity of data of the volatile memory 121. When the cache miss occurs and when data of the volatile memory 121 is not at a dirty state, the nonvolatile memory module 100 may skip the flush operation.

In example embodiments, during a read operation of the nonvolatile memory module 100, whether a cache hit or a cache miss occurs may be determined, based on the tag TAG of the nonvolatile memory module 100. When the cache hit occurs, the nonvolatile memory module 100 may not skip the flush operation and the read caching operation. When the cache miss occurs, the nonvolatile memory module 100 may selectively perform the flush operation or the read caching operation based on the dirty information DRT. For example, when the cache miss occurs and when data of the volatile memory 121 is at a dirty state, the nonvolatile memory module 100 may perform the flush operation before the read caching operation. When the cache miss occurs and when data of the volatile memory 121 is not at a dirty state, the nonvolatile memory module 100 may perform the read caching operation without the flush operation.

The following table shows whether to perform the flush operation and the read caching operation of the nonvolatile memory based on a cache hit, a cache miss, and a dirty state.

TABLE 1

|  | Dirty state | Clean state |
|---|---|---|
| Cache hit | Flush operation Optional<br>Read caching Optional | Flush operation Optional<br>Read caching Optional |
| Cache miss | Flush operation Mandatory<br>Read caching Optional | Flush operation Optional<br>Read caching Optional |

As understood from table 1, when the cache miss occurs and when data of the volatile memory 121 is at a dirty state, the nonvolatile memory module 100 may perform the flush operation to secure integrity of data of the volatile memory 121.

The above-described timing diagrams, block diagrams, and the like are to describe example embodiments of the inventive concept easily, and example embodiments of the inventive concept may not be limited thereto. In example embodiments, steps of write and read operations of the nonvolatile memory module according to example embodiments of the inventive may be performed according to a given timing. Information about the given timing may be stored in the SPD 140 (refer to FIG. 2) and may be provided to the processor 101 as the device information DI (refer to FIG. 2). In addition, various commands according to example embodiments may be commands that are previously defined according to property of the nonvolatile memory module. Information about the various commands may be stored in the SPD 140 and may be provided to the processor 101 as the device information DI.

Figure 22:
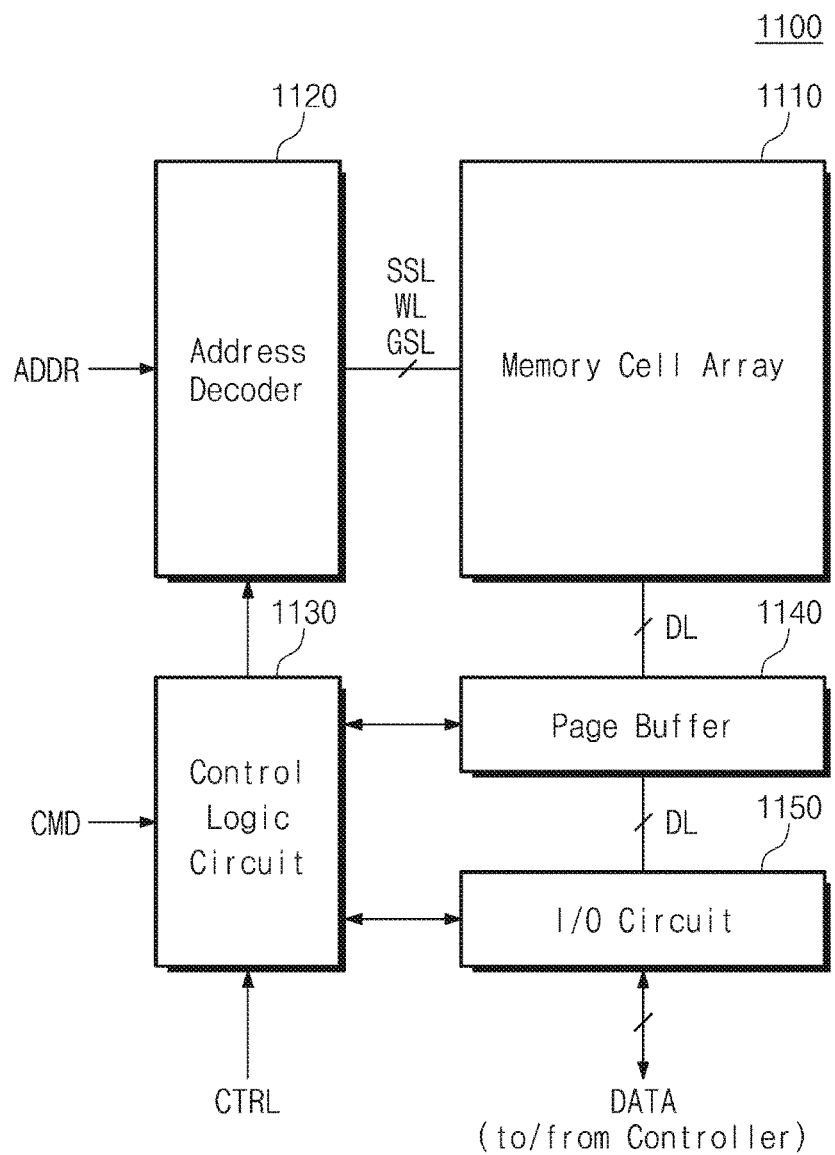
FIG. 22 is a block diagram illustrating a nonvolatile memory included in the nonvolatile memory module according to the inventive concept.

FIG. 22 is a block diagram illustrating a nonvolatile memory included in the nonvolatile memory module according to the inventive concept. Referring to FIG. 22, a nonvolatile memory 1100 may include a memory cell array 1110, an address decoder 1120, a control logic circuit 1130, a page buffer 1140, and an input/output (I/O) circuit 1150.

The memory cell array 1110 may include a plurality of memory blocks, each of which has a plurality of cells. The plurality of memory cells may be connected with a plurality of word lines WL. Each memory cell may be a single level cell (SLC) storing one bit or a multi-level cell (MLC) storing at least two bits.

The address decoder 1120 may receive and decode an address ADDR from the NVM controller 112 (refer to FIG. 2). In example embodiments, the address ADDR received from the NVM controller 112 may be a physical address indicating a physical location of a storage area of the nonvolatile memory 1100. The address decoder 1120 may select at least one among the word lines WL based on the decoded address and may drive a voltage of the selected word line.

The control logic circuit 112 may control the address decoder 1120, the page buffer 1140, and the input/output circuit 1150 in response to a command CMD and a control logic CTRL received from the NVM controller 112 (refer to FIG. 2).

The page buffer 1140 may be connected with the memory cell array 1110 through a plurality of bit lines BL and may be connected with the input/output circuit 1150 through a plurality of data lines DL. The page buffer 1140 may sense voltages of the plurality of bit lines BL and may store data stored in the memory cell array 1110. Alternatively, the page buffer 1140 may control voltages of the plurality of bit lines BL based on data received through the plurality of data lines DL.

The input/output circuit 1150 may receive data from the NVM controller 112 under control of the control logic circuit 1130 and may send the received data to the page buffer 1140. Alternatively, the input/output circuit 1150 may receive data from the page buffer 1140 and may send the received data to the NVM controller 112.

In example embodiments, the NVM controller 122 may generate an address ADDR, a command CMD, and a control signal CTRL based on an NVM command/address CA_v from the module controller 110 (refer to FIG. 2).

Figure 23:
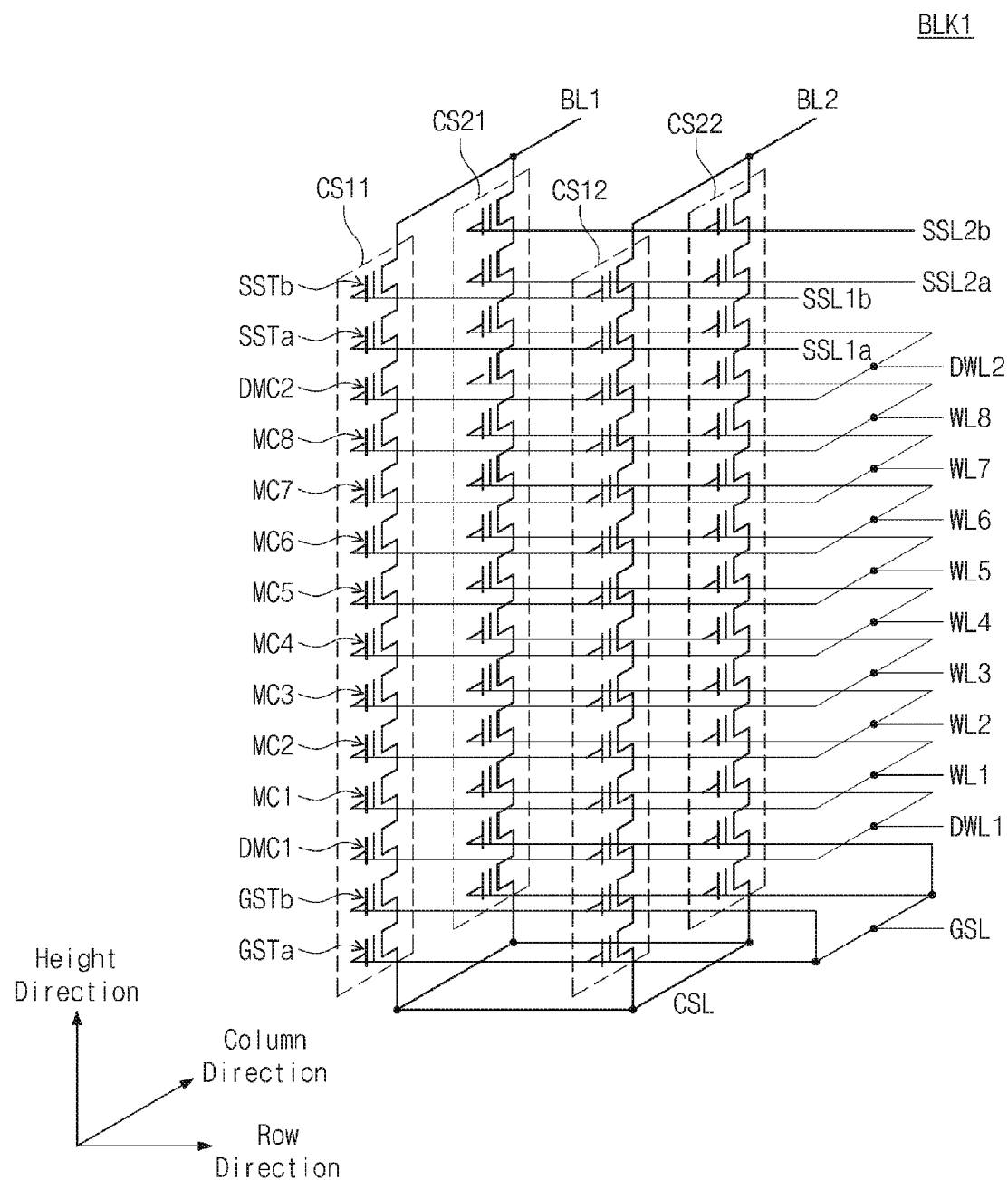
FIG. 23 is a circuit diagram illustrating a first memory block of the memory blocks included in the nonvolatile memory of the nonvolatile memory module according to example embodiments of the inventive concept.

FIG. 23 is a circuit diagram illustrating a first memory block of the memory blocks included in the nonvolatile memory of the nonvolatile memory module according to example embodiments of the inventive concept. In example embodiments, a first memory block BLK1 having a three-dimensional structure will be described with reference to FIG. 23. However, example embodiments of the inventive concept are not limited thereto. For example, the remaining memory blocks may have a structure similar to the first memory block BLK1.

Referring to FIG. 23, the first memory block BLK1 may include a plurality of cell strings CS11, CS12, CS21, and CS22. The cell strings CS11, CS12, CS21, and CS22 may be arranged along a row direction and a column direction and may form rows and columns.

Each of the cell strings CS11, CS12, CS21, and CS22 may include a plurality of cell transistors. Each of the cell strings CS11, CS12, CS21, and CS22 may include string selection transistor SSTa and SSTb, a plurality of memory cells MC1 to MC8, ground selection transistors GSTa and GSTb, and dummy memory cells DMC1 and DMC2. In example embodiments, each of the memory cells included in the cell strings CS11, CS12, CS21, and CS22 may be a charge trap flash (CTF) memory cell.

The plurality of memory cells MC1 to MC8 may be serially connected and may be stacked in a height direction being a direction perpendicular to a plane defined by the row direction and the column direction. The string selection transistors SSTa and SSTb may be serially connected and may be disposed between the memory cells MC1 to MC8 and bit lines BL1 and BL2. The ground selection transistors GSTa and GSTb may be serially connected and may be disposed between the memory cells MC1 to MC8 and a common source line CSL.

In example embodiments, a first dummy memory cell DMC1 may be disposed between the memory cells MC1 to MC8 and the ground selection transistors GSTa and GSTb. In example embodiments, a second dummy memory cell DMC2 may be disposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In example embodiments, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to the second ground selection line.

In example embodiments, ground selection transistors provided at the same height from a substrate may be connected to the same ground selection line, and ground selection transistors provided at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate or the ground selection transistors GSTa and GSTb may be connected in common to the same word line, and memory cells placed at different heights therefrom may be connected to different word lines. For example, memory cells MC1 to MC8 of the cell strings CS11, CS12, CS21, and CS22 may be connected to first to eighth word lines WL1 to WL8.

String selection transistors, belonging to the same row, among the first string selection transistors SSTa at the same height may be connected to the same string selection line, and string selection transistors belonging to different rows may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

Likewise, string selection transistors, belonging to the same row, among the second string selection transistors SSTb at the same height may be connected to the same string selection line, and string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

In example embodiments, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

The first memory block BLK1 illustrated in FIG. 23 may be an example. For example, the number of cell strings may increase or decrease, and the number of rows of cell strings and the number of columns of cell strings may increase or decrease according to the number of cell strings. In the first memory block BLK1, the number of cell strings (GST, MC, DMC, SST, or the like) may increase or decrease, and a height of the first memory block BLK1 may increase or decrease according to the number of cell transistors. Furthermore, the number of lines (GSL, WL, DWL, SSL, or the like) connected with cell transistors may increase or decrease according to the number of cell strings (GST, MC, DMC, SST, or the like).

In example embodiments, the nonvolatile memory according to example embodiments may not be limited to the above-described configuration. In example embodiments, the nonvolatile memory may include a three-dimensional memory array. The 3-dimensional memory array may be monolithically formed in one or more physical level(s) of a memory cell array having an active area arranged on a circuit related on a silicon substrate and an operation of memory cells. The circuit related on an operation of memory cells may be located in a substrate or on a substrate. A term "monolithically" may mean that layers of each level in a 3-dimensional array are directly deposited on layers of low-level in the 3-dimensional array.

According to example embodiments of the inventive concept, the 3-dimensional memory array may have a vertical-directional characteristic, and may include vertical NAND strings in which at least one memory cell is located on another memory cell. The at least one memory cell may include a charge trap layer. Each vertical NAND string may include at least one select transistor located over memory cells. The at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 24:
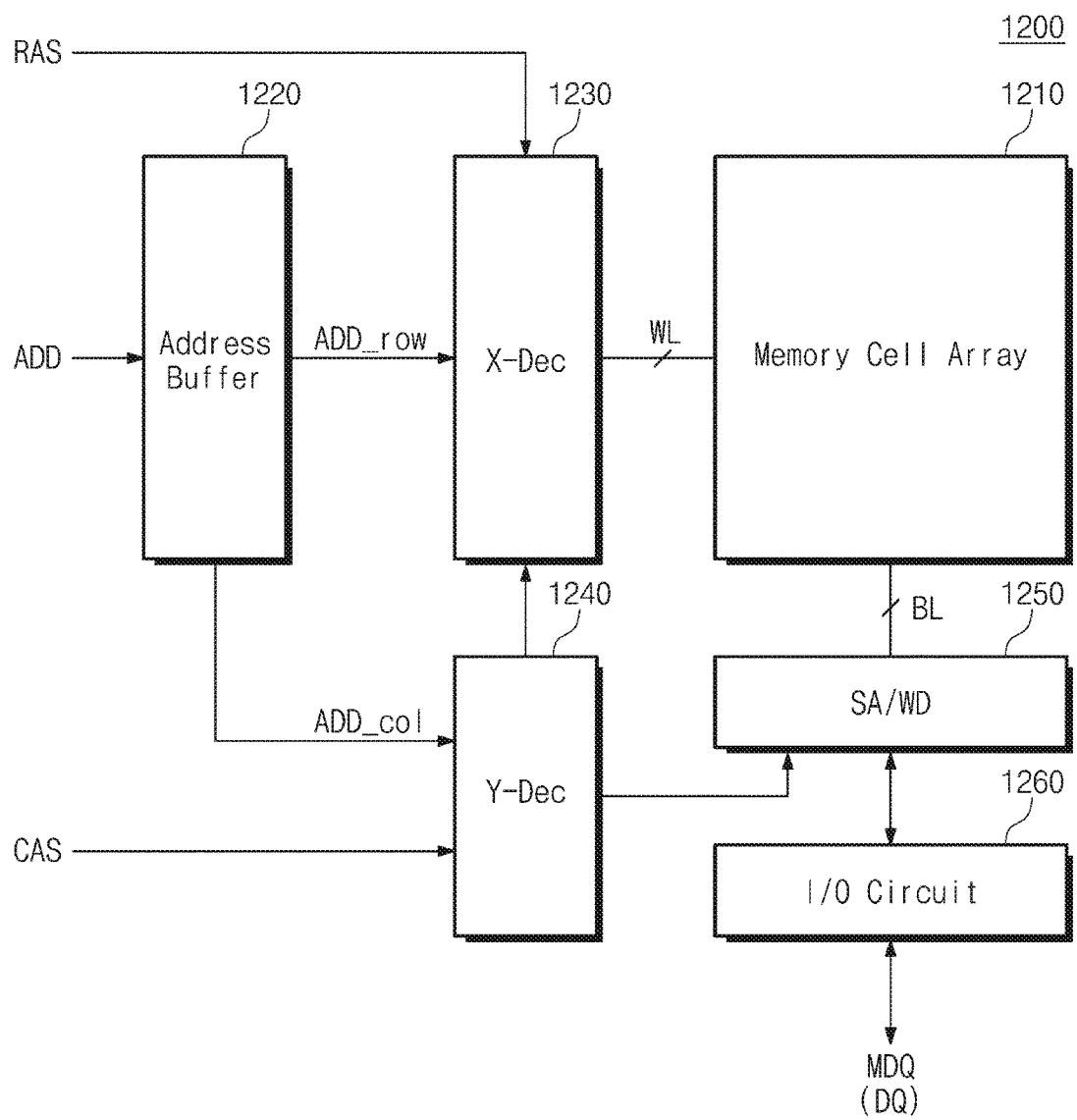
FIG. 24 is a block diagram illustrating a volatile memory of the nonvolatile memory module according to example embodiments of the inventive concept.

FIG. 24 is a block diagram illustrating a volatile memory of the nonvolatile memory module according to example embodiments of the inventive concept. Referring to FIG. 24, a volatile memory 1200 may include a memory cell array 1210, an address buffer 1220, a row decoder (X-decoder) 1230, a column decoder (Y-decoder) 1240, a sense amplifier and write driver (SA/WD) 1250, and an input/output (I/O) circuit 1260.

The memory cell array 1210 may include a plurality of memory cells, which are connected with a plurality of word lines WL and a plurality of bit lines BL. The plurality of memory cells may be arranged at intersections of the word lines and the bit lines, respectively. In example embodiments, each of the plurality of memory cells may include a storage capacitor and an access transistor.

The address buffer 1220 may receive and temporarily store an address ADD from the module controller A110. In example embodiments, the address buffer 1220 may provide a row address ADD_row of the received address ADD to the X-decoder 1230 and may provide a column address ADD_col thereof to the Y-decoder 1240.

The X-decoder 1230 may be connected to the memory cell array 1210 through the bit lines BL. The X-decoder 1230 may activate at least one, which corresponds to the row address ADD_row, among the plurality of word lines WL in response to a row address strobe signal RAS from the module controller A110.

The Y-decoder 1240 may receive the column address ADD_col from the address buffer 1220. When a column address strobe signal CAS is received, the Y-decoder 1240 may control the sense amplifier and write driver 1250 based on the column address ADD_col.

The sense amplifier and write driver 1250 may be connected to the memory cell array 1210 through the plurality of bit lines BL. The sense amplifier and write driver 1250 may sense a voltage change of each bit line. Alternatively, the sense amplifier and write driver 1250 may control voltages of the plurality of bit lines based on data received from the input/output circuit 1260.

The input/output circuit 1260 may receive data from the sense amplifier and write driver 1250 and may output the received data through the memory data line MDQ (or the data line DQ). Alternatively, the input/output circuit 1260 may receive data through the memory data line MDQ (or the data line DQ) and may provide the received data to the sense amplifier and write driver 1250.

In example embodiments, the address ADD may be a VM command/address CA_v provided from the module controller A110. The row address strobe signal RAS and the column address strobe signal CAS may be signals that are included in the VM command/address CA_v provided from the module controller A110.

Figure 25:
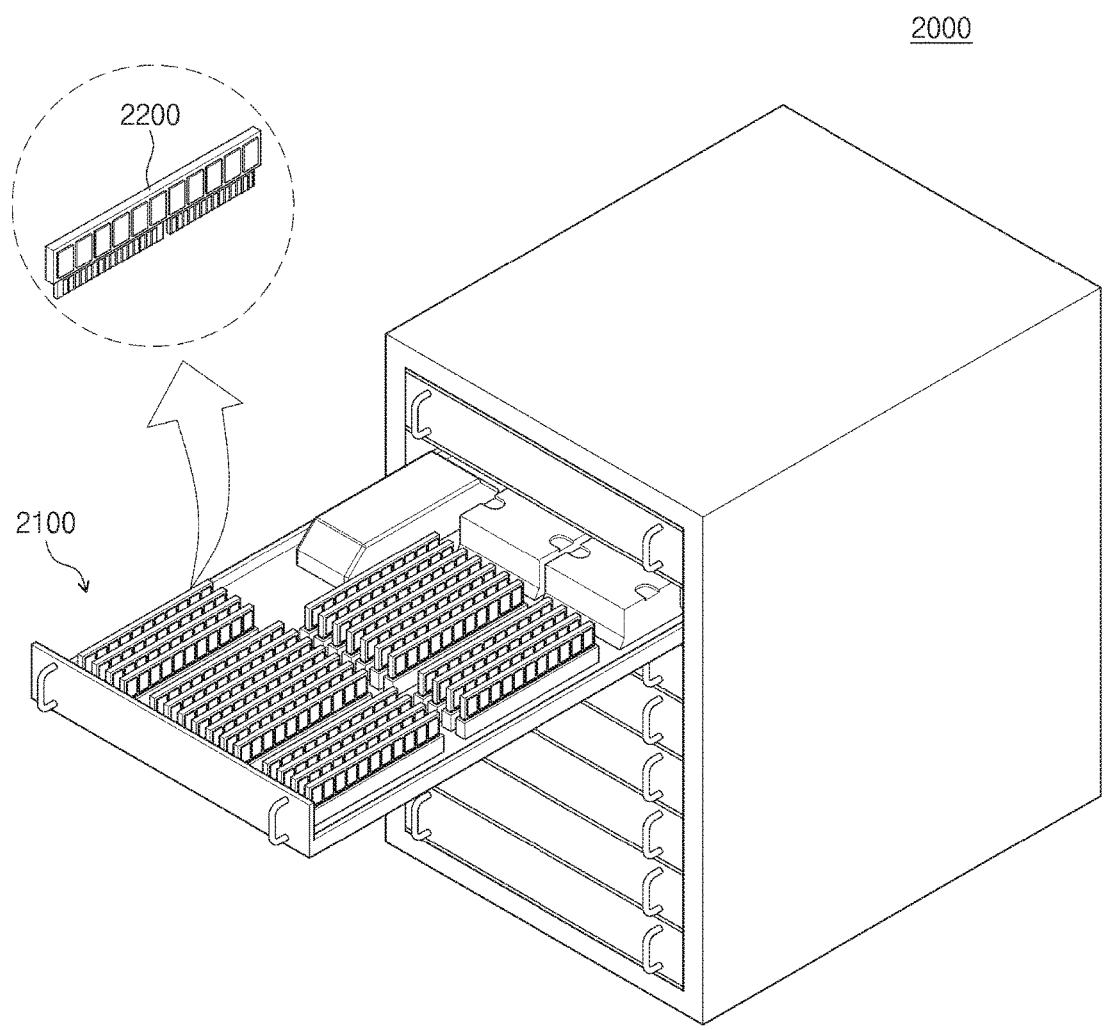
FIG. 25 is a drawing illustrating a server system to which the nonvolatile memory system according to example embodiments of the inventive concept is applied.

FIG. 25 is a drawing illustrating a server system to which the nonvolatile memory system according to example embodiments of the inventive concept is applied. Referring to FIG. 25, a server system 2000 may include a plurality of server racks 2100. Each of the server racks 2100 may include a plurality of nonvolatile memory modules 2200. The nonvolatile memory modules 2200 may be directly connected with processors respectively included in the server racks 2100. For example, the nonvolatile memory modules 2200 may have the form of a dual in-line memory module and may be mounted on a DIMM socket electrically connected with a processor to communicate with the processor. In example embodiments, the nonvolatile memory modules 2200 may be used as storage of the server system 2000. In example embodiments, each of the plurality of nonvolatile memory modules 2200 may be a nonvolatile memory module described with reference to FIGS. 1 to 24 or may operate according to an operation method described with reference to FIGS. 1 to 24.

Figure 26:
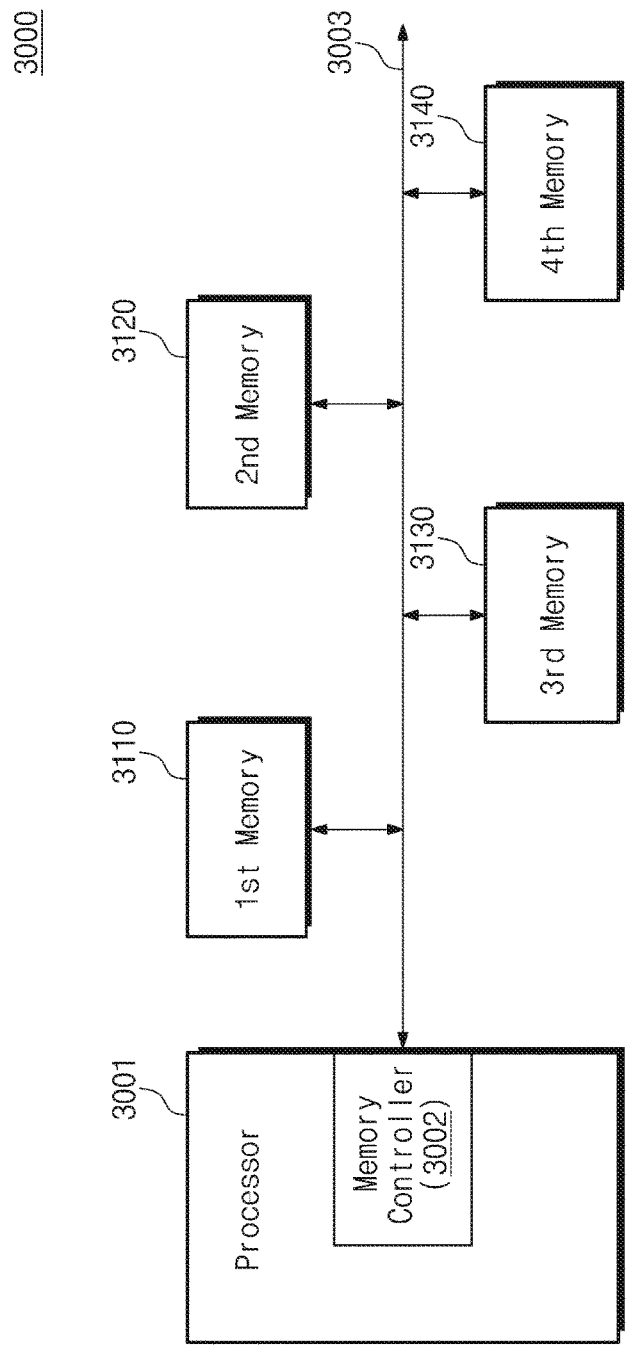
FIG. 26 is a block diagram illustrating a user system to which the nonvolatile memory module according to example embodiments of the inventive concept is applied.

FIG. 26 is a block diagram illustrating a user system to which the nonvolatile memory module according to example embodiments of the inventive concept is applied. Referring to FIG. 26, a computing system 3000 may include a processor 3001 and a plurality of memories 3110 to 3140.

The processor 3001 may include a memory controller 3002. The memory controller 3002 may communicate with the memories 3110 and 3140 through one bus 3003. In example embodiments, the bus 3003 may include dedicated buses that are respectively connected with the plurality of memories 3110 to 3140 or a shared bus shared by the plurality of memories 3110 to 3140. In example embodiments, the bus 3003 may include at least one among the data line DQ, the memory data line MDQ, and the tag data line TDQ described with reference to FIGS. 1 to 25.

In example embodiments, a part the plurality of memories 3110 to 3140 may be a nonvolatile memory module described with reference to FIGS. 1 to 25 or may operate according to an operation method described with reference to FIGS. 1 to 25.

Alternatively, a part of the plurality of memory modules 3110 to 3140 may include a nonvolatile memory, and the others thereof may include a volatile memory. A memory module including a volatile memory may be used as a cache memory of a memory module including a nonvolatile memory. That is, as described with reference to FIGS. 1 to 25, a part of the plurality of memory modules 3110 to 3140 may be used as a main memory of the user system 3000, and the others thereof may be used as a cache memory. Memories used as a cache memory may be a volatile memory described with reference to FIGS. 1 to 25 or may operate the same as a volatile memory described with reference to FIGS. 1 to 25.

In example embodiments, the memory controller 3002 may be a memory controller or a controller described with reference to FIGS. 1 to 25 or may operate the same as a memory controller described with reference to FIGS. 1 to 25.

Figure 27:
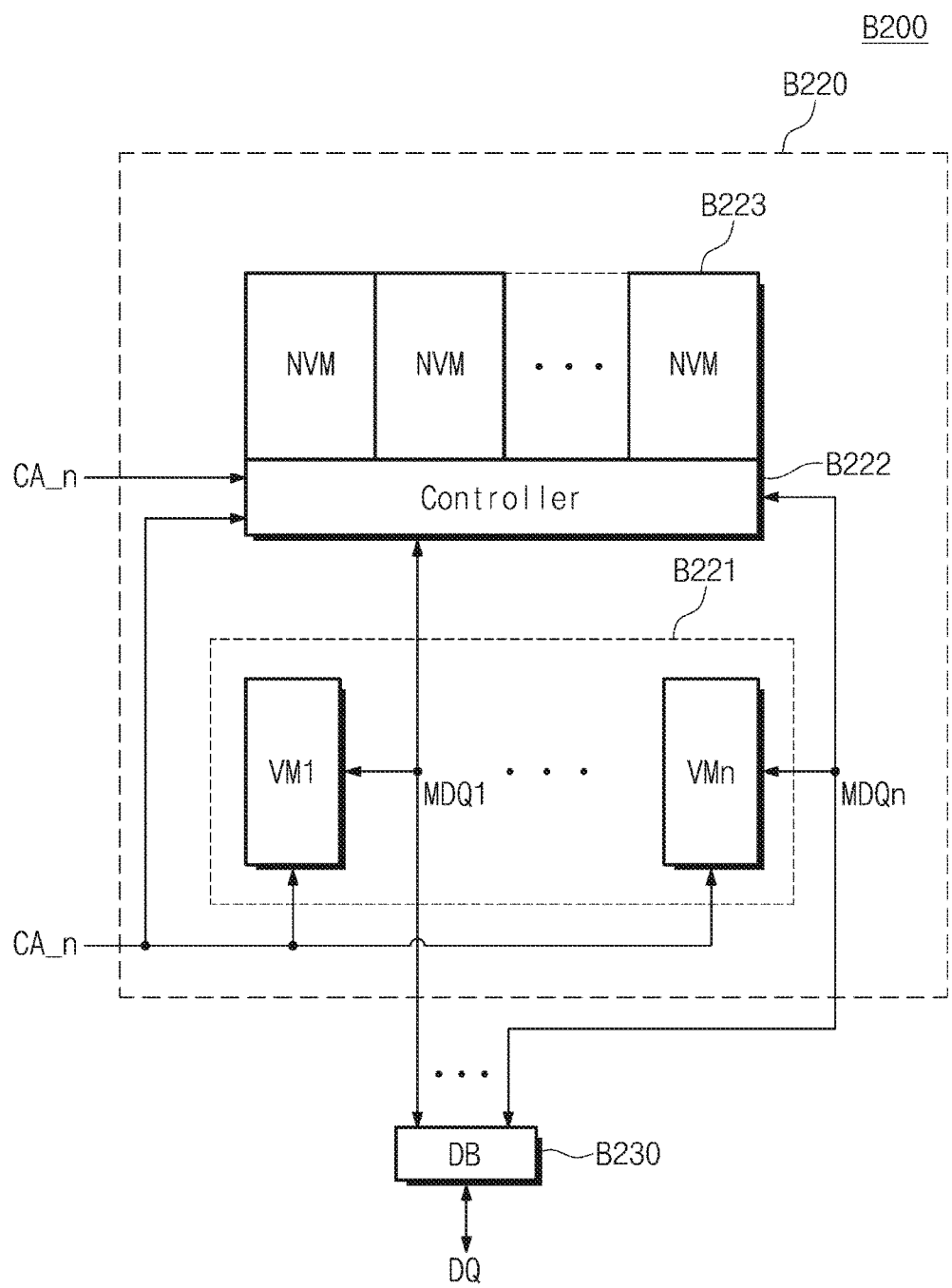
FIG. 27 is a block diagram illustrating a nonvolatile memory module of FIG. 2, according to example embodiments of the inventive concept.

FIG. 27 is a block diagram illustrating a nonvolatile memory module of FIG. 2, according to example embodiments of the inventive concept. For ease of illustration, elements (e.g., a module controller and an SPD) other than a heterogeneous memory device B220 and a data buffer B230 are omitted. For descriptive convenience, a detailed description about above-described components may be omitted. Referring to FIG. 27, a nonvolatile memory module B200 may include the heterogeneous memory device B220 and the data buffer B230.

Unlike the heterogeneous memory device 120 of FIG. 2, the heterogeneous memory device B220 of FIG. 27 may include a plurality of volatile memories B221, an NVM controller B222, and a plurality of nonvolatile memories B223. Each of the volatile memories B221, the NVM controller B222, and the nonvolatile memories B223 may be implemented with a separate die, a separate chip, or a separate package. Each of the volatile memories B221, the NVM controller B222, and the nonvolatile memories B223 may be implemented with a separate chip, and the separate chips may be implemented in one package through a multi-chip package (MCP).

The plurality of volatile memories B221 may be configured to share different memory data lines MDQ1 to MDQn with the NVM controller B222. For example, the first volatile memory VM1 may share the first memory data line MDQ1 with the NVM controller B222. The first memory data line MDQ1 may be connected with the data buffer B230. In example embodiments, the first memory data line MDQ1 may include eight lines. The n-th volatile memory VMn may share the n-th memory data line MDQn with the NVM controller B222. The n-th memory data line MDQn may be connected with the data buffer B230. In example embodiments, the n-th memory data line MDQn may include eight lines. Each of the plurality of volatile memories B221 may share a corresponding one among the memory data lines MDQ1 to MDQn with the NVM controller B222, and the plurality of memory data lines MDQ1 to MDQn may be connected with one data buffer B230.

The data buffer B230 may be connected with the processor 101 (refer to FIG. 1) through the data line DQ. In this case, the number of data lines DQ may be determined according to the number of memory data lines MDQ1 to MDQn.

In example embodiments, the nonvolatile memory module B200 may operate according to an operation method described with reference to FIGS. 1 to 8.

Figure 28:
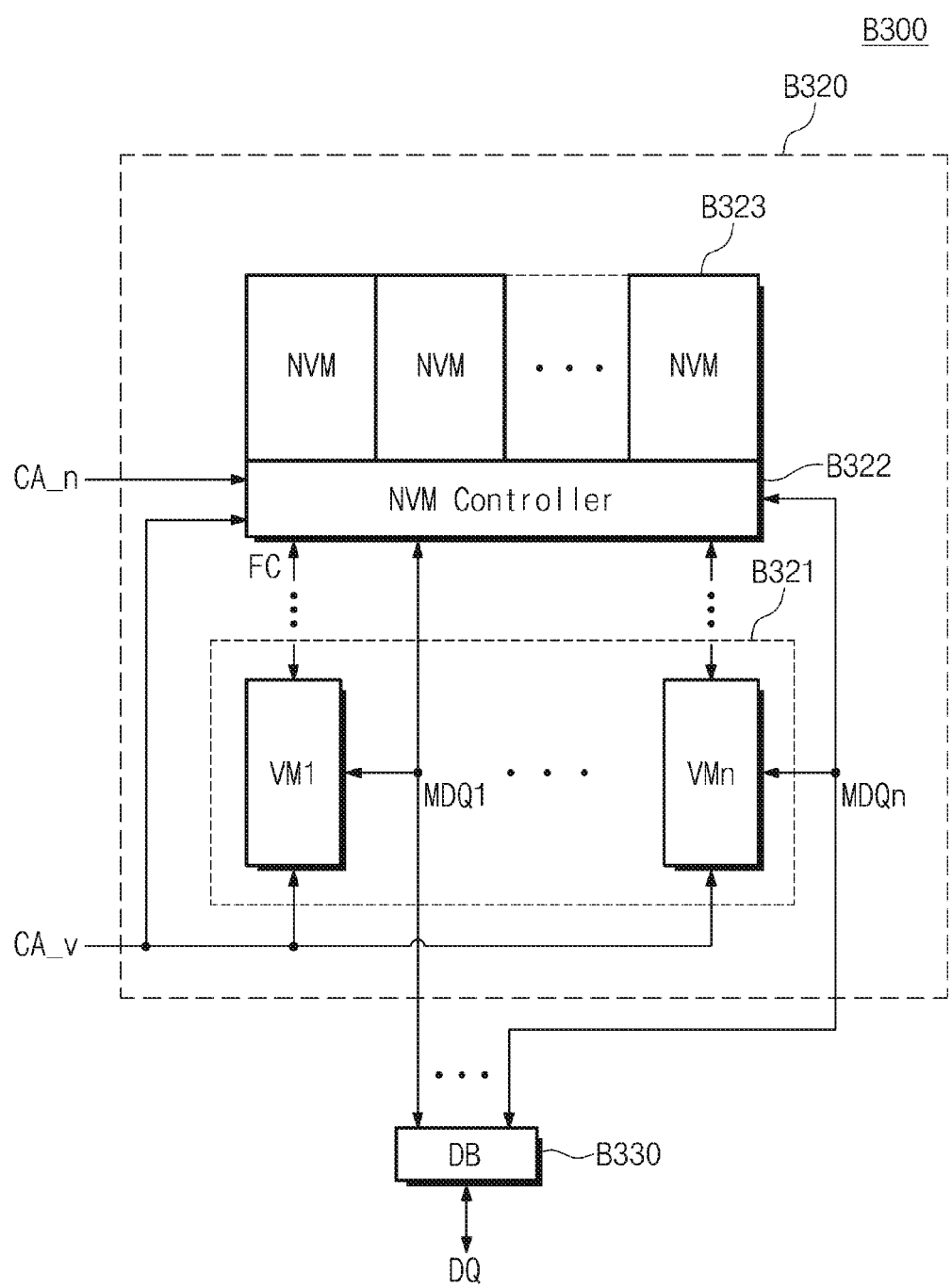
FIG. 28 is a block diagram illustrating a nonvolatile memory module of FIG. 2, according to example embodiments of the inventive concept.

FIG. 28 is a block diagram illustrating a nonvolatile memory module of FIG. 2, according to example embodiments of the inventive concept. For descriptive convenience, a detailed description about elements described with reference to FIG. 27 is omitted. Referring to FIG. 28, a nonvolatile memory module B300 may include a heterogeneous memory device B320 and a data buffer B330. The heterogeneous memory device B320 may include a plurality of volatile memories B321, an NVM controller B322, and a plurality of nonvolatile memories B223.

Unlike the heterogeneous memory device B220 of FIG. 27, the heterogeneous memory device B320 may include a dedicated flush channel FC. The dedicated flush channel FC may provide a data transmission path between each volatile memory B321 and the NVM controller B222. As described above, the nonvolatile memory module B300 may perform the flush operation. The nonvolatile memory module B300 may control the heterogeneous memory device B320 such that data is provided from each volatile memory B321 to the NVM controller B322 through the device flush channel FC.

In example embodiments, the nonvolatile memory module B300 may operate according to an operation method described with reference to FIGS. 1 to 8.

Figure 29:
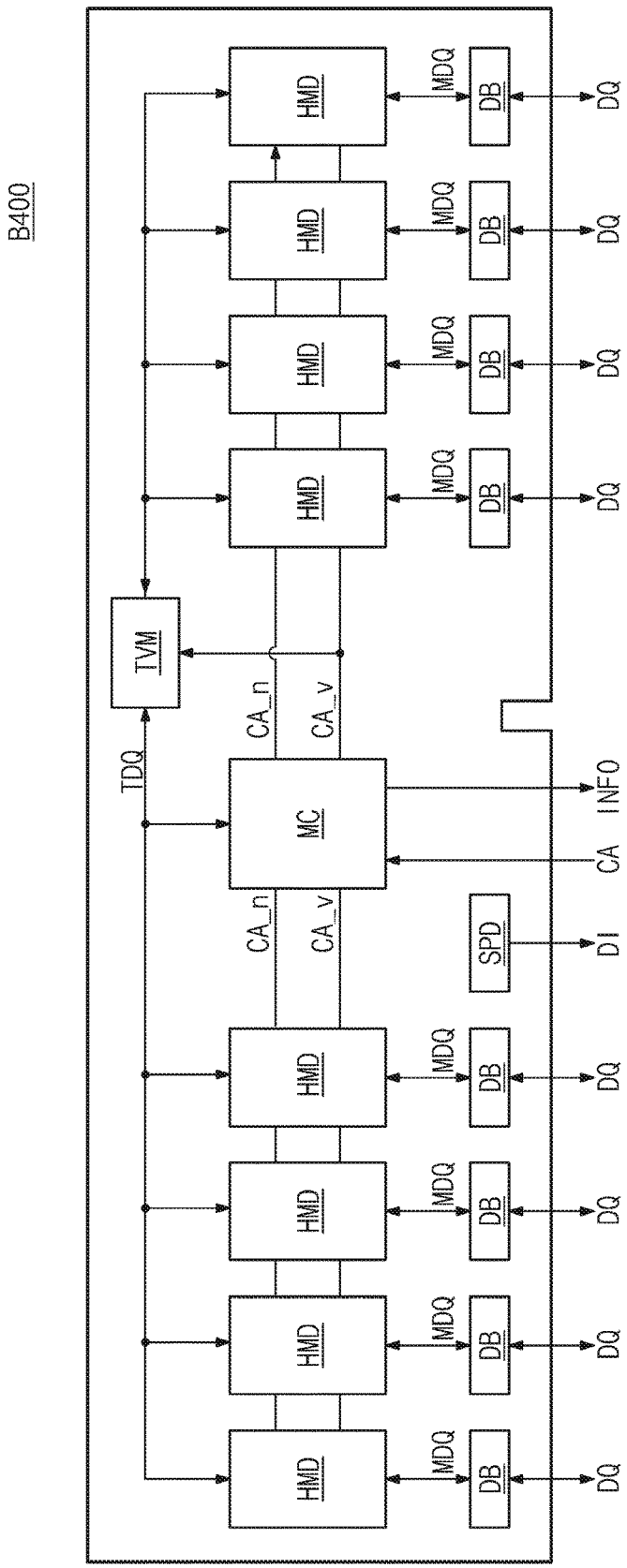
FIG. 29 is a block diagram illustrating the nonvolatile memory module of FIG. 2, according to example embodiments of the inventive concept.

FIG. 29 is a block diagram illustrating the nonvolatile memory module of FIG. 2, according to example embodiments of the inventive concept. Referring to FIG. 29, a nonvolatile memory module B400 may include a module controller MC, a plurality of heterogeneous memory devices HMD, a plurality of data buffers DB, an SPD, and a tag dedicated volatile memory TVM. In example embodiments, the nonvolatile memory module B400 may have the form of load reduced dual in-line memory module (LRDIMM). For descriptive convenience, a duplicated description about above-described elements is omitted.

As described above, the module controller MC may receive a module command/address CA from the processor 101 (refer to FIG. 1) and may output the NVM command/address CA_n and the VM command/address CA_v in response to the received module command/address CA. In example embodiments, the NVM command/address CA_n and the VM command/address CA_v may be provided to the heterogeneous memory devices HMD through different buses.

Each of the plurality of heterogeneous memory devices HMD may be implemented with a separate package and may be one among heterogeneous memory devices described with reference to FIGS. 1 to 28. As described above, each of the plurality of heterogeneous memory devices HMD may operate in response to the NVM command/address CA_n and the VM command/address CA_v from the module controller MC. In example embodiments, the NVM command/address CA_n may be provided to an NVM controller included in each heterogeneous memory device HMD, and the VM command/address CA_v may be provided to a volatile memory and the NVM controller that are included in the heterogeneous memory device HMD.

The SPD may include the device information DI about the nonvolatile memory module B400 and may provide the device information DI to the processor 101.

The tag dedicated volatile memory TVM may operate in response to the VM command/address CA_v from the module controller MC. The tag dedicated volatile memory TVM may store tags TAG about pieces of data stored in volatile memories of the heterogeneous memory devices HMD. The tag dedicated volatile memory TVM may send and receive a tag TAG through the tag data line TDQ. In example embodiments, the tag data line TDQ may be shared by the module controller MC, the plurality of heterogeneous memory devices HMD, and the tag dedicated volatile memory TVM.

The tag dedicated volatile memory TVM may be configured to be similar to the heterogeneous memory device HMD. For example, a volatile memory included in at least one among the plurality of heterogeneous memory devices HMD may be used as the tag dedicated volatile memory TVM.

In example embodiments, the nonvolatile memory module B400 of FIG. 29 may operate according to an operation method described with reference to FIGS. 1 to 8.

Figure 30:
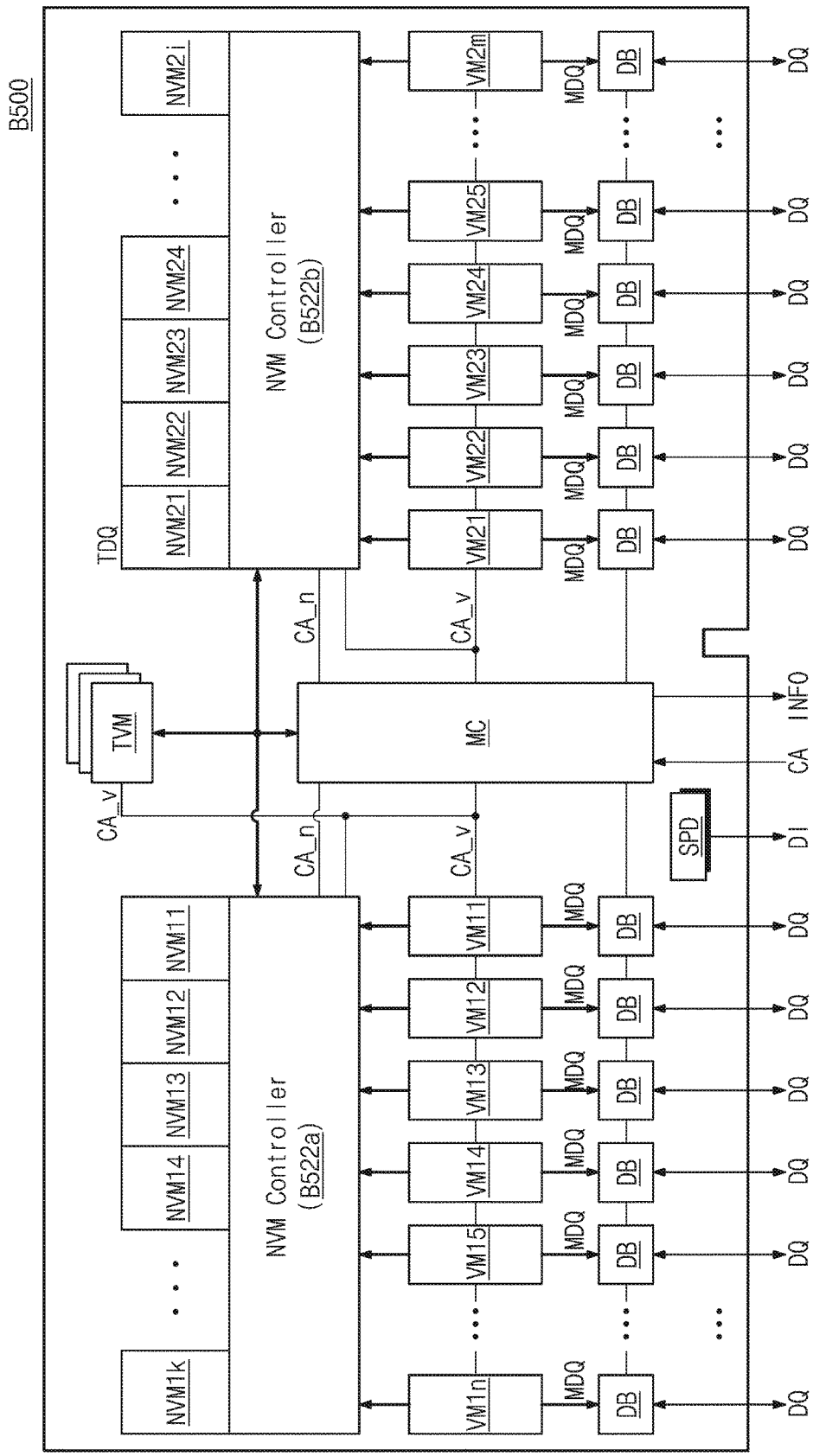
FIG. 30 is a block diagram illustrating a nonvolatile memory module of FIG. 2, according to example embodiments of the inventive concept.

FIG. 30 is a block diagram illustrating a nonvolatile memory module of FIG. 2, according to example embodiments of the inventive concept. For descriptive convenience, a detailed description about above-described components may be omitted. Referring to FIG. 30, a nonvolatile memory module B500 may include the module controller MC, a plurality of volatile memories VM11 to VM1$n$ and VM21 to VM2$m$, a plurality of nonvolatile memories NVM11 to NVM1$k$ and NVM21 to NVM2$i$, the tag dedicated volatile memory TVM, the SPD, and the plurality of data buffers DB. In example embodiments, the nonvolatile memory module B500 of FIG. 30 may have an LRDIMM structure.

In the plurality of volatile memories VM11 to VM1$n$ and VM21 to VM2$m$, volatile memories VM11 to VM1$n$ may be configured to share memory data lines MDQ with a first NVM controller B522$a$. The remaining volatile memories VM21 to VM2$m$ may be configured to share memory data lines MDQ with a second NVM controller B522$b$. Each of the plurality of volatile memories VM11 to VM1$n$ and VM21 to VM2$m$ may be configured to share the memory data line MDQ with a corresponding one among the plurality of data buffers DB.

In the plurality of nonvolatile memories NVM11 to NVM1$k$ and NVM21 to NVM2$i$, nonvolatile memories NVM11 to NVM1$k$ may be configured to operate in response to control of the first NVM controller B522$a$. The remaining nonvolatile memories NVM21 to NVM2$i$ may be configured to operate in response to control of the second NVM controller B522$b$.

The tag dedicated volatile memory TVM may be configured to share the tag data line TDQ with the module controller MC, the first NVM controller B522$a$, and the second NVM controller B522$b$.

In example embodiments, each of elements illustrated in FIG. 30 may be implemented with a semiconductor chip, and at least a part of the semiconductor chips may be implemented in one package. For example, each of the plurality of volatile memories VM11 to VM1$n$ and VM21 to VM2$m$, the plurality of nonvolatile memories NVM11 to NVM1$k$ and NVM21 to NVM2$i$, the first NVM controller B522$a$, and the second NVM controller B522$b$ may be implemented with a separate semiconductor chip. A part of the plurality of volatile memories VM11 to VM1$n$ and VM21 to VM2$m$, the plurality of nonvolatile memories NVM11 to NVM1$k$ and NVM21 to NVM2$i$, the first NVM controller B522$a$, and the second NVM controller B522$b$ may be implemented in one package.

For example, a part (e.g., VM11 to VM1$n$) of the plurality of volatile memories VM11 to VM1$n$ and VM21 to VM2$m$ may be implemented in one package, and the NVM controller B522$a$ and a part (e.g., NVM11 to NVM1$k$) of the plurality of nonvolatile memories NVM11 to NVM1k and NVM21 to NVM2i may be implemented in another package.

In example embodiments, the tag dedicated volatile memory TVM may include a plurality of semiconductor chips. For example, the tag dedicated volatile memory TVM may include a plurality of tag dedicated volatile memory chips, each of which stores the same tag, ECC, and dirty information. In this case, even though an operation of any one tag dedicated volatile memory chip is abnormal, it may be possible to write or output normally tag information, ECC information, and dirty information through another tag dedicated volatile memory. In example embodiments, a package in which the tag dedicated volatile memory TVM is included may be different from a package in which other elements are included. Alternatively, the tag dedicated volatile memory TVM may be implemented with a package in which at least a part of other elements is included.

In example embodiments, the nonvolatile memory module B500 of FIG. 30 may operate according to an operation method described with reference to FIGS. 1 to 8.

Figure 31:
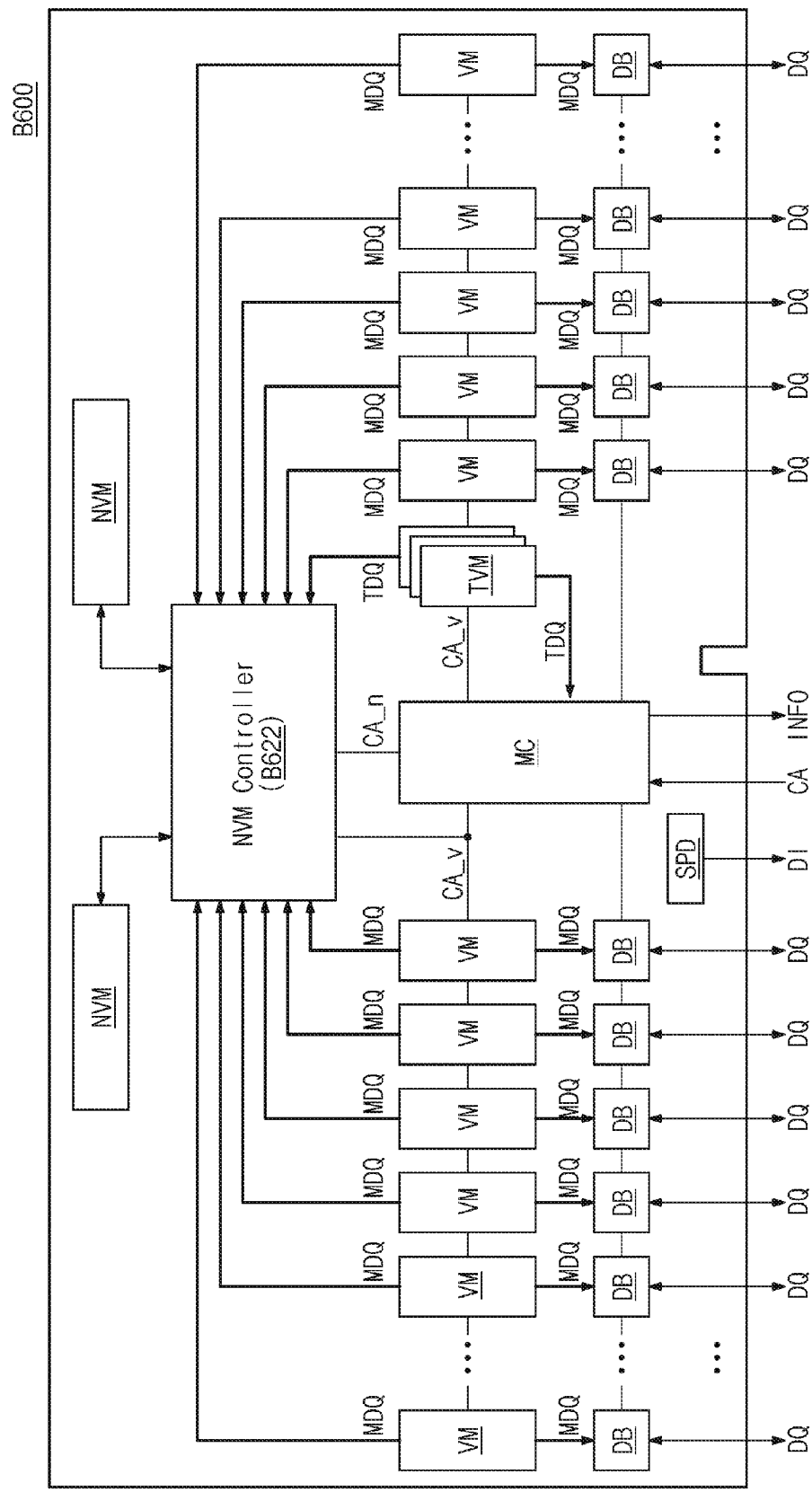
FIG. 31 is a block diagram illustrating a nonvolatile memory module of FIG. 2, according to example embodiments of the inventive concept.

FIG. 31 is a block diagram illustrating a nonvolatile memory module of FIG. 2, according to example embodiments of the inventive concept. Referring to FIG. 31, a nonvolatile memory module B600 may include the module controller MC, a plurality of volatile memories VM, an NVM controller B622, a plurality of nonvolatile memories NVM, one or more tag dedicated volatile memories TVM, the SPD, and the plurality of data buffers DB. For descriptive convenience, a detailed description about above-described components may be omitted. In example embodiments, the nonvolatile memory module B600 of FIG. 31 may have an LRDIMM structure.

Unlike the nonvolatile memory module B500 of FIG. 30, the nonvolatile memory module B600 of FIG. 31 may control the nonvolatile memories NVM through one NVM controller B622. That is, each of the plurality of volatile memories VM may be configured to share a memory data line MDQ with the NVM controller B622.

The tag dedicated volatile memory TVM may be configured to share the tag data line TDQ with the module controller MC and the NVM controller B622. As described above, on the basis of the VM command/address CA_v, the tag described volatile memory TVM may write a tag TAG or may output a tag TAG stored therein.

In example embodiments, the nonvolatile memory module B600 of FIG. 31 may operate according to an operation method described with reference to FIGS. 1 to 8.

Figure 32:
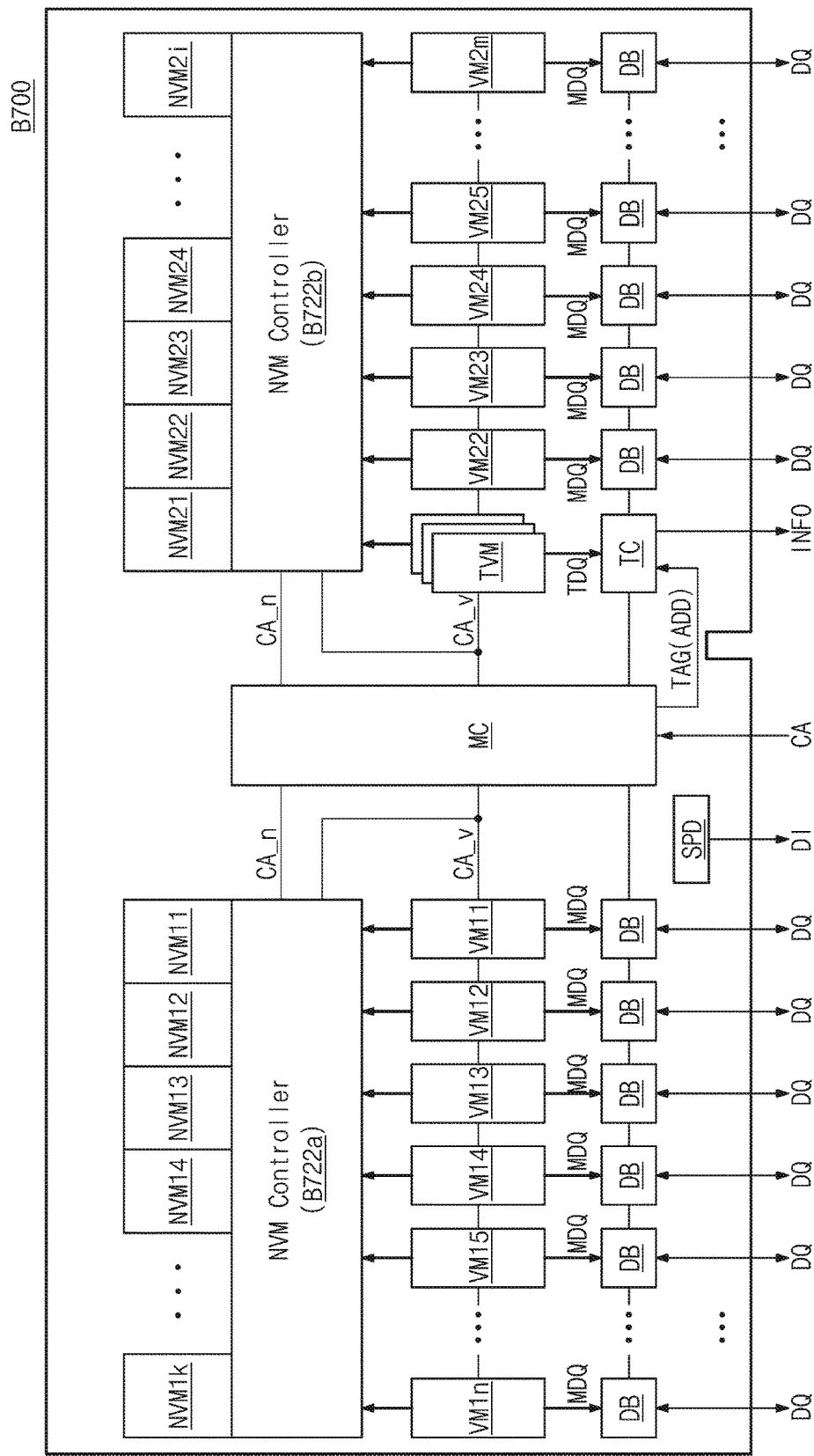
FIG. 32 is a block diagram illustrating a nonvolatile memory module of FIG. 2, according to example embodiments of the inventive concept.

FIG. 32 is a block diagram illustrating the nonvolatile memory module of FIG. 2, according to example embodiments of the inventive concept. Referring to FIG. 32, a nonvolatile memory module B700 may include the module controller MC, first and second NVM controllers B722a and B722b, the plurality of volatile memories VM11 to VM1n and VM21 to VM2m, a plurality of nonvolatile memories NVM11 to NVM1k and NVM21 to NVM2i, the one or more tag dedicated volatile memories TVM, the SPD, the plurality of data buffers DB, and a tag control circuit TC. For descriptive convenience, a detailed description about above-described components may be omitted. In example embodiments, the nonvolatile memory module B700 of FIG. 32 may have an LRDIMM structure.

Unlike the nonvolatile memory modules B400 to B600 of FIGS. 29 to 31, the nonvolatile memory module B700 of FIG. 32 may further include the tag control circuit TC. The control circuit TC may be configured to share the tag data line TDQ with the tag dedicated volatile memory TVM. That is, the tag control circuit TC may receive a tag TAG from the tag dedicated volatile memory TVM through the tag data line TDQ or may send the tag TAG to the tag dedicated volatile memory TVM through the tag data line TDQ.

The module controller MC may control the tag control circuit TC to determine whether a cache hit or a cache miss occurs, and the tag control circuit TC may output cache information INFO as the determination result. For example, the tag control circuit TC may receive the tag TAG from the tag dedicated volatile memory TVM under control of the module controller MC. The tag control circuit TC may compare a tag TAG (or an address ADD) from the module controller MC and a tag TAG from the tag dedicated volatile memory TVM and to determine whether a cache miss or a cache hit occurs.

In example embodiments, the tag control circuit TC may be implemented with software or hardware, and the tag control circuit TC may be included in the module controller MC or may be included in each of the first and second NVM controllers B722a and B722b.

In example embodiments, the nonvolatile memory module B700 of FIG. 32 may operate according to an operation method described with reference to FIGS. 1 to 8.

Figure 33:
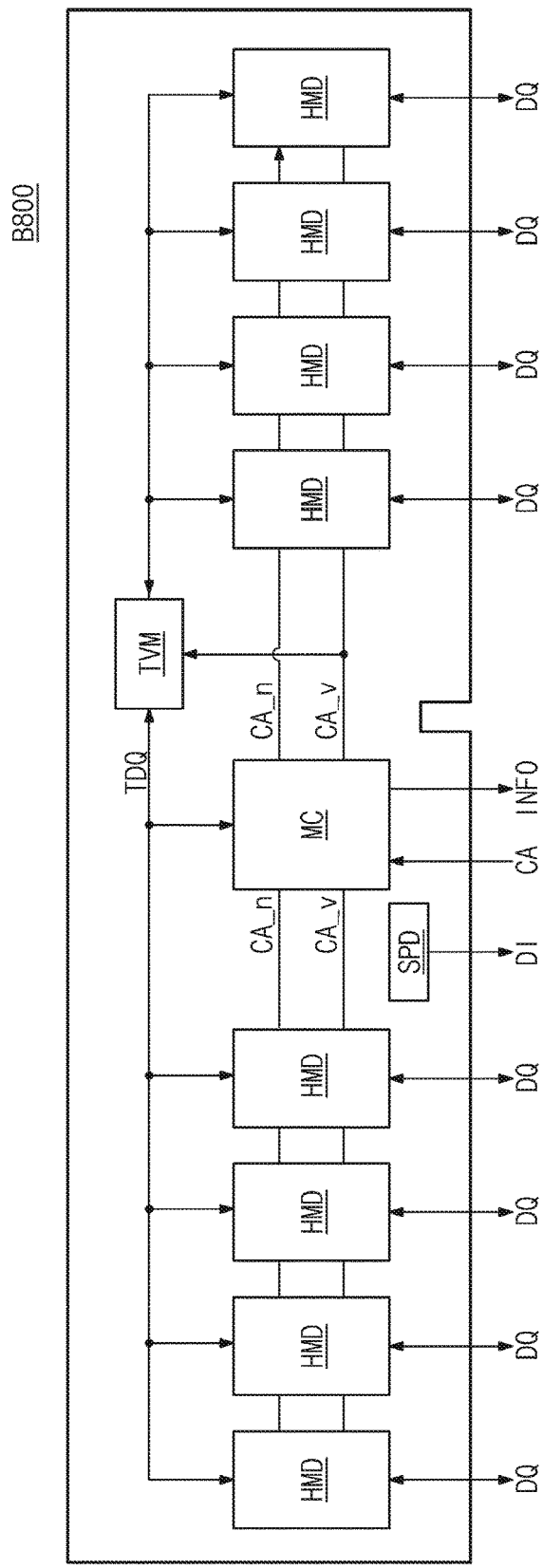
FIG. 33 is a block diagram illustrating a nonvolatile memory module of FIG. 2, according to example embodiments of the inventive concept.

FIG. 33 is a block diagram illustrating a nonvolatile memory module of FIG. 2, according to example embodiments of the inventive concept. Referring to FIG. 33, a nonvolatile memory module B800 may include the module controller MC, the plurality of heterogeneous memory devices HMD, the tag dedicated volatile memory TVM, and the SPD. For descriptive convenience, a detailed description about above-described components may be omitted.

Unlike the nonvolatile memory module B400 of FIG. 29, the nonvolatile memory module B800 illustrated in FIG. 33 may not include a plurality of data buffers. That is, the nonvolatile memory module B800 may have a registered DIMM (RDIMM) structure.

Each of the plurality of heterogeneous memory devices HMD may be directly connected with the data line DQ. In example embodiments, an NVM controller and a volatile memory included in each of the plurality of heterogeneous memory devices HMD may be configured to share the data line DQ.

In example embodiments, the processor 101 (refer to FIG. 1) may receive the device information DI from the SPD of the nonvolatile memory module B800 and may control the nonvolatile memory module B800 based on the received device information DI. In this case, the device information DI may include operation information of the nonvolatile memory module B800 such as a read latency RL and a write latency WL. That is, even though a volatile memory and an NVM controller included in each heterogeneous memory device HMD share a data line DQ and exchange data with each other through the data line DQ independent of a request of the processor 101, because the processor 101 controls the nonvolatile memory module B800 based on the device information, the processor 101 may perform normally a read or write operation about the nonvolatile memory module B800.

In example embodiments, the nonvolatile memory module B800 of FIG. 33 may operate according to an operation method described with reference to FIGS. 1 to 8.

Figure 34:
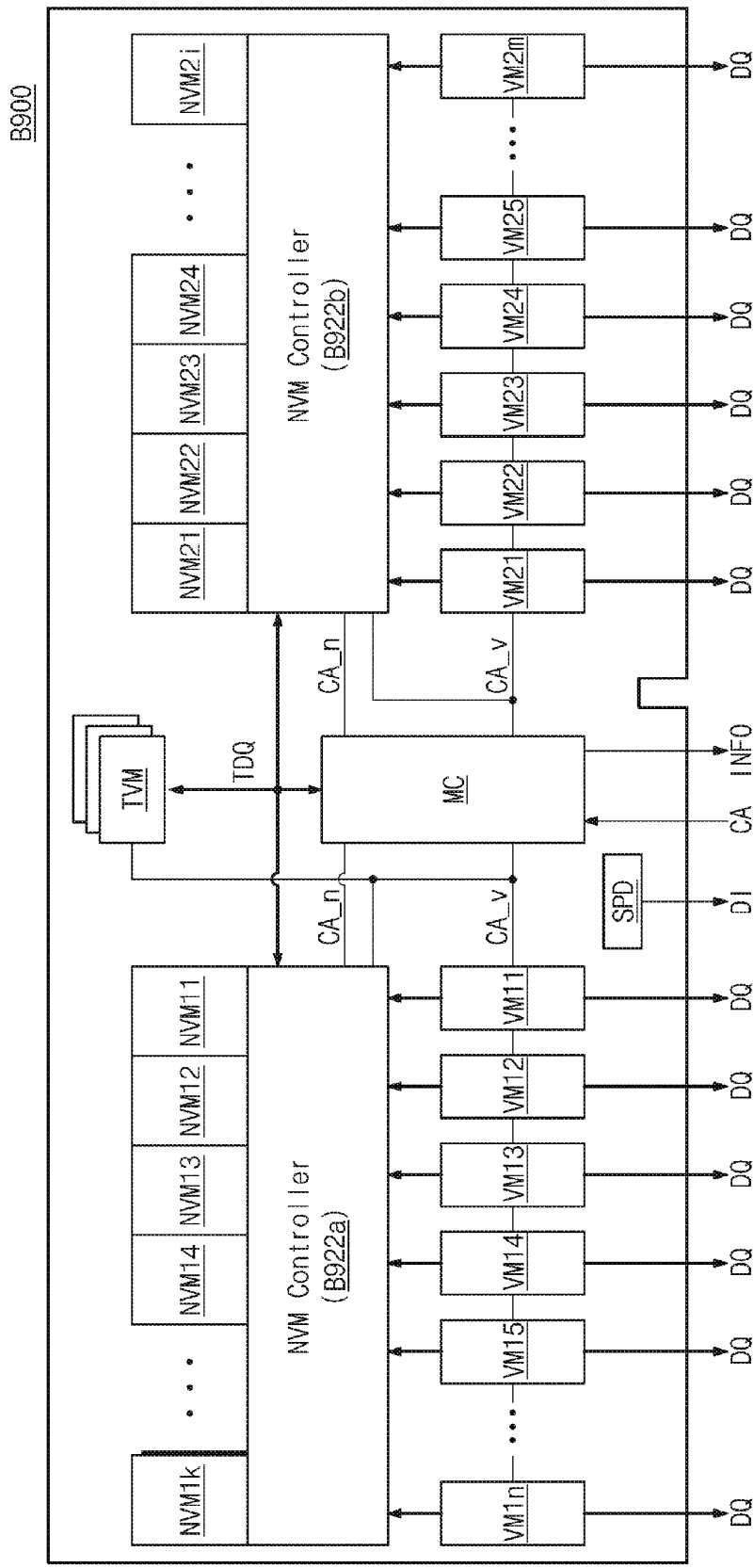
FIG. 34 is a block diagram illustrating the nonvolatile memory module of FIG. 2, according to example embodiments of the inventive concept.

FIG. 34 is a block diagram illustrating the nonvolatile memory module of FIG. 2, according to example embodiments of the inventive concept. Referring to FIG. 34, a nonvolatile memory module B900 may include the module controller MC, the plurality of volatile memories VM11 to VM1n and VM21 to VM2m, first and second NVM controllers B922a and B922b, the plurality of nonvolatile memories NVM11 to NVM1k and NVM21 to NVM2i, the one or more tag dedicated volatile memories TVM, and the SPD. For descriptive convenience, a detailed description about above-described components may be omitted.

Unlike the nonvolatile memory module B500 of FIG. 30, the nonvolatile memory module B900 of FIG. 34 may not include the plurality of data buffers DB. That is, the nonvolatile memory module B900 may have an RDIMM structure. In this case, a part (e.g., VM11 to VM1n) of the plurality of volatile memories VM11 to VM1n and VM21 to VM2m may share the data line DQ with the first NVM controller B922a, and the others (e.g., VM21 to VM2m) may share the data line DQ with the second NVM controller B922b.

As in a description given with reference to FIG. 33, even though the data lines DQ are shared by the plurality of volatile memories VM11 to VM11n and VM21 to VM2m and the first and second NVM controllers B922a and B922b, because the processor 101 operates based on the device information DI from the SPD, the processor 101 may control normally the nonvolatile memory module regardless of data exchange between the volatile memories VM11 to VM11n and VM21 to VM2m and the first and second NVM controllers B922a and B922b.

In example embodiments, the nonvolatile memory module B900 of FIG. 34 may operate according to an operation method described with reference to FIGS. 1 to 27.

Figure 35:
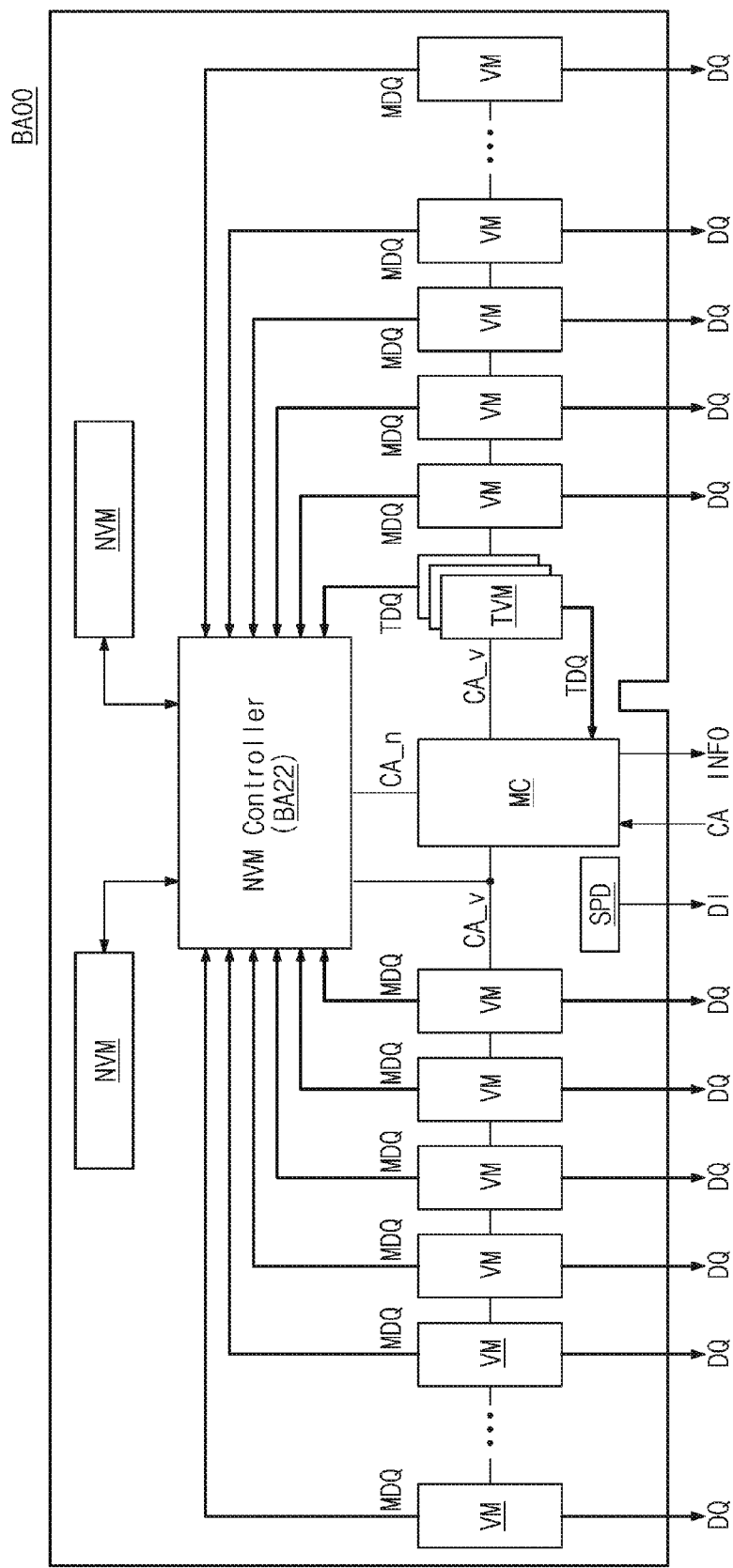
FIG. 35 is a block diagram illustrating the nonvolatile memory module of FIG. 2, according to example embodiments of the inventive concept.

FIG. 35 is a block diagram illustrating the nonvolatile memory module of FIG. 2, according to example embodiments of the inventive concept. Referring to FIG. 35, a nonvolatile memory module BA00 may include the module controller MC, a plurality of volatile memories VM, an NVM controller BA22, nonvolatile memories NVM, the one or more tag dedicated volatile memories TVM, and the SPD. For descriptive convenience, a detailed description about above-described components may be omitted.

Unlike the nonvolatile memory module B600 of FIG. 31, the nonvolatile memory module BA00 of FIG. 35 may not include the plurality of data buffers DB. That is, the nonvolatile memory module A00 may have an RDIMM structure. The plurality of volatile memories VM may be configured to share data lines DQ with the NVM controller BA22.

As described above, because the processor 101 operates based on the device information DI from the SPD, the processor 101 may control normally the nonvolatile memory module BA00 regardless of data exchange between the plurality of volatile memories VM and the NVM controller BA22.

The above-described example embodiments may be examples, not limited thereto. Nonvolatile memory modules according to example embodiments of the inventive concept may be variously modified or changed.

Figure 36:
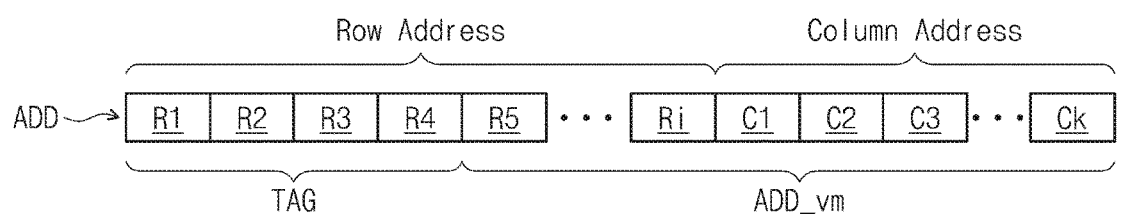
FIG. 36 is a drawing for describing, in detail, a tag of FIG. 9.

FIG. 36 is a drawing for describing, in detail, a tag of FIG. 9. Referring to FIGS. 1, 2, and 36, an address ADD provided from the processor 101 may include a row address and a column address. The row address may include a plurality of row bits R1 to Ri, and the column address may include a plurality of column bits C1 to Ck. In example embodiments, at least one among the plurality of cache lines may be selected according to the plurality of row bits R1 to Ri and the plurality of column bits C1 to Ck.

In example embodiments, the tag TAG may include at least a part of the plurality of row bits R1 to Ri. For example, the tag TAG may include first to fourth row bits R1 to R4. In this case, the remaining row bits R5 to Ri and the column bits C1 to Ck may constitute an address ADD_vm of the volatile memory 121. That is, at least one among the plurality of cache lines in the volatile memory 121 may be selected according to the remaining row bits R5 to Ri and column bits C1 to Ck. In example embodiments, the tag TAG may include a part of uppermost bits of the plurality of row bits in the row address.

In example embodiments, a configuration of an address according to example embodiments of the inventive concept may not be limited to the address ADD illustrated in FIG. 36. For example, the address ADD from the processor 101 may further include a chip address, a bank address, a row address, or a column address. Alternatively, the address ADD from the processor 101 may be changed to have various address formats.

Furthermore, a configuration of the tag TAG according to example embodiments of the inventive concept may not be limited to the tag TAG illustrated in FIG. 36. The tag TAG may include at least a part of the address ADD. In this case, at least a part of the address ADD may include a part of the plurality of row bits R1 to Ri, a part of the plurality of column bits C1 to Ck, or a combination thereof.

Furthermore, address bits included in tag TAG according to example embodiments of the inventive concept may have given bit place values. For example, the tag TAG may include n uppermost bits of the address ADD. In this case, the n uppermost bits may be given bit place values. Furthermore, address bits included in the tag TAG may be changed by the module controller 110, the tag control circuit TC, or the NVM controller 122.

Figure 37:
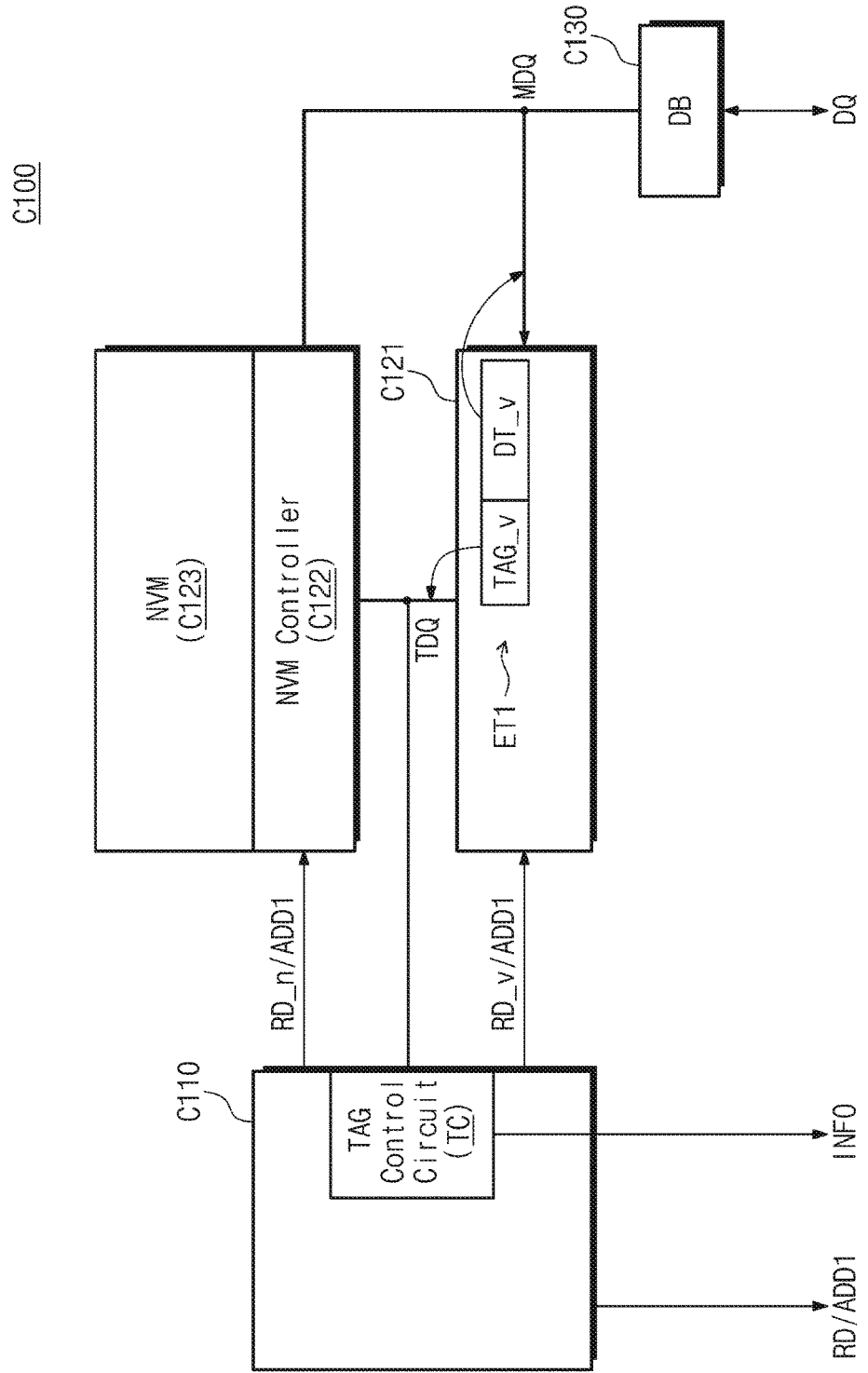
FIG. 37 is a drawing for describing a tag managing method of the nonvolatile memory module of FIG. 2.

FIG. 37 is a drawing for describing a tag managing method of the nonvolatile memory module of FIG. 2. In example embodiments, a nonvolatile memory module C100 of FIG. 37 may be a device or module that is substantially the same as or similar to the nonvolatile memory module 100 of FIGS. 1 and 2. For descriptive convenience, a detailed description about elements, which are unnecessary to describe the tag managing method, and the above-described elements is omitted. Furthermore, for descriptive convenience, it is assumed that the nonvolatile memory module C100 receives a module read command and first address (RD/ADD1) from the processor 101 and operates in response to the received signal. In addition, at least a part of the first address ADD1 is assumed as corresponding to a first entry ET1 of a volatile memory C121. That is, the volatile memory C121 may select or activate the first entry ET1 in response to the first address ADD1.

Referring to FIGS. 1 and 37, the nonvolatile memory module C100 may include a module controller C110, the volatile memory C121, an NVM controller C122, a nonvolatile memory C123, and a data buffer C130. Because the module controller C110, the volatile memory C121, the NVM controller C122, the nonvolatile memory C123, and the data buffer C130 are above described, a detailed description thereof is thus omitted.

The module controller C110 may receive a module read command and first address (RD/ADD1) from the processor 101 and may provide a VM read command and first address (RD_v/ADD1) to the volatile memory C121 and an NVM read command and first address (RD_n/ADD1) to the NVM controller A121 in response to the received signal.

On the basis of the VM read command and first address (RD_v/ADD1), the volatile memory C121 may select the first entry ET1 and may output data DT_v and a tag TAG_v that are stored in the first entry ET1. In this case, the tag TAG_v may be output through the tag data line TDQ that is shared by the volatile memory C121, the NVM controller C122, and the module controller C110, and the data DT_v may be output through the memory data line MDQ that is shared by the volatile memory C121 and the NVM controller C122.

In example embodiments, the module controller C110 may include the tag control circuit TC. The tag control circuit TC may be connected with the tag data line TDQ. The tag control circuit TC may receive a tag TAG from the volatile memory C121 through the tag data line TDQ and may compare the received tag TAG with the address ADD. The tag control circuit TC may output cache information INFO about a cache hit H or a cache miss M to the processor 101 based on the comparison result.

For example, as described above, the tag TAG may include at least a part of an address corresponding to the tag TAG. The tag control circuit TC may compare an address (e.g., the first address ADD1) received from the processor 101 and the tag TAG received from the volatile memory C121. When at least a part of the first address ADD1 is the same as the tag TAG, the control circuit TC may output the cache information INFO about the cache hit H. In contrast, when at least a part of the first address ADD1 is not the same as the tag TAG, the control circuit TC may output the cache information INFO about the cache miss M.

In example embodiments, the NVM controller C122 may receive the tag TAG through the tag data line TDQ and may perform an operation, such as a read caching operation or a data flush operation, based on the received tag TAG.

Figure 38:
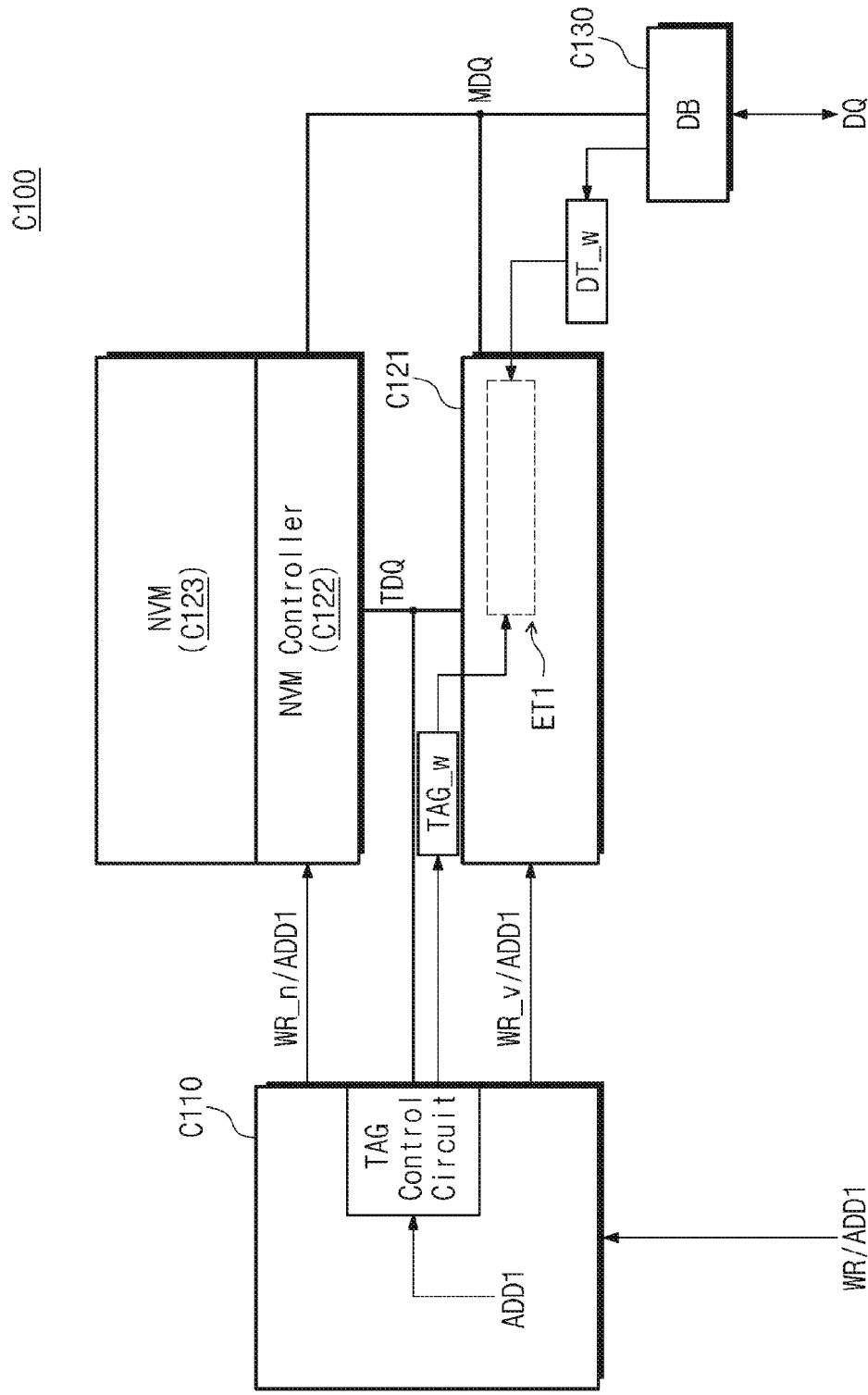
FIG. 38 is a drawing for describing a tag managing method of the nonvolatile memory module of FIG. 2.

FIG. 38 is a drawing for describing a tag managing method of the nonvolatile memory module of FIG. 2. Referring to FIGS. 1 and 38, the nonvolatile memory module C100 may include the module controller C110, the volatile memory C121, the NVM controller C122, the nonvolatile memory C123, and the data buffer C130. For descriptive convenience, a detailed description about above-described components may be omitted.

The module controller C110 may receive a module write command and first address (WR/ADD1) from the processor 101 and may provide a VM write command and first address (WR_v/ADD1) to the volatile memory C121 and an NVM write command and first address (WR_n/ADD1) to the NVM controller C121 in response to the received signal.

In example embodiments, the module controller C110 may provide the volatile memory 121 with a VM read command and first address (RD_v/ADD1) in response to the module write command and first address (WR/ADD1). For ease of illustration, a configuration that is the same as that described above is omitted.

The volatile memory C121 may select the first entry ET1 in response to the VM write command and first address (WR_v/ADD1). In example embodiments, the first entry ET1 may indicate a storage area of the volatile memory C121 corresponding to at least a part of the first address ADD1.

The data buffer C130 may provide write data DT_v from the processor 101 to the volatile memory C121 and the NVM controller C122 through the memory data line MDQ. The volatile memory C121 may write the write data DT_w received through the memory data line MDQ in the first entry ET1 that is selected by at least a part of the first address ADD1. In this case, the volatile memory C121 may write the write tag TAG_w received through the tag data line TDQ in the first entry ET1 together with the write data DT_w.

In example embodiments, the write tag TAG_w may be a tag that is generated by the tag control circuit TC of the module controller C110. For example, the tag control circuit TC may select at least a part of first address ADD1 received from the processor 101 as the write tag TAG_w. That is, the write tag TAG_w may correspond to write data DT_w to be written in the volatile memory C121.

The tag control circuit TC may provide the write tag TAG_w to the volatile memory C121 by driving a voltage of the tag data line TDQ based on the selected write tag TAG_w.

As described above, during a write operation, the nonvolatile memory module C100 may write the write tag TAG_w and the write data DT_w together in the same entry of the plurality of entries in the volatile memory C121 so that an operation of determining whether a cache hit or a cache miss occurs is performed normally.

Figure 39:
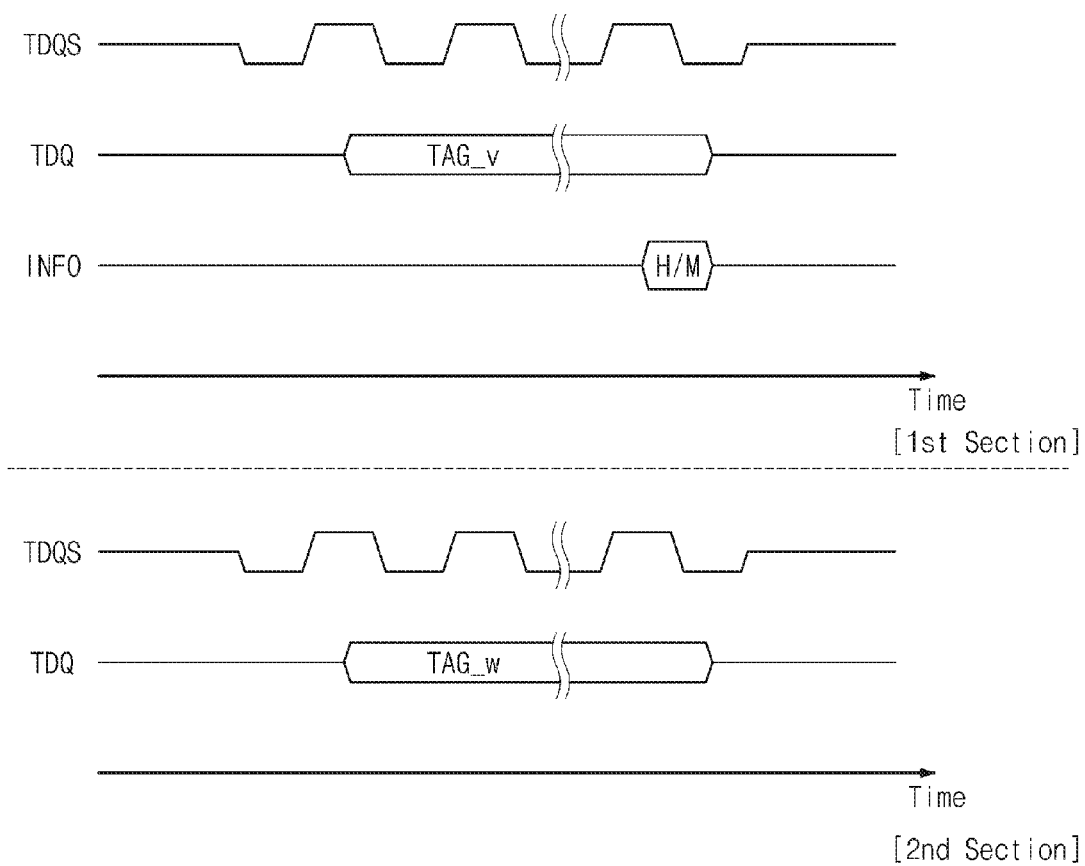
FIG. 39 is a timing diagram for describing a tag sending method of the nonvolatile memory modules of FIGS. 37 and 38.

FIG. 39 is a timing diagram for describing a tag sending method of the nonvolatile memory modules of FIGS. 37 and 38. Referring to FIGS. 37 to 39, an X-axis of FIG. 39 represents a time.

As illustrated in a first section of FIG. 39, a tag TAG_v stored in the volatile memory C121 may be output from the volatile memory C121 through the tag data line TDQ. In this case, the tag TAG_v may be output in synchronization with a tag data strobe line TDQS. A signal of the tag data strobe line TDQS may be driven by the tag control circuit TC or the volatile memory C121.

Likewise, as illustrated in a second section of FIG. 39, a write tag TAG_w may be output through the tag data line TDQ. In this case, the write tag TAG_w may be output in synchronization with the tag data strobe line TDQS. A signal of the tag data strobe line TDQS may be driven by the tag control circuit TC or the volatile memory C121.

As described above, the tag TAG_v may be sent and received through the tag data line TDQ in synchronization with a signal of the tag data strobe line TDQS. In example embodiments, the tag data strobe line TDQS may be a signal line that is different from a data strobe line DQS between the processor 101 and the nonvolatile memory module C100 or a memory data strobe line MDQS in the nonvolatile memory module C100. The tag data strobe line TDQS may be a signal line of which the frequency is the same as that of the data strobe line DQS between the processor 101 and the nonvolatile memory module C100 or that of the memory data strobe line MDQS in the nonvolatile memory module C100.

Figure 40:
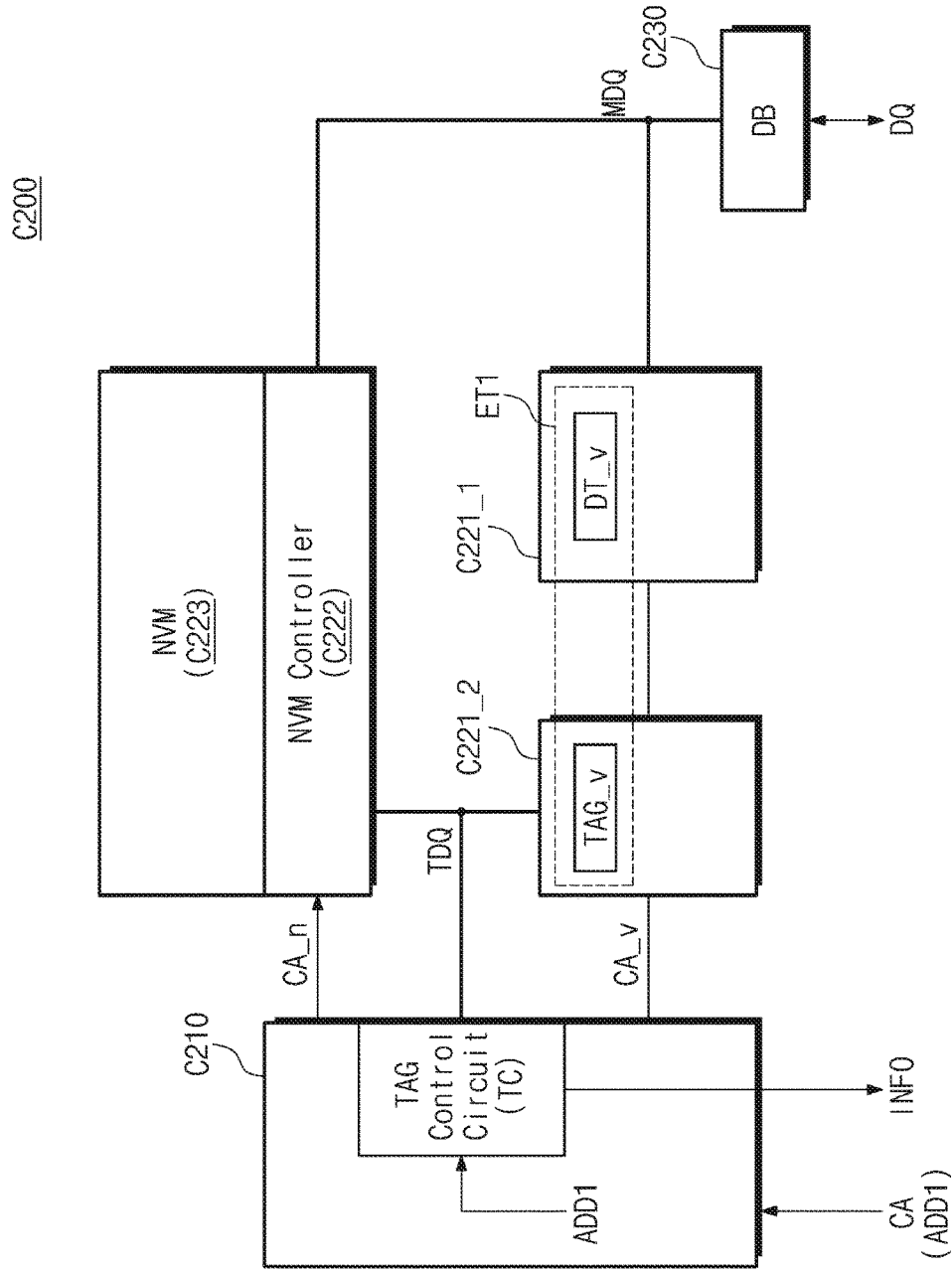
FIG. 40 is a block diagram illustrating a nonvolatile memory module of FIG. 2, according to example embodiments of the inventive concept.

FIG. 40 is a block diagram illustrating a nonvolatile memory module of FIG. 2, according to example embodiments of the inventive concept. Referring to FIGS. 1 and 40, a nonvolatile memory module C200 may include a module controller C210, first and second volatile memories C221_1 and C221_2, an NVM controller C222, a nonvolatile memory C223, and a data buffer C230. For descriptive convenience, a detailed description about above-described components may be omitted.

The nonvolatile memory module C200 of FIG. 40 may further include the second volatile memory C221_2 as a tag dedicated volatile memory. As the tag dedicated volatile memory, the second volatile memory C221_2 may be configured to store a tag TAG_v about data DT_v stored in the same entry. For example, the first and second volatile memories C221_1 and C221_2 may select a first entry ET1 in response to a VM command/address CA_v from the module controller C210. The first entry ET1 may include a part of each of the first and second volatile memories C221_1 and C221_2.

The first entry ET1 of the first volatile memory C221_1 may include the data DT_v. The first volatile memory C221_1 may send and receive the data DT_v through the memory data line MDQ. The first entry ET1 of the second volatile memory C221_2 may include the tag TAG_v. The second volatile memory C221_2 may send and receive the tag TAG_v through the tag data line TDQ.

In example embodiments, each of the first and second volatile memories C221_1 and C221_2 may be implemented with a separate die, a separate chip, or a separate package.

That is, the nonvolatile memory module C200 may include a tag dedicated volatile memory for storing the tag TAG, and the tag dedicated volatile memory may be implemented with a separate chip independently of a volatile memory for storing data. In this case, the tag dedicated volatile memory may operate in response to the VM command/address CA_v from the module controller MC like other volatile memories.

Figure 41:
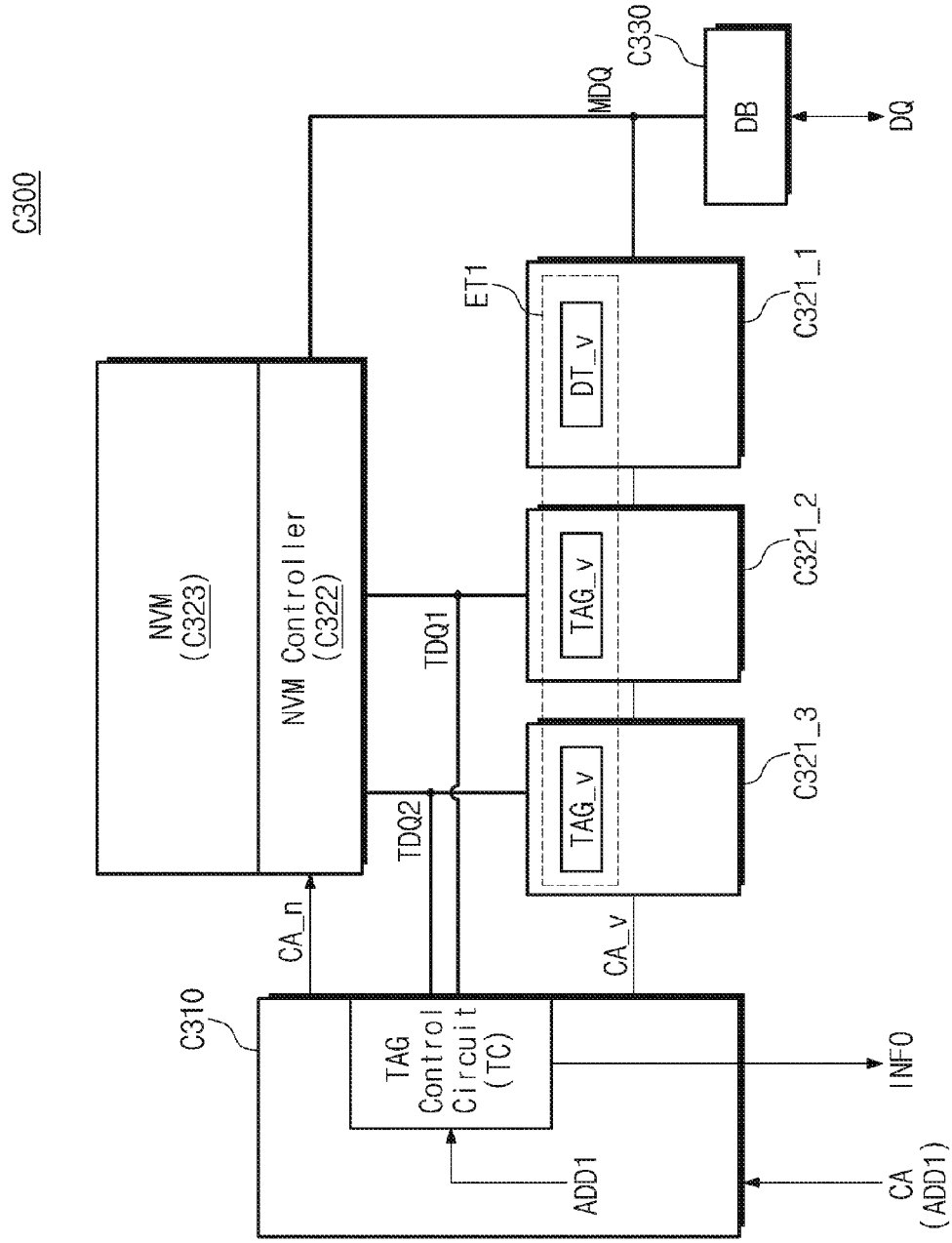
FIG. 41 is a block diagram illustrating a nonvolatile memory module of FIG. 2, according to example embodiments of the inventive concept.

FIG. 41 is a block diagram illustrating a nonvolatile memory module of FIG. 2, according to example embodiments of the inventive concept. Referring to FIGS. 1 and 41, a nonvolatile memory module C300 may include a module controller C310, first to third volatile memories C321_1 to C321_3, an NVM controller C322, a nonvolatile memory C323, and a data buffer C330. For descriptive convenience, a detailed description about above-described components may be omitted.

Unlike the nonvolatile memory module C200 of FIG. 40, the nonvolatile memory module C300 of FIG. 41 may further include the third volatile memory C221_3 as a tag dedicated volatile memory. That is, the nonvolatile memory module C300 may include at least two tag dedicated volatile memories.

As the tag dedicated volatile memory, each of the second and third volatile memories C321_2 and C321_3 may be configured to store a tag TAG_v corresponding data DT_v stored in the first volatile memory C321_1. For example, each of the first to third volatile memories C321_1 and C321_3 may operate in response to a VM command/address CA_v from the module controller C310. On the basis of the VM command/address CA_v from the module controller C310, each of the first to third volatile memories C321_1 and C321_3 may select a first entry ET1 corresponding to at least a part of a first address ADD1 and may access the first entry ET1 thus selected.

In example embodiments, the first entry ET1 may include the data DT_v of the first volatile memory C321_1, the tag TAG_v of the second volatile memory C321_2, and the tag TAG_v of the third volatile memory C321_3. The tag TAG_v of the second volatile memory C321_2 may be provided to the NVM controller C322 and the module controller C310 through a first tag data line TDQ1, and the tag TAG_v of the third volatile memory C321_3 may be provided to the NVM controller C322 and the module controller C310 through a second tag data line TDQ 2.

Alternatively, the second volatile memory C321_2 may receive the write tag TAG_w (refer to FIG. 38) through the first tag data line TDQ1 and may write the write tag TAG_w in the first entry ET1; the third volatile memory C321_3 may receive the write tag TAG_w (refer to FIG. 38) through the second tag data line TDQ2 and may write the write tag TAG_w in the first entry ET1. That is, the nonvolatile memory module C300 may include at least two tag dedicated volatile memories. Each of the at least two tag dedicated volatile memories may be implemented with a separate die, a separate chip, or a separate package.

In example embodiments, the tag dedicated volatile memory may not be limited to the second and third volatile memories C321 2 and C321 3. The nonvolatile memory module C300 may include at least two or more tag dedicated volatile memories, each of which is implemented with a separate die, a separate chip, or a separate package.

In example embodiments, a value of the tag TAG_v written in the first entry ET1 of the second volatile memory C321_2 may be the same as that of the tag TAG_v written in the first entry ET1 of the third volatile memory C321_3. That is, even though one among the second and third volatile memories C321_2 and C321_3 as tag dedicated volatile memories does not operate normally due to a factor (i.e., at a chip-kill situation), the other that operates normally may send and receive the tag TAG, thereby making it possible for the nonvolatile memory module C300 to operate normally.

Figure 42:
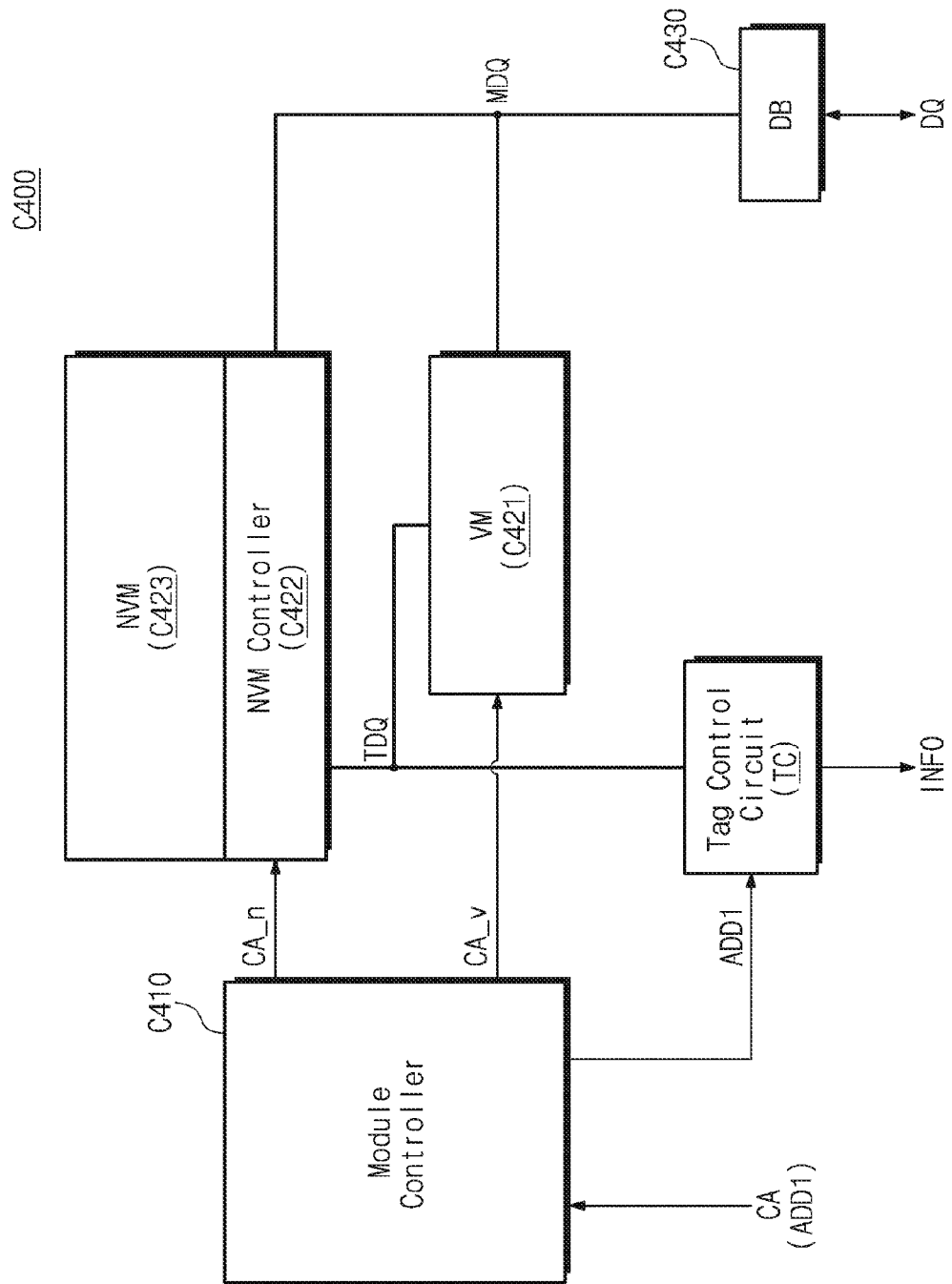
FIG. 42 is a block diagram illustrating the nonvolatile memory module of FIG. 2, according to example embodiments of the inventive concept.

FIG. 42 is a block diagram illustrating the nonvolatile memory module of FIG. 2, according to example embodiments of the inventive concept. Referring to FIG. 42, a nonvolatile memory module C400 may include a module controller C410, a volatile memory C421, an NVM controller C422, a nonvolatile memory C423, a data buffer C430, and the tag control circuit TC. For descriptive convenience, a detailed description about above-described components may be omitted.

The nonvolatile memory module C400 of FIG. 42 may include the tag control circuit TC separately. As described above, the tag control circuit TC may receive a tag TAG through the tag data line TDQ or may send the tag TAG to the volatile memory C421 through the tag data line TDQ. For example, the tag control circuit TC may be disposed outside the module controller C410 and may generate the write tag TAG_w based on a first address ADD1 that is received from the module controller C410 (i.e., an address provided from the processor 101). Alternatively, the tag control circuit TC may compare the tag TAG_v received through the tag data line TDQ and the address ADD1 and may output cache information INFO about a cache hit or cache miss based on the comparison result.

In example embodiments, a configuration of the nonvolatile memory module according to example embodiments may not be limited to the above-described example embodiments. For example, the nonvolatile memory module according to example embodiments may include at least one tag dedicated volatile memory, which is configured to share the tag data line TDQ with a separate tag control circuit.

Figure 43:
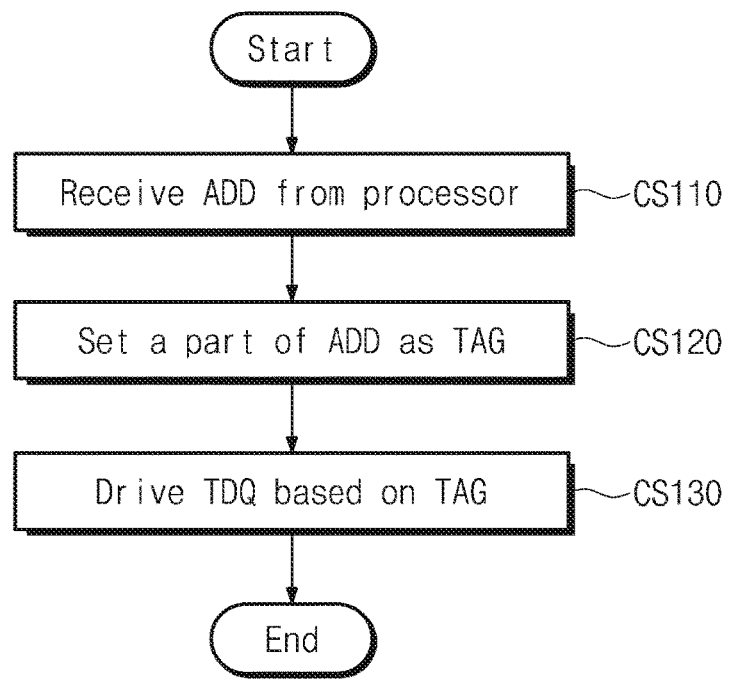
FIG. 43 is a flowchart illustrating an operation method of the nonvolatile memory module of FIG. 2.

FIG. 43 is a flowchart illustrating an operation method of the nonvolatile memory module of FIG. 2. In example embodiments, operations of FIG. 43 may be performed by the tag control circuit TC of the nonvolatile memory module. As described above, the tag control circuit TC may be included in a module controller, or the tag control circuit TC may be disposed as a separate chip outside the module controller or may be included in an NVM controller. For descriptive convenience, it is assumed that the tag control circuit TC is included in the module controller. However, example embodiments of the inventive concept may not be limited thereto.

Referring to FIGS. 2, 37, and 43, in step CS110, the nonvolatile memory module C110 may receive an address ADD from the processor 101. In example embodiments, the module controller C110 may receive a module command/address CA from an external device. The module command/address CA may include an address ADD corresponding to data or an area to be accessed.

In step CS120, the module controller C110 may set a part of the received address ADD as a tag TAG. For example, as described with reference to FIG. 36, the address ADD may include a plurality of bits R1 to Ri and C1 to Ck, and a part of the plurality of bits may be set as the tag TAG. That is, the tag TAG may include a part of the address ADD.

In example embodiments, as described above, the part of the address ADD set as the tag TAG may have given bit place values. Alternatively, the set part of the address ADD may be changed by the tag control circuit TC.

In step CS130, the module controller C110 may drive a voltage of the tag data line TDQ based on the set tag TAG.

In example embodiments, the volatile memory C121 may receive the tag TAG by sensing a voltage of the tag data line TDQ and may write the received tag in an entry corresponding to at least a part of the address ADD.

Figure 44:
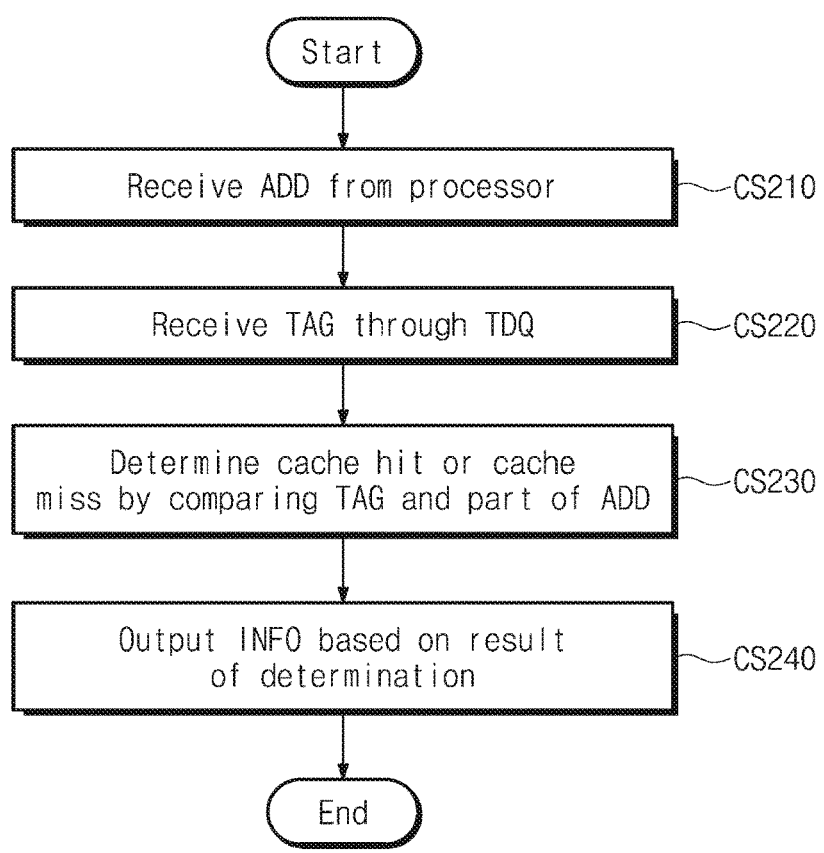
FIG. 44 is a flowchart illustrating an operation method of the nonvolatile memory module of FIG. 2, according to example embodiments of the inventive concept.

FIG. 44 is a flowchart illustrating an operation method of the nonvolatile memory module of FIG. 2, according to example embodiments of the inventive concept. In example embodiments, operations of FIG. 44 may be performed by the tag control circuit TC of the nonvolatile memory module. As described above, the tag control circuit TC may be included in a module controller, or the tag control circuit TC may be disposed as a separate chip outside the module controller or may be included in an NVM controller. For descriptive convenience, it is assumed that the tag control circuit TC is included in the module controller. However, example embodiments of the inventive concept may not be limited thereto.

Referring to FIGS. 2, 37, and 44, in step CS210, the module controller C110 may receive an address ADD from the processor 101.

In step CS220, the module controller C110 may receive a tag TAG through the tag data line TDQ. For example, the module controller C110 may receive the tag TAG through the tag data line TDQ from a volatile memory or a tag dedicated volatile memory.

In step CS230, the module controller C110 may compare a part of the received address ADD and the tag TAG and may determine whether a cache miss occurs, based on the comparison result. For example, as described above, in the case in which the part of the received address ADD is the same as the tag TAG, the module controller C110 may determine the case as a cache hit. In the case in which the part of the received address ADD is not the same as the tag TAG, the module controller C110 may determine the case as a cache miss.

In step CS240, the module controller C110 may output cache information INFO based on the determination result. For example, the module controller C110 may output information about the cache miss or the cache hit as the cache information INFO, based on the determination result.

Figure 45:
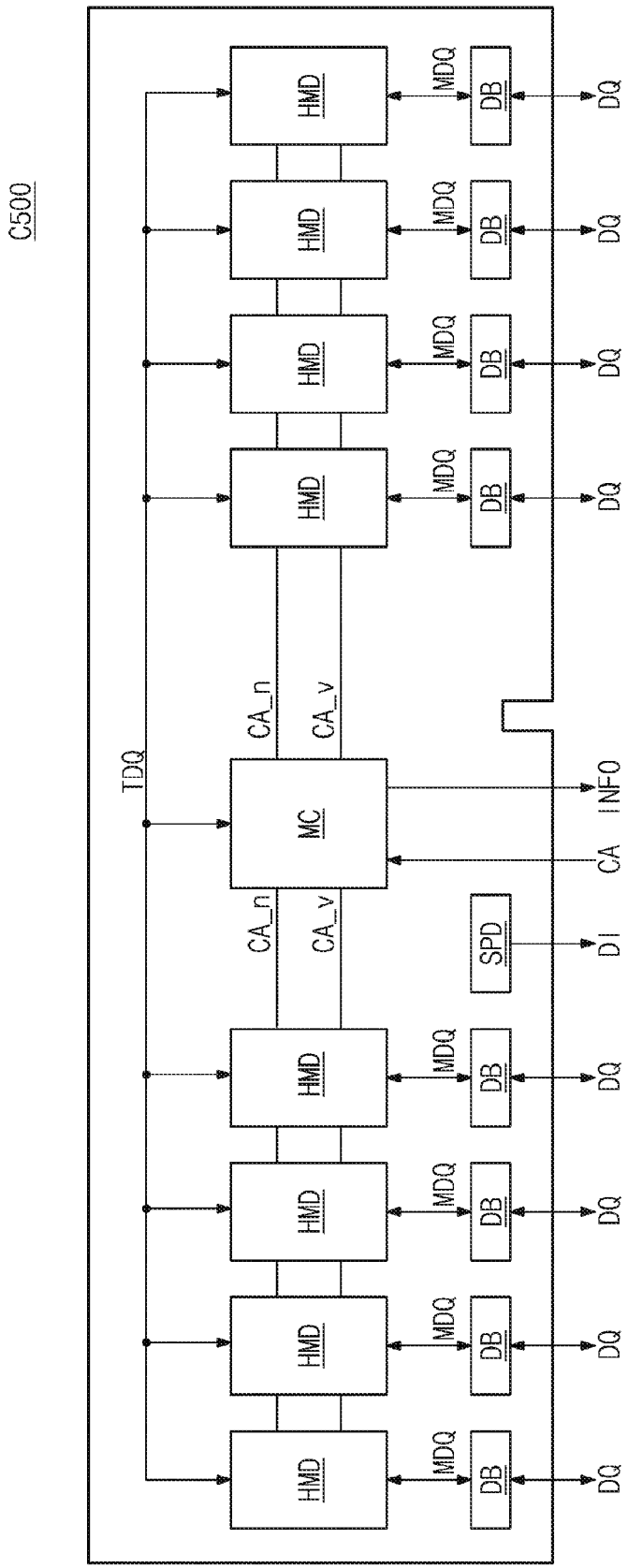
FIG. 45 is a block diagram illustrating the nonvolatile memory module of FIG. 2, according to example embodiments of the inventive concept.

FIG. 45 is a block diagram illustrating the nonvolatile memory module of FIG. 2, according to example embodiments of the inventive concept. Referring to FIG. 45, a nonvolatile memory module C500 may include the module controller MC, the plurality of heterogeneous memory memories HMD, the plurality of data buffers DB, and the SPD. For descriptive convenience, a detailed description about above-described components may be omitted. In example embodiments, the memory module C500 illustrated in FIG. 45 may have an LRDIMM structure.

The module controller MC may receive a module command/address CA from the processor 101 and may provide each of the heterogeneous memory devices HDM with a VM command/address CA_v and an NVM command/address CA_n in response to the received signal.

Each of the plurality of heterogeneous memory devices HMD may be a heterogeneous memory device that includes volatile memories, NVM controllers, and nonvolatile memories described with reference to FIGS. 36 to 42. For example, the plurality of heterogeneous memory devices HMD may be connected with the plurality of data buffers DB through the memory data lines MDQ, respectively, and may share the tag data line TDQ. That is, each of the plurality of heterogeneous memory devices HMD may store a tag or data and may send and receive the tag or data through the tag data line TDQ and the memory data line MDQ under control of the module controller MC.

In example embodiments, each of the plurality of heterogeneous memory devices HMD may operate according to an operation method described with reference to FIGS. 1 to 44.

Figure 46:
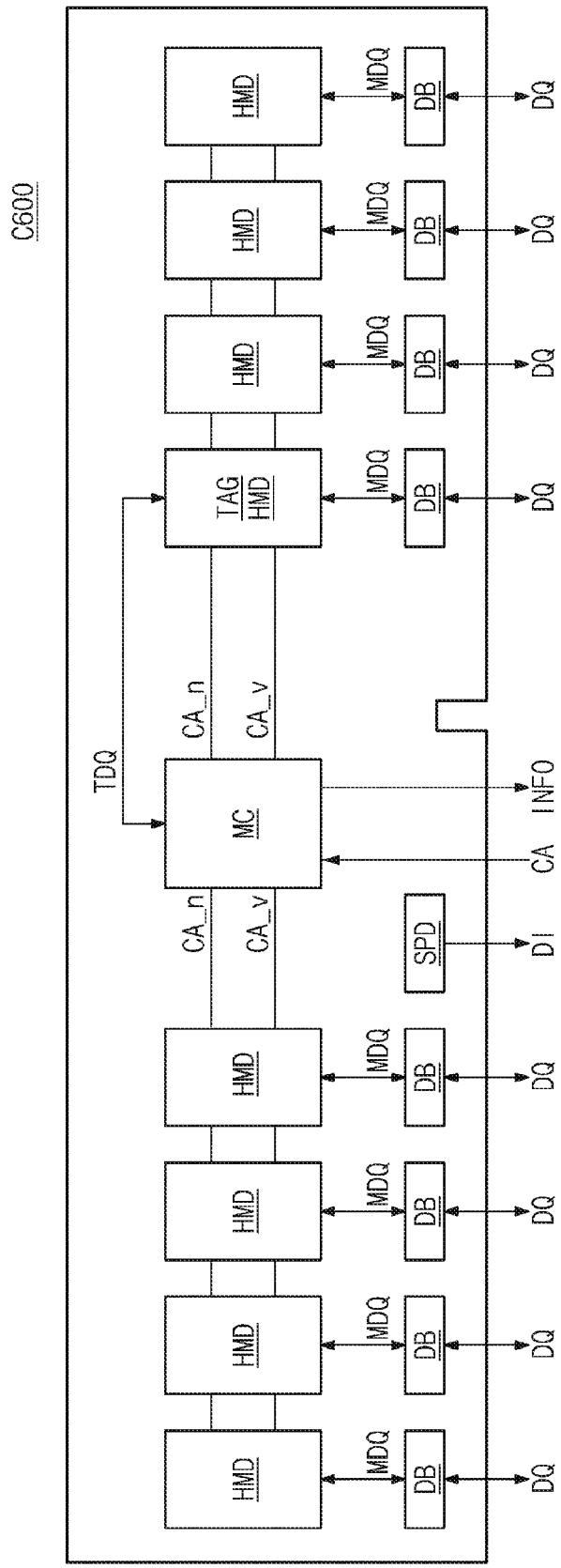
FIG. 46 is a block diagram illustrating a nonvolatile memory module of FIG. 2, according to example embodiments of the inventive concept.

FIG. 46 is a block diagram illustrating a nonvolatile memory module of FIG. 2, according to example embodiments of the inventive concept. Referring to FIG. 46, a nonvolatile memory module C600 may include the module controller MC, the plurality of heterogeneous memory devices HMD, a tag dedicated heterogeneous memory device TAG HMD, the plurality of data buffers DB, and the SPD. For descriptive convenience, a detailed description about above-described components may be omitted. In example embodiments, the nonvolatile memory module C600 of FIG. 46 may have an LRDIMM structure.

Unlike the nonvolatile memory module C500 of FIG. 45, the nonvolatile memory module C600 of FIG. 46 may include the tag dedicated memory device TAG HMD. Each of the plurality of heterogeneous memory devices HMD may be configured to store data DT_v and may not be connected with the tag data line TDQ. The tag dedicated memory device TAG HMD may be volatile memories, NVM controllers, and nonvolatile memories described with reference to FIGS. 37 to 44. That is, the tag dedicated memory device TAG HMD may be configured to store and output a corresponding tag TAG based on a VM command/address CA_v of the module controller MC. In this case, the tag dedicated memory device TAG HMD may be configured to share the tag data line TDQ with the module controller MC.

Figure 47:
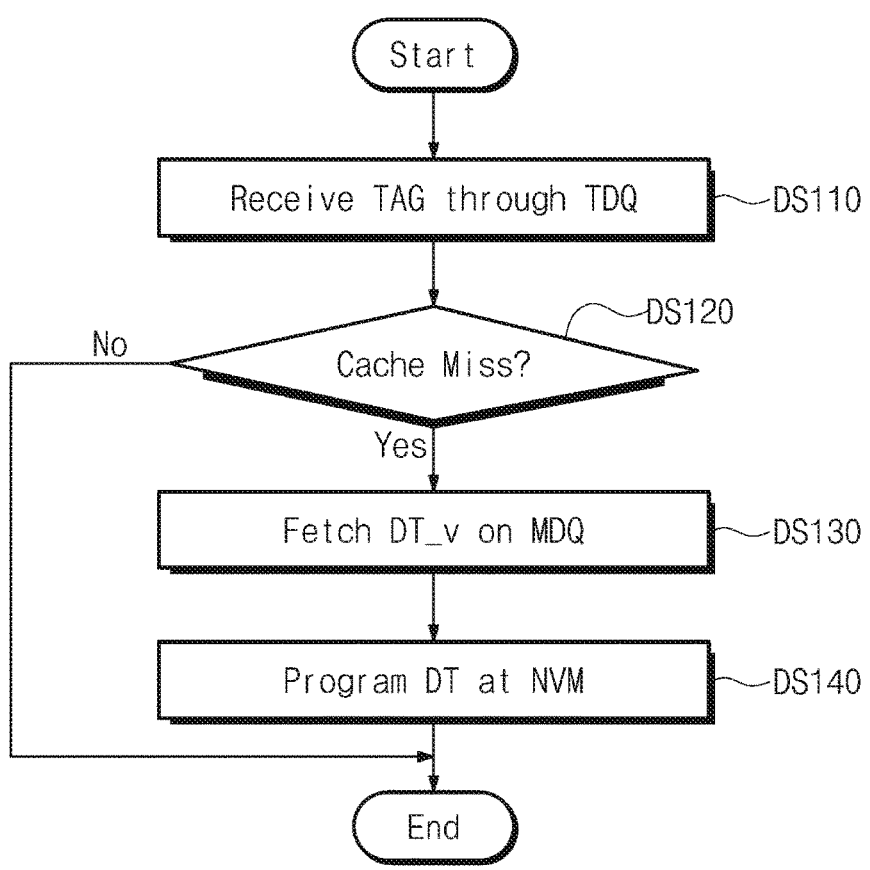
FIG. 47 is a flowchart illustrating an operation of the NVM controller of the nonvolatile memory module of FIG. 2.

FIG. 47 is a flowchart illustrating an operation of the NVM controller of the nonvolatile memory module of FIG. 2. For descriptive convenience, a detailed description about above-described components and an operation method is omitted. In example embodiments, the operation method according to the flowchart of FIG. 47 shows a flush operation that will be performed during a write operation about the nonvolatile memory module 100.

Referring to FIGS. 2 and 47, in step DS110, the NVM controller 122 may output a tag TAG through the tag data line TDQ. For example, as described with reference to FIGS. 3 and 4, the module controller 110 may receive a module write command and first address (WR/ADD1) from the processor 101 and may send a VM read command and first address (RD_v/ADD1) in response to the received signal. The volatile memory 121 may output data DT_v and a tag TAG_v, which are stored in an entry corresponding to the first address ADD1 (or a part of the first address ADD1), in response to the VM read command and first address (RD_v/ADD1). Because the tag data line TDQ is shared by the volatile memory 121 and the NVM controller 122, the NVM controller 122 may receive the tag TAG from the volatile memory 121 through the tag data line TDQ.

In step DS120, the NVM controller 122 may determine whether a cache hit or a cache miss occurs, based on the received tag TAG. For example, as described above, the tag TAG may include at least a part of the address ADD corresponding to data stored in the volatile memory 121. That is, the NVM controller A122 may compare the address ADD received from the module controller 110 and the tag TAG received through the tag data line TDQ and may determine whether a cache miss or a cache hit occurs, based on the comparison result.

When the determination result indicates the cache hit, the NVM controller 122 may not perform an operation separately.

When the determination result indicates the cache miss, in step DS130, the NVM controller 122 may fetch data DT_v on the memory data line MDQ. For example, as described above, when receiving the VM read command and first address (RD_v/ADD1), the volatile memory 121 may control a voltage of the memory data line MDQ based on the data DT_v. Because the memory data line MDQ is shared by the volatile memory 121 and the NVM controller 122, the NVM controller 122 may receive fetch the data DT_v on the memory data line MDQ.

In step DS140, the NVM controller 122 may program the fetched data DT_v in the nonvolatile memory 123. In example embodiments, the NVM controller 122 may store the fetched data DT_v in a separate buffer circuit, and when the size of the fetched data is greater than or equal to a size, the NVM controller 122 may program the fetched data in the nonvolatile memory 123.

In example embodiments, in the operation method illustrated in FIG. 47, operations of steps DS110 to DS130 may be performed in parallel. For example, the NVM controller 122 may simultaneously receive the tag TAG and the data DT_v through the tag data line TDQ and the memory data line MDQ, respectively, and may determine whether a cache hit or a cache miss occurs, based on the received tag TAG. When the determination result indicates the cache miss, the NVM con 122 may program the received data DT_v in the nonvolatile memory 123. When the determination result indicates the cache hit, the NVM con 122 may invalidate the received data DT_v or may not perform a separate operation about the received data DT_v.

Figure 48:
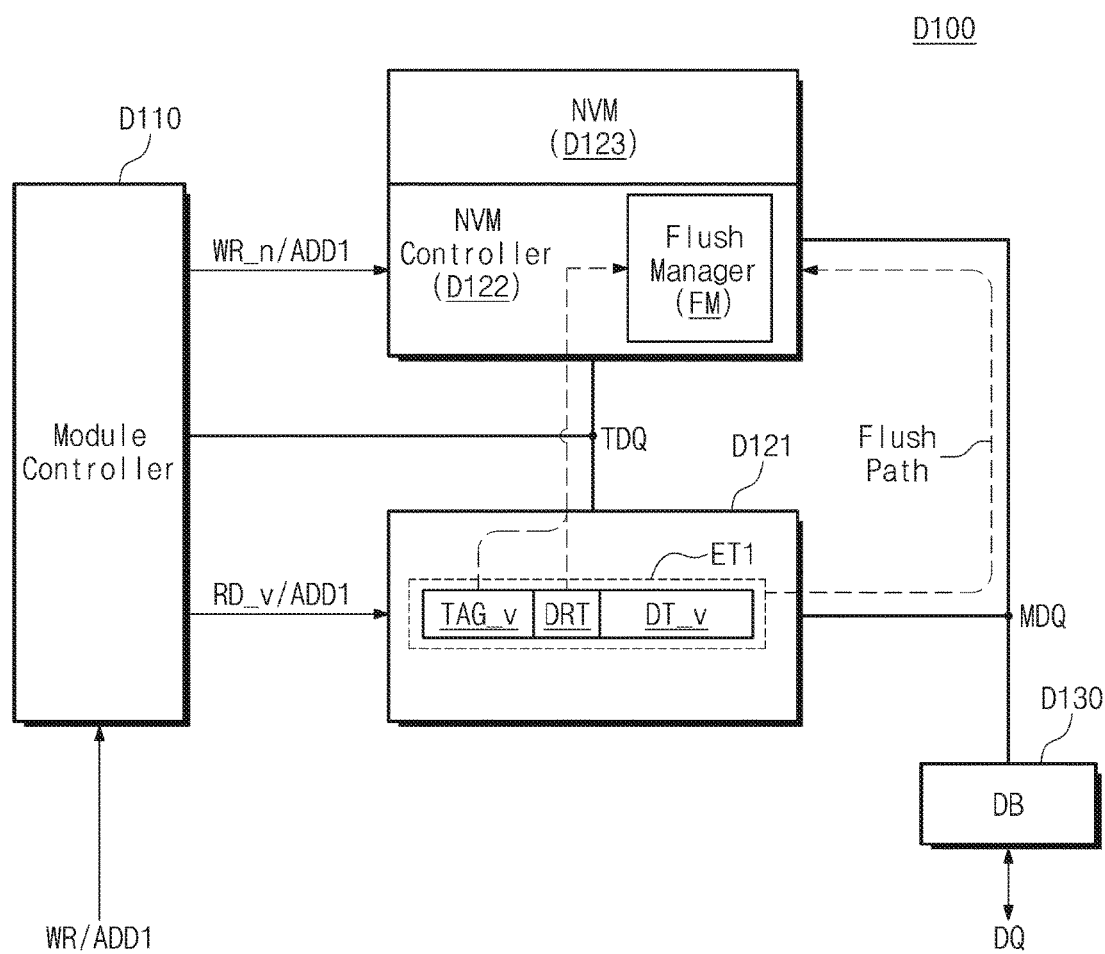
FIG. 48 is a block diagram for describing, in detail, an operation method illustrated in FIG. 47.

FIG. 48 is a block diagram for describing, in detail, an operation method illustrated in FIG. 47. Referring to FIGS. 1, 47, and 48, a nonvolatile memory module D100 may include a module controller D110, a volatile memory D121, an NVM controller D122, a nonvolatile memory D123, and a data buffer D130. In example embodiments, the nonvolatile memory module D100 of FIG. 48 may be a device or module that is substantially the same as or similar to the nonvolatile memory module 100 of FIGS. 1 and 2. For descriptive convenience, at least a part of a first address ADD1 provided from the processor 101 is assumed as corresponding to a first entry ET1 of the volatile memory D121. For descriptive convenience, a detailed description about above-described components may be omitted. In example embodiments, a dotted line illustrated in FIG. 48 indicates a flow of a tag TAG_v, dirty information DRT, or data DT_v.

The module controller D110 may receive a module write command and first address (WR/ADD1) from the processor 101 and may provide a VM read command and first address (RD_v/ADD1) to the volatile memory D121 and an NVM write command and first address (WR_n/ADD1) to the NVM controller C121 in response to the received signal.

On the basis of the VM read command and first address (RD_v/ADD1), the volatile memory D121 may output the data DT_v, the tag TAG_v, and the dirty information DRT that are stored in the first entry ET1. For example, the volatile memory D121 may output the data DT_v through the memory data line MDQ and the tag TAG_v and the dirty information DRT through the tag data line TDQ, respectively.

Because the NVM controller D122 shares the memory data line MDQ and tag data line TDQ with the volatile memory D121, the NVM controller D122 may receive the data DT_v through the memory data line MDQ and the tag TAG_v and the dirty information DRT through the tag data line TDQ, respectively.

The NVM controller D122 may include a flush manager FM. The flush manager FM may manage or control the flush operation about data received from the volatile memory D121. For example, the flush manager FM may determine whether a cache miss or a cache hit occurs, based on the tag TAG_v received through the tag data line TDQ and the first address ADD received from the module controller D110. When the determination result indicates the cache miss, the flush manager FM may program the received data DT_v in the nonvolatile memory D123. Alternatively, the flush manager FM may manage the received data DT_v in a separate buffer circuit, and when the size of data to be flushed is greater than or equal to a size, the flush manager FM may program the data of the separate buffer circuit in the nonvolatile memory D123.

In example embodiments, the memory data line MDQ that is shared between the volatile memory D121 and the NVM controller D122 may be a flush path.

In example embodiments, the data buffer may block the data DT_v such that the data DT_v on the memory data line MDQ is not sent to the processor 101. That is, the processor 101 may not recognize a data transaction between the volatile memory D121 and the NVM controller D122.

Figure 49:
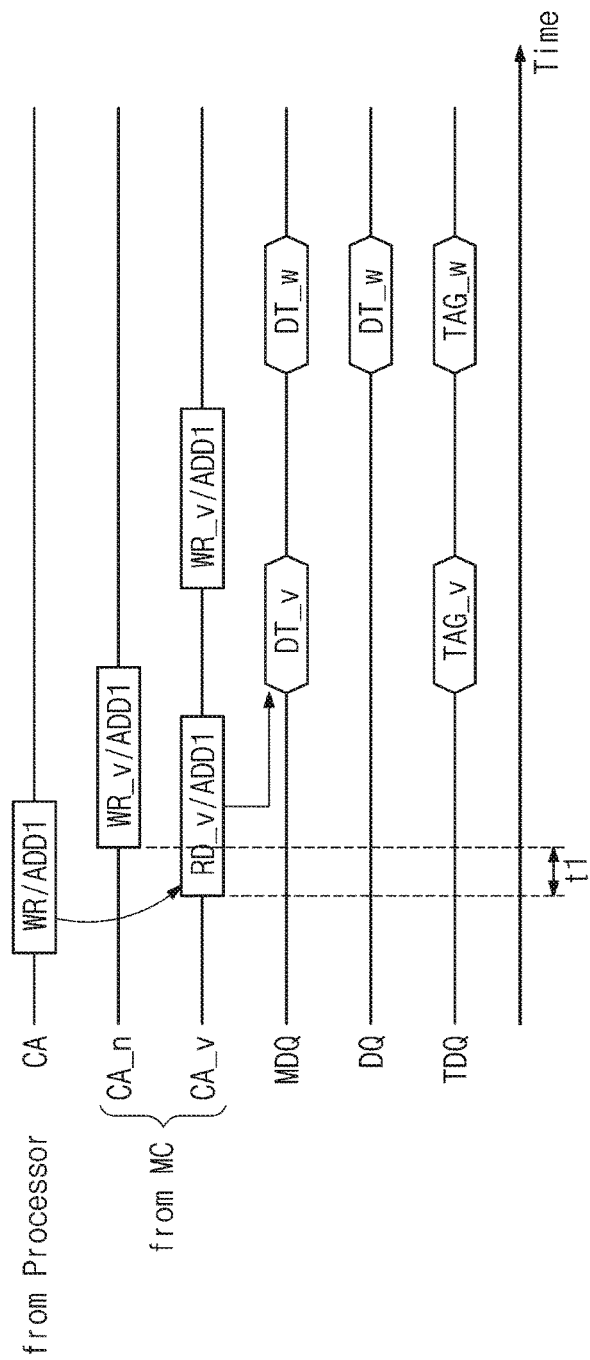
FIG. 49 is a timing diagram for describing, in detail, the operation method of FIGS. 47 and 48.

FIG. 49 is a timing diagram for describing, in detail, the operation method of FIGS. 47 and 48. For descriptive convenience, a detailed description about above-described elements is omitted. Referring to FIGS. 1 and 48, the module controller D110 may receive a module write command and first address (WR/ADD1) from the processor 101.

The module controller D110 may provide an NVM write command and first address (WR_n/ADD1) to the NVM controller D122 and a VM read command and first address (RD_v/ADD1) to the volatile memory D122 in response to the module write command and first address (WR/ADD1). In this case, a point in time when the NVM write command and first address (WR_v/ADD1) are transmitted may be different from a point in time when the VM read command and first address (RD_v/ADD1) are transmitted. A difference between the time when the NVM write command and first address (WR_v/ADD1) are transmitted and the NVM write command and first address (WR_v/ADD1) are transmitted may be denoted as t1.

For example, because an operation characteristic of the volatile memory D121 is different from that of the nonvolatile memory D123 or the NVM controller D122 controlling the nonvolatile memory D123, a time taken to perform a read or write operation about the volatile memory D121 may be different from a time taken to perform a read or write operation about the nonvolatile memory D123 or the NVM controller D122. That is, a time (e.g., a VM read latency) taken to read data DT_v from the volatile memory D121 may be different from a time (e.g., an NVM write latency) taken for the NVM controller D122 to fetch the data DT_v.

In the case in which the NVM write latency is shorter than the VM read latency, the module controller D110 may send the VM read command and first address (RD_v/ADD1) to the volatile memory D121 and may then send the NVM write command and first address (WR_n/ADD1) to the NVM controller D122. Alternatively, in the case in which the NVM write latency is longer than the VM read latency, the module controller D110 may send the NVM write command and first address (WR_n/ADD1) to the NVM controller D122 and may then send the VM read command and first address (RD_v/ADD1) to the volatile memory D121.

That is, the module controller D110 may send the VM command/address CA_v and the NVM command/address CA_n to the volatile memory D121 and the NVM controller D122 respectively at different points in time that are determined according to an operation characteristic of each element, thereby allowing the NVM controller D122 to receive normally data output from the volatile memory D121 through the memory data line MDQ.

Figure 50:
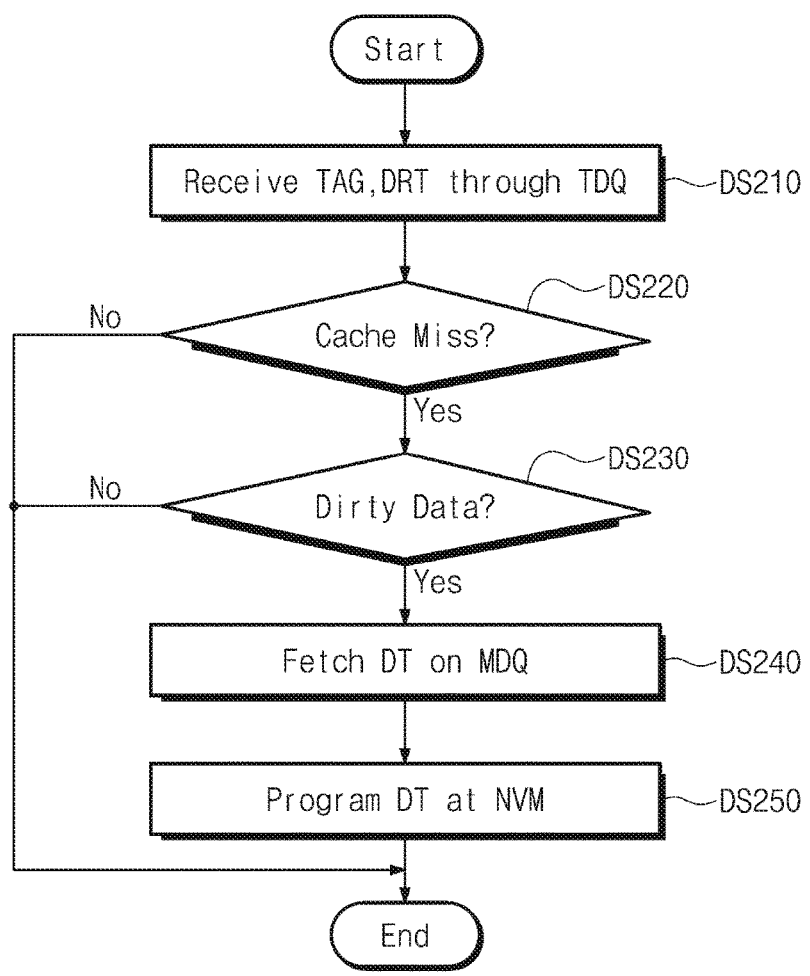
FIG. 50 is a flowchart illustrating an operation of the NVM controller of FIG. 48, according to example embodiments of the inventive concept.

FIG. 50 is a flowchart illustrating an operation of the NVM controller of FIG. 48, according to example embodiments of the inventive concept. Referring to FIGS. 48 and 50, the NVM controller D122 may perform operations of steps DS210 and DS220. Operations of steps DS210 and DS220 may be similar to those of steps DS110 and DS120 of FIG. 47, and a detailed description thereof is thus omitted.

If the determination result of step DS220 indicates a cache miss, in step DS230, the NVM controller D122 may determine whether data DT_v from the volatile memory D121 is dirty data. For example, after updated with new data based on a request of the processor 101, the data DT_n stored in the volatile memory D121 may not be flushed into the nonvolatile memory D123. Alternatively, data stored in the nonvolatile memory D123 may be different from data of the volatile memory D121 corresponding thereto. In this case, the data of the volatile memory D121 may be dirty data DRT. The dirty data DRT may include information about a dirty state about data stored in the same entry ET. That is, the NVM controller D122 may determine a dirty state about the data DT_n of the volatile memory D121 based on the dirty information DRT received through the tag data line TDQ.

When the determination result indicates that the data of the volatile memory D121 is not dirty data (i.e., when the data of the volatile memory D121 is clean data), the NVM controller 122 may not perform an operation separately.

When the determination result of step DS230 indicates that the data of the volatile memory D121 is dirty data, the NVM controller 122 may perform the flush operation to secure integrity of data. For example, the NVM controller D122 may perform operations of steps DS240 and DS250. Operations of steps DS240 and DS250 may be similar to those of steps DS130 and DS140 of FIG. 47, and a detailed description thereof is thus omitted.

In example embodiments, operations of steps DS210 to DS240 may be performed in parallel. For example, the NVM controller D122 may receive the tag TAG and the dirty information DRT through the tag data line TDQ and may simultaneously receive the data DT_v through the memory data line MDQ. At the same time, the NVM controller D122 may determine whether a cache miss or a cache miss occurs, based on the received tag TAG and may determine whether data of the volatile memory D121 is dirty data, based on the received dirty information DRT.

In example embodiments, as in the flush operation of the above-described write operation, the flush operation between the volatile memory D121 and the NVM controller D222 may be performed during a read operation of the nonvolatile memory module D100. For example, as described with reference to FIG. 8, the module controller 110 may receive a module read command and first address (RD/ADD1) from the processor 101 and may send a VM read command and first address (RD_v/ADD1) to the volatile memory D121 in response to the received signal. The volatile memory D121 may output data DT_v and a tag TAG_v in response to the VM read command and first address (RD_v/ADD1). In this case, the NVM controller D122 may determine whether a cache hit or the cache miss occurs, based on the tag TAG_v. The NVM controller D122 may flush the data DT_v received through the memory data line MDQ into the nonvolatile memory D123 based on the determination result.

Figure 51:
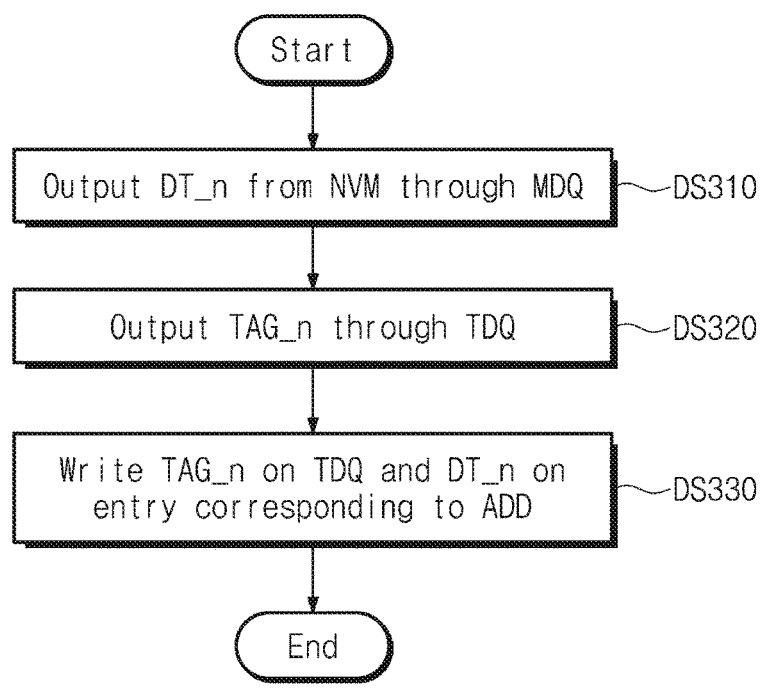
FIG. 51 is a flowchart illustrating an operation of the nonvolatile memory module of FIG. 2, according to example embodiments of the inventive concept.

FIG. 51 is a flowchart illustrating an operation of the nonvolatile memory module of FIG. 2, according to example embodiments of the inventive concept. In example embodiments, a flush operation in which data is copied or moved from the volatile memory D121 to the nonvolatile memory D123 will be described with reference to FIGS. 47 to 50. Below, there will be described a read caching operation in which data is moved from the nonvolatile memory D123 to the volatile memory D121. For descriptive convenience, a detailed description about above-described components may be omitted.

Referring to FIGS. 48 and 51, in step DS310, the nonvolatile memory module D100 may output the data DT_n, which is received from the nonvolatile memory D123, through memory the data line MDQ. For example, the NVM controller D122 may read the data DT_n from the nonvolatile memory D123 and may drive a voltage of the memory data line MDQ based on the read data DT_n.

In step DS320, the nonvolatile memory module D100 may output a tag TAG_n through the tag data line TDQ. For example, the module controller D110 may generate the tag TAG_n corresponding to the data DT_n based on an address ADD provided from the processor 101. The module controller D110 may drive a voltage of the tag data line TDQ based on the generated tag TAG.

In step DS330, the nonvolatile memory module D100 may write the tag TAG_n on tag data line TDQ and the data DT_n on the memory data line MDQ in an entry corresponding to the address ADD. For example, the volatile memory D121 may receive the tag TAG_n through the tag data line TDQ and may receive the data DT_n through the memory data line MDQ. The volatile memory D121 may store the received tag TAG_n and the data DT_n in an entry, which corresponds to a part of the address ADD, among a plurality of entries.

In example embodiments, when a cache miss occurs during a read operation of the nonvolatile memory module D100 and when a read operation about a cache-missed address is again performed, there may be performed a read caching operation described with reference to FIG. 51. Alternatively, the read caching operation described with reference to FIG. 51 may be performed according to a request of the processor 101.

Figure 52:
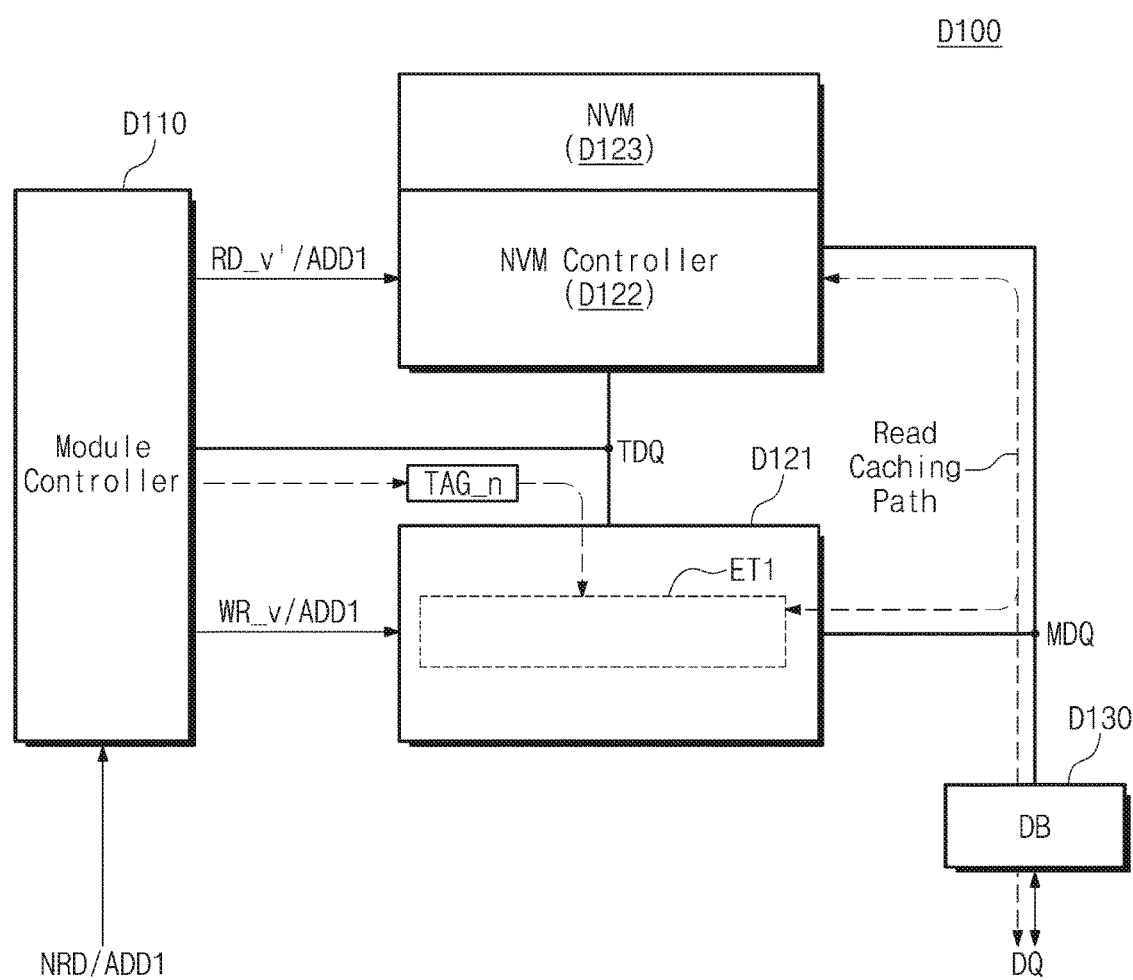
FIG. 52 is a block diagram for describing, in detail, an operation of FIG. 51.

FIG. 52 is a block diagram for describing, in detail, an operation of FIG. 51. In example embodiments, a read caching operation when a read operation about a cache-missed address is again performed will be described with reference to FIG. 51. Referring to FIGS. 1 and 51, the nonvolatile memory module D100 may include the module controller D110, the volatile memory D121, the NVM controller D122, the nonvolatile memory D123, and the data buffer D130. For descriptive convenience, a detailed description about above-described elements is omitted.

As described above, when a cache miss occurs during a read operation of the nonvolatile memory module D100, the nonvolatile memory module D100 may provide the processor 101 with a ready signal R indicating that data DT_n of the nonvolatile memory module D123 corresponding to the cache-missed address (e.g., the first address ADD1) is prepared. The processor 101 may provide the nonvolatile memory module D100 with a module read command and first address (NRD/ADD1) in response to the ready signal R. In this case, the module read command NRD may be a command for reading data DT_n from the nonvolatile memory D123.

The module controller D110 may provide an NVM read command and first address (RD_v'/ADD1) to the NVM controller D122 and a VM write command and first address (WR_v/ADD1) to the volatile memory D122 in response to the module read command and first address (NRD/ADD1).

The NVM controller D122 may output the data DT_n, which is received from the nonvolatile memory D123, through the memory data line MDQ in response to the NVM read command and first address (RD_n'/ADD1). In example embodiments, the module controller D110 may output the tag TAG_n through the tag data line TDQ in synchronization with timing when the data DT_n is output through the memory data line MDQ. In example embodiments, the tag TAG_n may include at least a part of the first address ADD1.

The volatile memory D121 may write the data DT_n received through the memory data line MDQ and the tag TAG_n received through the tag data line TDQ in the first entry ET1 corresponding to a part of the first address ADD1 in response to the VM write command and first address (WR_v/ADD1).

In example embodiments, the data buffer D130 may output the data DT_n on the memory data line MDQ to the processor 101 through the data line DQ under control of the module controller D110.

As described above, because the memory data line MDQ is shared by the volatile memory D121 and the NVM controller D122, when the data DT_n is output from the NVM controller D122, the data DT_n may be written in the volatile memory D121. That is, the nonvolatile memory module D100 may perform the read caching operation along a read caching path.

Figure 53:
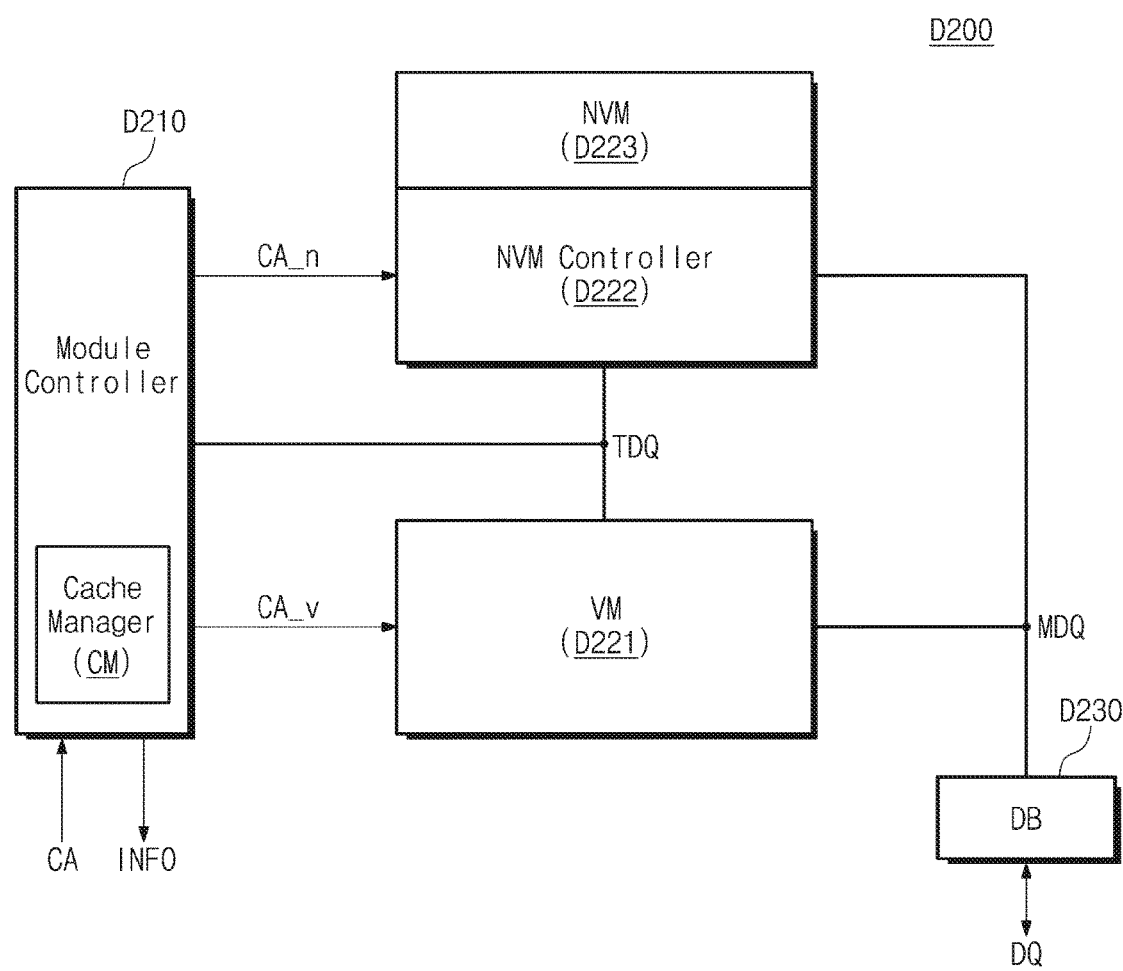
FIG. 53 is a block diagram illustrating a nonvolatile memory module of FIG. 2, according to example embodiments of the inventive concept.
Figure 54:
FIG. 54 is a drawing for describing an operation of the cache manager of FIG. 53.
Figure 55:
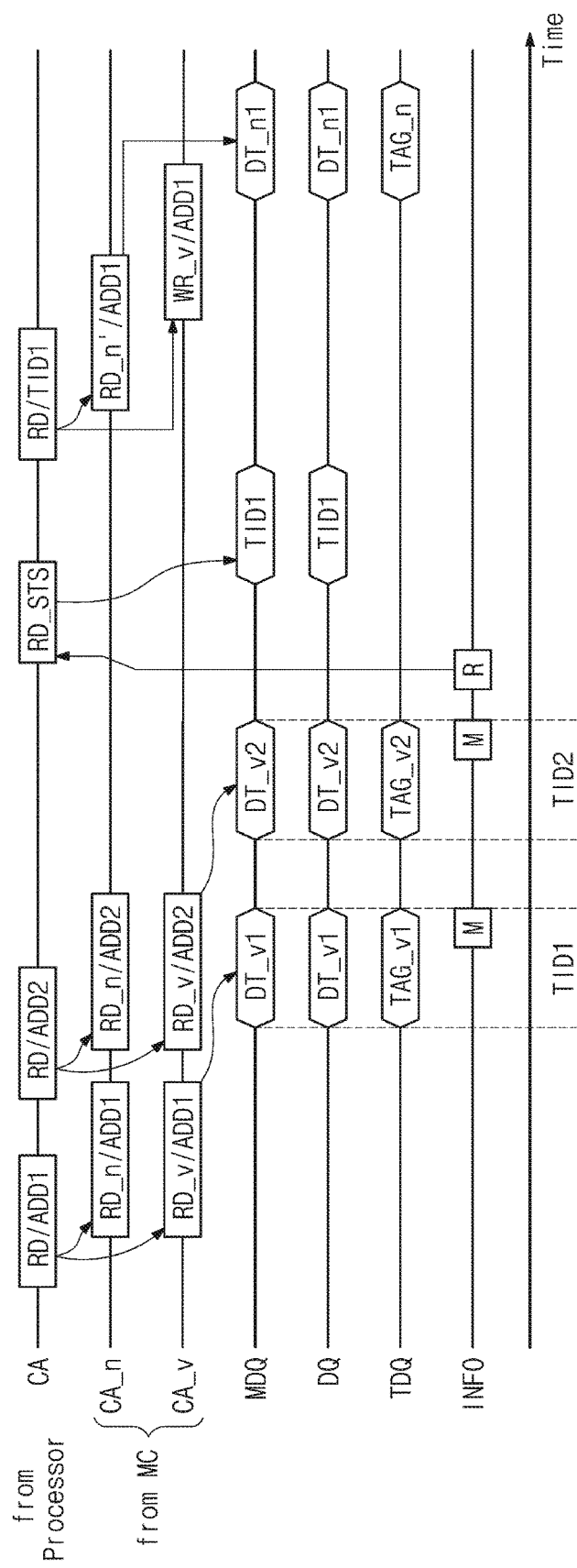
FIG. 55 is a timing diagram for describing an operation of the nonvolatile memory module of FIG. 53.

FIG. 53 is a block diagram illustrating a nonvolatile memory module of FIG. 2, according to example embodiments of the inventive concept. FIG. 54 is a drawing for describing an operation of the cache manager of FIG. 53. FIG. 55 is a timing diagram for describing an operation of the nonvolatile memory module of FIG. 53. Referring to FIGS. 1, 53, and 54, a nonvolatile memory module D200 may include a module controller D210, a volatile memory D221, an NVM controller D222, a nonvolatile memory D223, and a data buffer D230. For descriptive convenience, a detailed description about above-described components may be omitted.

Unlike the module controller 110 of the nonvolatile memory module 100 of FIG. 2, the module controller D210 of the nonvolatile memory module D200 of FIG. 53 may further include a cache manager CM.

The cache manager CM may manage the volatile memory D221 as a cache memory of the nonvolatile memory D223 effectively. For example, when a cache miss occurs during a read operation of the nonvolatile memory module D200, the cache manager CM may manage cache-missed address information. Afterwards, when a read operation about the cache-missed address is performed, the cache manager CM may control an NVM command/address CA_n and a VM command/address CA_v such that data corresponding to the cache-missed address is output from the nonvolatile memory D223.

In example embodiments, the cache manager CM may assign and manage transaction identifications TID to cache-missed addresses. For example, as illustrated in FIG. 53, the nonvolatile memory module D200 may sequentially perform read operations about first to sixth addresses ADD1 to ADD6 in response to a request of the processor 101. A cache miss may occur during a read operation about the first address ADD1 In this case, the cache manager CM may assign a first transaction identification TID1 to the first address ADD1 cache-missed. Afterwards, a cache hit may occur during a read operation about the second address ADD2. In this case, the cache manager CM may not perform a separate operation. Afterwards, a cache miss may occur during a read operation about the third address ADD3. In this case, the cache manager CM may assign a second transaction identification TID2 to the third address ADD3 cache-missed. A cache hit may occur when each of read operations about the fourth and fifth addresses ADD4 and ADD5 is performed; when a cache miss occurs during a read operation about the sixth address ADD6, the cache manager CM may assign a third transaction identification TID3 to the sixth address ADD6. Each of the first to third transaction identifications TID1, TID2, and TID3 may be implemented to be increased monotonically.

That is, the cache manager CM may manage cache-missed addresses, and whenever a cache miss occurs, the cache manager CM may assign a transact identification TID to the cache-missed address. In this case, the transaction identification may increase monotonically.

In example embodiments, with regard to cache-missed addresses, the nonvolatile memory module D200 may receive not address information but transaction identifications TID from the processor 101.

The nonvolatile memory module D200 may receive a module read command and first address (RD/ADD1 from the processor 101 and may provide an NVM read command and first address (RD_n/ADD1) to the NVM controller D222 and a VM read command and first address (RD_v/ADD1) to the volatile memory D221 in response to the received signal. The volatile memory D221 may output first data DT_v1 and a first tag TAG_v1 in response to the VM read command and first address (RD_v/ADD1).

Likewise, the nonvolatile memory module D200 may receive a module read command and second address (RD/ADD2) and may provide an NVM read command and second address (RD_n/ADD2) to the NVM controller D222 and a VM read command and second address (RD_v/ADD2) to the volatile memory A221 in response to the received signal. The volatile memory D221 may output second data DT_v2 and a second tag TAG_v2 in response to the VM read command and second address (RD_v/ADD2).

The first and second data DT_v1 and DT_v2 from the volatile memory D221 may not be data corresponding to the first and second addresses ADD1 and ADD2. That is, a cache miss may occur during read operations about the first and second addresses ADD1 and ADD2. In this case, the cache manager CM may assign a first transaction identification TID1 and a second transaction identification TID2 to the first address ADD1 and the second address ADD2, respectively.

As described above, the NVM controller D222 may receive the first and second tags Tag TAG_v1 and TAG_v2 and may recognize that a cache miss occurs, based on the first and second tags Tag TAG_v1 and TAG_v2. In this case, the NVM controller D222 may prepare data corresponding to the first and second addresses ADD1 and ADD2 from the nonvolatile memory D223.

In example embodiments, when the NVM controller A22 prepares data DT_n1 corresponding to the first address ADD1 firstly, the nonvolatile memory module D200 may provide the ready signal R to the processor 101. The processor 101 may provide the nonvolatile memory module D200 with a status read command RD_STS in response to the ready signal R.

The nonvolatile memory module D200 may send status information about a transaction identification TID to the processor 101 through a memory data line MDQ and a data signal DQ in response to the status read command RD_STS. In example embodiments, the status read command RD_STS may be a command that is previously defined to read an area, a status register, or a multi-purpose register of the nonvolatile memory module D200. In example embodiments, the status information about the transaction identification TID may be stored in the area, status register, or multi-purpose register of the nonvolatile memory module D200. In example embodiments, the status information about the transaction identification TID may be implemented in the form of bitmap.

In example embodiments, the nonvolatile memory module D200 may send information about complete preparation of the first transaction identification TID1 as status information about a transaction identification TID. The processor 101 may provide the nonvolatile memory module D200 with a module read command and first transaction identification (RD/TID1) in response to the received status information.

Responsive to the module read command and first transaction identification (RD/TID1), the nonvolatile memory module D200 may control the NVM command/address CA_n and the VM command/address CA_v such that data DT_n1 corresponding to the first transaction identification TID1 is output from the nonvolatile memory D223.

For example, the cache manager CM may provide an NVM read command and first address (RD_n'/ADD1) to the NVM controller D222 and a VM write command and first address (WR_v/ADD1) to the volatile memory D221 in response to the module read command and first transaction identification (RD/TID1). That is, the cache manager CM may receive the transaction identification TID from the processor 101. The cache manager CM may convert the transaction identification TID into a corresponding address ADD and may provide the address ADD to the volatile memory D221 and the NVM controller D222.

Each of the volatile memory D221 and the NVM controller D222 may perform the above-described read caching operation in response to the received signals.

Figure 56:
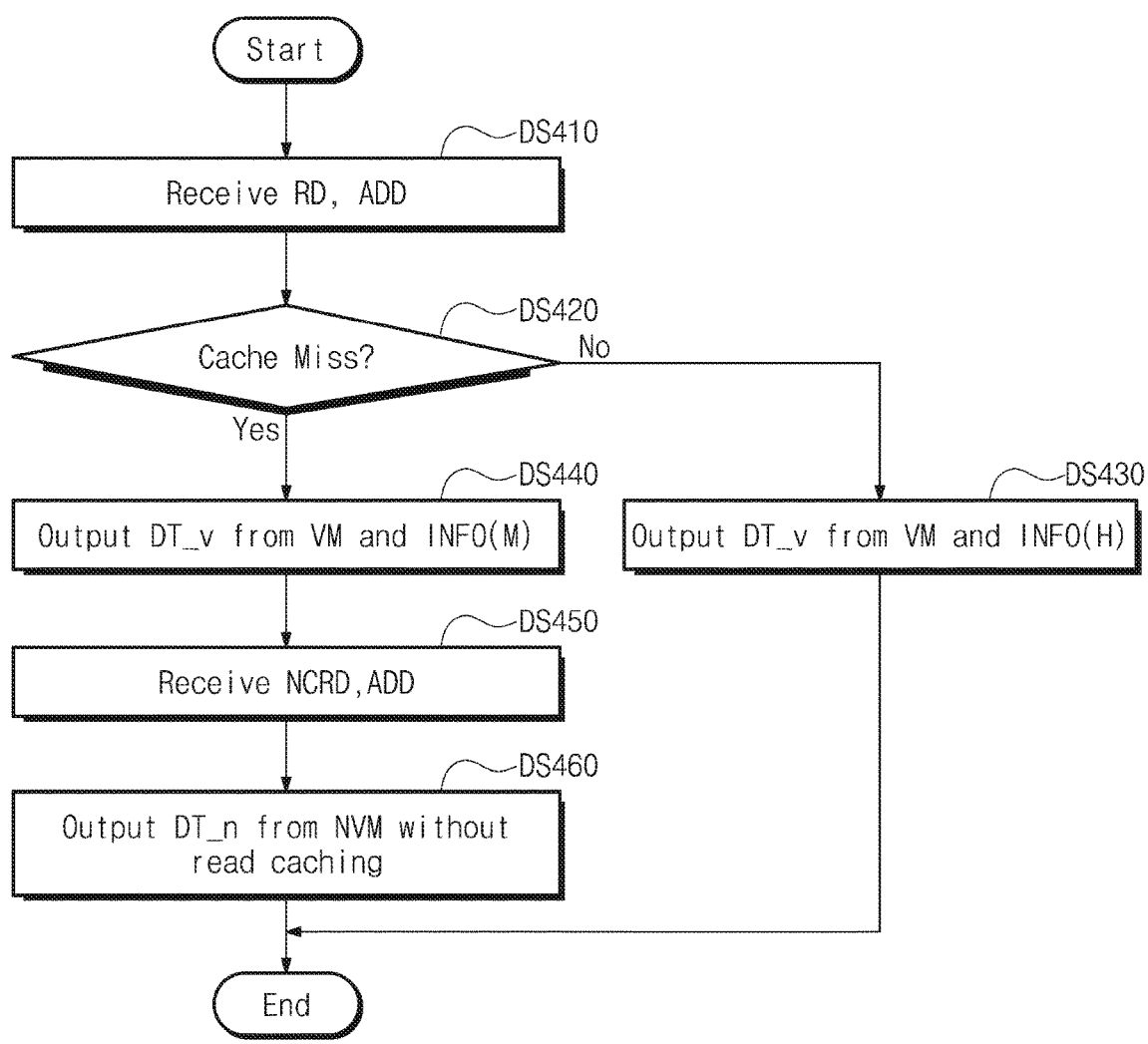
FIG. 56 is a flowchart illustrating an operation of the nonvolatile memory module of FIG. 2, according to example embodiments of the inventive concept.

FIG. 56 is a flowchart illustrating an operation of the nonvolatile memory module of FIG. 2, according to example embodiments of the inventive concept. For descriptive convenience, a detailed description about above-described components may be omitted. Referring to FIGS. 1, 2, 48, and 56, in step DS410, the nonvolatile memory module D100 may receive a module read command and address (RD/ADD) from the processor 101.

In step DS420, the nonvolatile memory module D100 may determine whether a cache hit or a cache miss occurs. For example, as described above, the nonvolatile memory module D100 may determine whether a cache hit or a cache miss occurs, based on a tag stored in an entry, which corresponds to a part of the address ADD, among a plurality of entries of the volatile memory D121.

If the determination result indicates that the cache hit occurs, in step DS430, the nonvolatile memory module D100 may output data DT_v of the volatile memory D121 and cache information INFO indicating the cache hit.

If the determination result indicates that the cache miss occurs, in step DS440, the nonvolatile memory module D100 may output data DT_v of the volatile memory D121 and cache information INFO indicating the cache miss.

In step DS450, the nonvolatile memory module D100 may receive a module read command and address (NCRD/ADD) from the processor 101. In example embodiments, the module read command NCRD may be a command for reading data DT_n from the nonvolatile memory D123 without performing the read caching operation. For example, an access frequency of data corresponding to a cache-missed address ADD may be low, or the data corresponding to the cache-missed address may be accessed once. In this case, the processor 101 may provide the module read command NCRD, thereby preventing an unnecessary read caching operation.

In example embodiments, each of the above-described module read commands RD, NRD, and NCRD may be signals or a command that is defined according to a communication protocol between the processor 101 and the nonvolatile memory module D100.

In step DS460, the nonvolatile memory module D100 may output data DT_n from the nonvolatile memory 123 to the processor 101 without a read caching operation.

Figure 57:
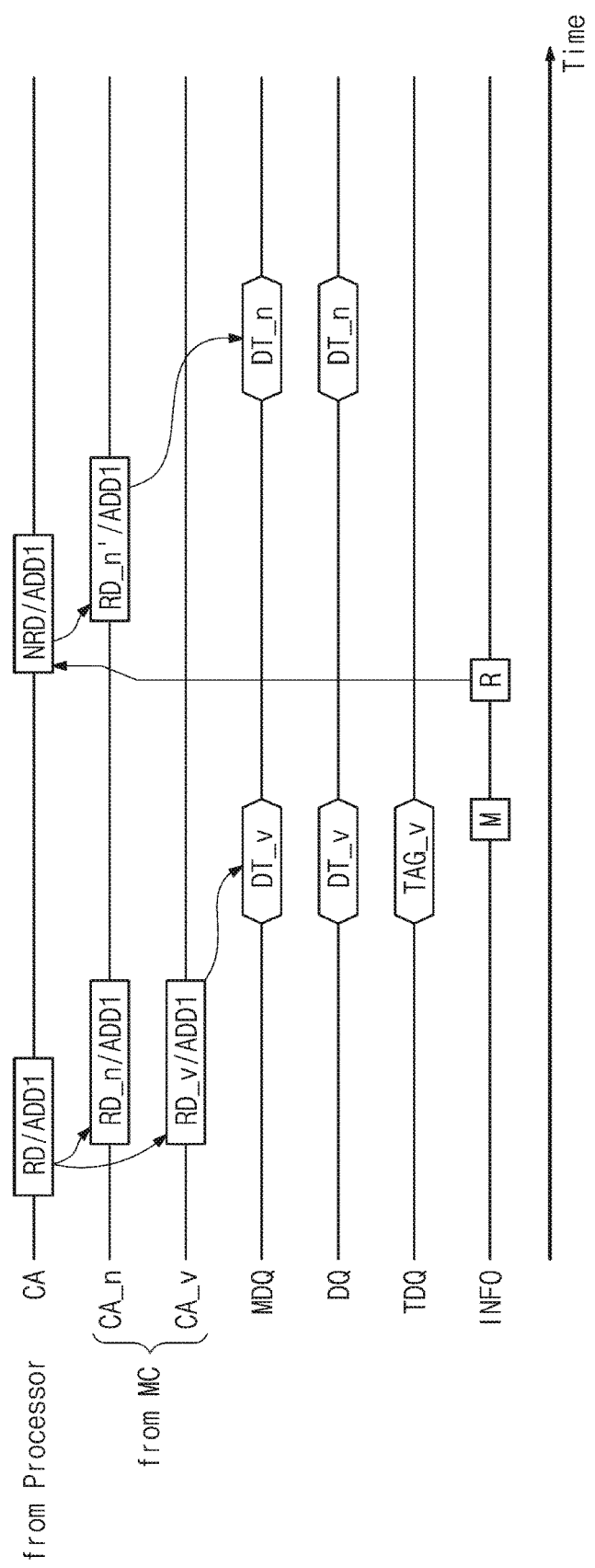
FIG. 57 is a timing diagram for describing, in detail, the operation of FIG. 56.

FIG. 57 is a timing diagram for describing, in detail, the operation of FIG. 56. Referring to FIGS. 1, 2, 48, and 57, the module controller D110 may receive a module read command and first address (RD/ADD1) from the processor 101. An operation that the nonvolatile memory module D121 performs in response to the module read command and first address (RD/ADD1) is described with reference to FIG. 8, and a detailed description thereof is thus omitted.

A cache miss may occur during a read operation about the module read command and first address (RD/ADD1). In this case, after data DT_n corresponding to the first address ADD1 is prepared by the NVM controller D122, the module controller D110 may provide the ready signal R to the processor 101.

The processor 101 may provide the module read command and first address (NRD/ADD1) to the module controller D110 in response to the ready signal R. In example embodiments, the module read command NRD may be a command for reading data DT_n from the nonvolatile memory D123 without performing the read caching operation as described above.

The module controller D110 may provide an NVM read command and first address (RD_n'/ADD1) to the NVM controller D122 in response to the module read command and first address (NCRD/ADD1), and the NVM controller D122 may output the data DT_n in response to the received signal.

In example embodiments, because the module read command NCRD is a command for reading the data DT_n from the nonvolatile memory D123 without the read caching operation, the module controller D121 may not provide the VM write command and first address that is to be provided to the volatile memory D121 for the read caching operation. Furthermore, the module controller D110 may not provide a tag TAG corresponding to the data DT_n from the nonvolatile memory D123.

As described above, the nonvolatile memory module D100 may skip the read caching operation based on a request of the processor 101.

Figure 58:
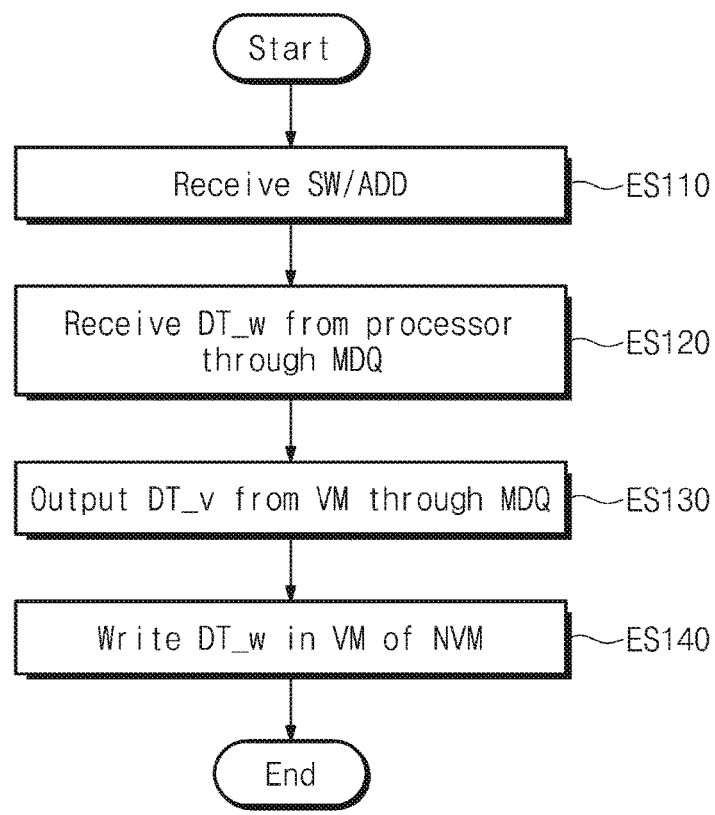
FIG. 58 is a flowchart illustrating an operation of the nonvolatile memory module of FIG. 2.

FIG. 58 is a flowchart illustrating an operation of the nonvolatile memory module of FIG. 2. Referring to FIGS. 1, 2, and 58, in step ES110, the nonvolatile memory module 100 may receive a module swap command and address (SW/ADD) from the processor 101.

In example embodiments, the module swap command SW may be a command for writing write data in the nonvolatile memory module 100. The module swap command SW may be a command for controlling a transaction of data stored in the volatile memory 121 and write data such that read and write operations about the volatile memory 121 of the nonvolatile memory module 100 is atomically performed. In example embodiments, the module swap command SW may be a command that is defined according to a communication protocol between the processor 101 and the nonvolatile memory module 100.

In step ES120, after receiving the module swap command and address (SW/ADD), the nonvolatile memory module 100 may receive write data DT_w from the processor 101 through the memory data line MDQ.

In step ES130, the nonvolatile memory module 100 may output data, which is stored in an entry corresponding to a part of an address ADD received after the module swap command and address (SW/ADD) is received, from the volatile memory 121 through the memory data line MDQ.

In step ES140, the nonvolatile memory module 100 may write the received write data DT_w in the volatile memory 121 or the nonvolatile memory 123.

In example embodiments, operations of steps ES120 to ES140 may be performed in parallel, and an order in which the operations are performed may not be limited to an order.

In example embodiments, operations of steps ES120 to ES140 may be performed atomically. That is, in the nonvolatile memory module 100, an operation of receiving write data DT_w (step ES120), an operation of outputting data DT_v from the volatile memory 121 (ES130), and an operation of writing the write data DT_w (ES140) may be one operation unit. That is, operations of steps ES120 and ES130 may compose an atomic operation.

Figure 59:
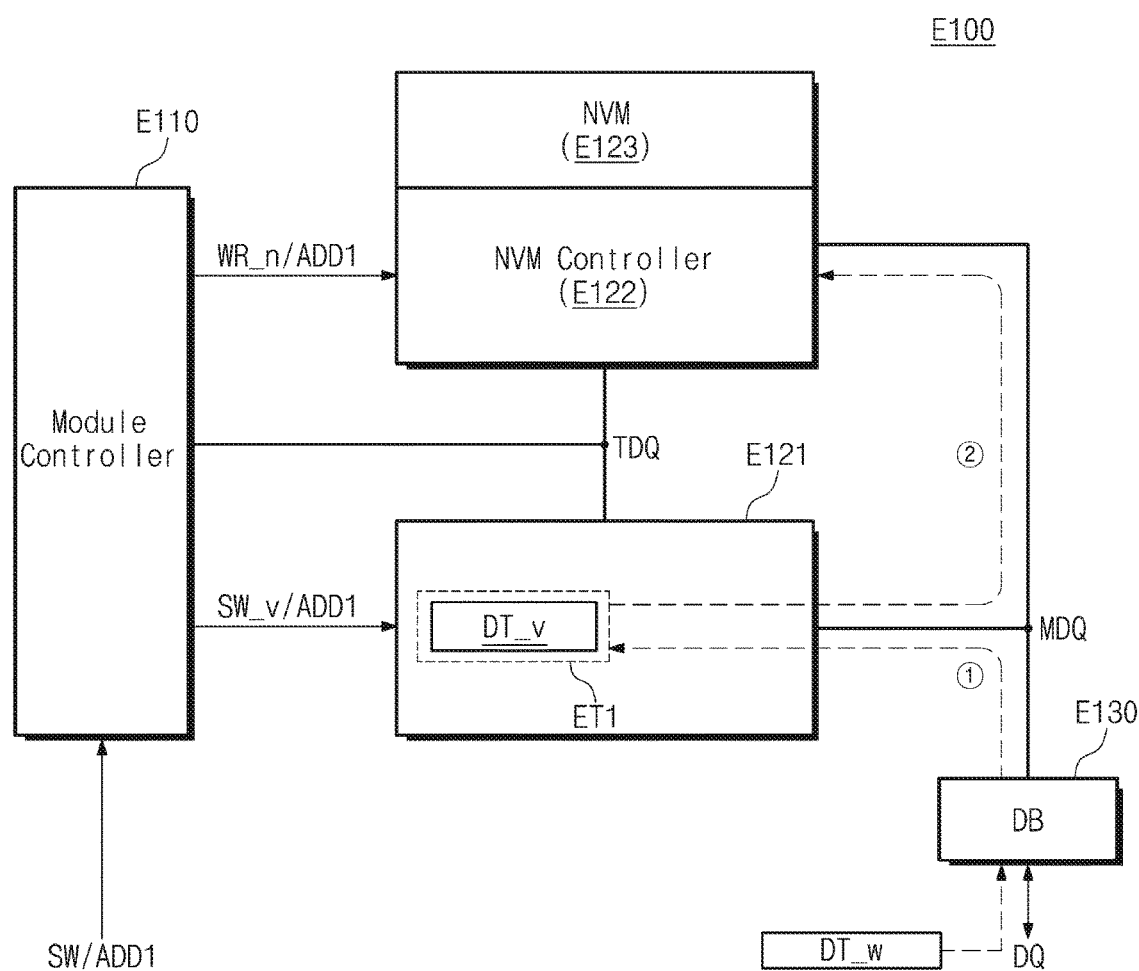
FIG. 59 is a block diagram for describing, in detail, the operation method illustrated in FIG. 58.

FIG. 59 is a block diagram for describing, in detail, the operation method illustrated in FIG. 58. Referring to FIGS. 1, 58, and 59, a nonvolatile memory module E100 may include a module controller E110, a volatile memory E121, an NVM controller E122, a nonvolatile memory E123, and a data buffer E130. In example embodiments, the nonvolatile memory module E100 of FIG. 59 may be a device or module that is substantially the same as or similar to the nonvolatile memory module 100 of FIGS. 1 and 2. For descriptive convenience, a description about the above-described elements and elements (e.g., the SPD, the tag data line, etc.) unnecessary to describe an operation method of FIG. 56 are omitted.

For descriptive convenience, at least a part of a first address ADD1 provided from the processor 101 is assumed as corresponding to a first entry ET1 among a plurality of entries of the volatile memory E121. That is, the volatile memory E121 may select or activate the first entry ET1 in response to the first address ADD1 from the module controller E110.

The module controller E110 may receive a module swap command and first address (SW/ADD1) from the processor 101. The module controller E110 may provide an NVM write command and first address (WR_v/ADD1) to the NVM controller E122 and a VM swap command and first address (SW_v/ADD1) to the volatile memory E121 in response to the received signal.

The volatile memory E121 may select or activate the first entry ET1 corresponding to a part of the first address ADD1 in response to the VM swap command and first address (SW_v/ADD1). The first entry ET1 may include data DT_v.

The first entry E1 may further include information about the data DT_v such as a tag TAG, a tag ECC, data ECC, and dirty information DRT, and the tag TAG, tag ECC, data ECC, and dirty information DRT may be provided to the module controller E110 and the NVM controller E122.

The processor 101 may send write data DT_w to the nonvolatile memory module E100 after a time elapses from a point in time when the module swap command and first address (SW/ADD1) is sent to the nonvolatile memory module E100. In example embodiments, the time may be a time (e.g., the write latency WL) that is determined according to the operation characteristic of the nonvolatile memory module E100.

The volatile memory E121 of the nonvolatile memory module E100 may receive the write data DT_w through the data line DQ, the data buffer E130, and the memory data line MDQ (①). After receiving the write data DT_w, the volatile memory E121 may output data DT_v stored in the first entry E1 through the memory data line MDQ (②). Afterwards, the volatile memory E121 may write the received write data DT_w in the first entry ET1.

In example embodiments, the write data DT_w may be provided to the NVM controller E122 through the memory data line MDQ, and the NVM controller E122 may program the received data DT_w in the nonvolatile memory E123.

In example embodiments, the NVM controller E122 may selectively program data DT_v from the volatile memory E121 in the nonvolatile memory E123. For example, the NVM controller E122 may determine whether a cache hit or a cache miss occurs, based on the tag TAG of the data DT_v. In example embodiments, the NVM controller E122 may selectively program data DT_v from the volatile memory E121 in the nonvolatile memory E123.

In example embodiments, the volatile memory E121 may store the write data DT_w received through the memory data line MDQ in a separate buffer circuit and may output the data DT_v through the memory data line MDQ before writing the received write data DT_w in the first entry ET1. Alternatively, the volatile memory E121 may read the data DT_v of the first entry ET1 using a separate data line while receiving the write data DT_v through the memory data line MDQ, and after receiving the write data DT_w, the volatile memory E121 may output the data DT_v on a separate data line through the memory data line MDQ.

That is, an operation of receiving the write data DT_v of the volatile memory E121, an operation of reading and outputting the data DT_v of the volatile memory E121, and an operation of writing the write data DT_v of the volatile memory E121 may be performed as an atomic operation.

Figure 60:
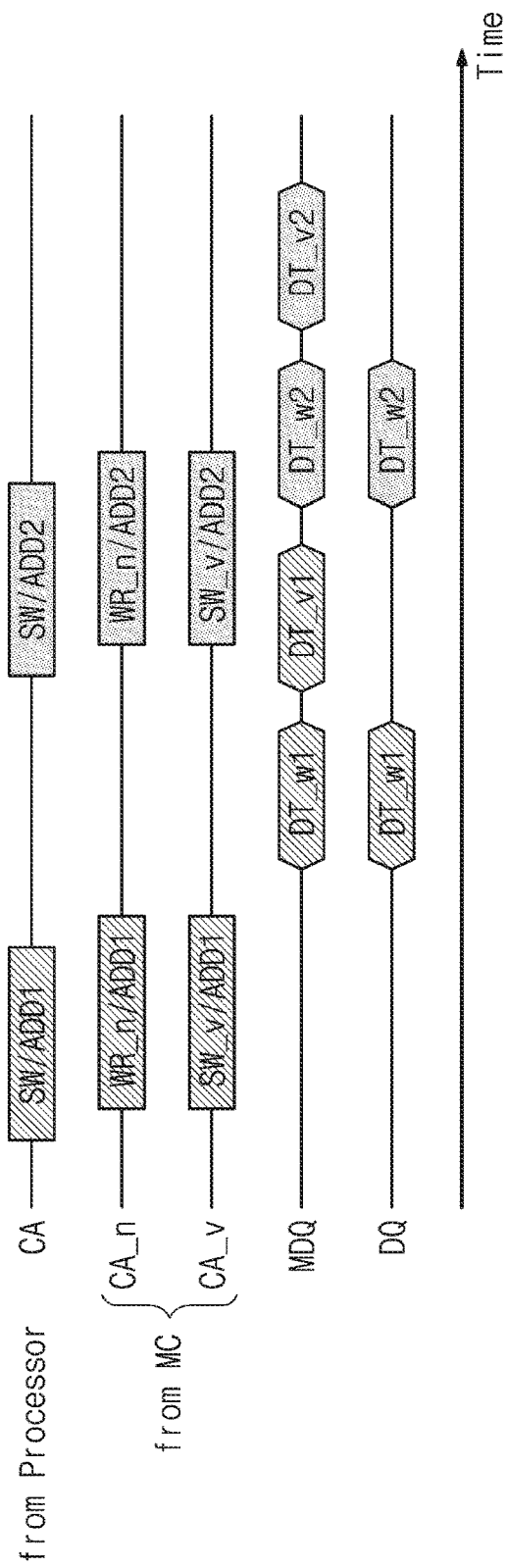
FIG. 60 is a flowchart for describing, in detail, the operation method illustrated in FIG. 58.

FIG. 60 is a timing diagram for describing, in detail, the operation method illustrated in FIG. 58. For descriptive convenience, a detailed description about the above-described elements is omitted, and elements unnecessary to describe the operation method of FIG. 58 are also omitted.

Referring to FIGS. 1, 59, and 60, the module controller E110 may receive a module swap command and first address (SW/ADD1) from the processor 101. The module controller E110 may provide an NVM write command and first address (WR_n/ADD1) to the NVM controller E122 and a VM swap command and first address (SW_v/ADD1) to the volatile memory E122 in response to the received signal.

The processor 101 may send first write data DT_w1 to the nonvolatile memory module E100 after a time elapses from a point in time when the module swap command and first address (SW/ADD1) is sent to the nonvolatile memory module E100.

That is, the first write data DT_w1 may be provided to the volatile memory E121 and the NVM controller E122 through the memory data line MDQ.

After receiving the first write data DT_w1, the volatile memory E121 may output first data DT_v1 of a first entry ET1, which corresponds to at least a part of the first address ADD1 through the memory data line MDQ. The first data DT_v may be provided to the NVM controller E122 through the memory data line MDQ.

In example embodiments, while the first data DT_v1 is output through the memory data line MDQ, the data buffer E130 may block a signal such that a signal of the memory data line MDQ does not affect the data line DQ. That is, the data buffer E130 may allow the first data DT_v1 not to affect the data line DQ. That is, the processor 101 may not recognize a transaction about the first data DT_v1.

While the nonvolatile memory module E100 performs the transaction about the first data DT_v1, the processor 101 may send a module swap command and second address (SW/ADD2) to the nonvolatile memory module E100. That is, as in the above description, elements of the nonvolatile memory module E100 may receive second write data DT_w2 in response to the module swap command and second address (SW/ADD2) and may perform the transaction about the second data DT_v2.

As described above, the nonvolatile memory module E100 may perform an internal operation atomically using the module swap command SW, thereby reducing a read latency about the nonvolatile memory module E100. This may mean that the performance of the nonvolatile memory module E100 is improved.

Figure 61:
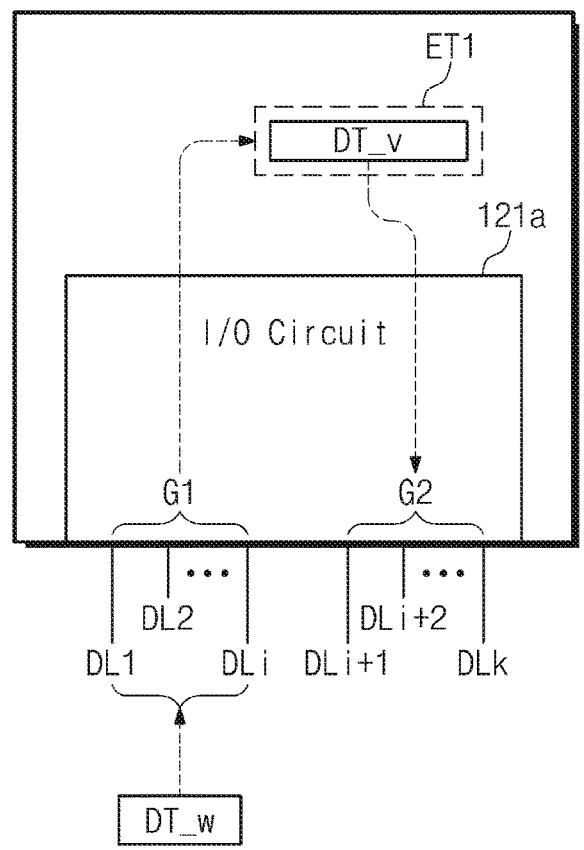
FIGS. 61 and 62 are drawings for describing the operation of the volatile memory of FIG. 59 in detail.
Figure 62:
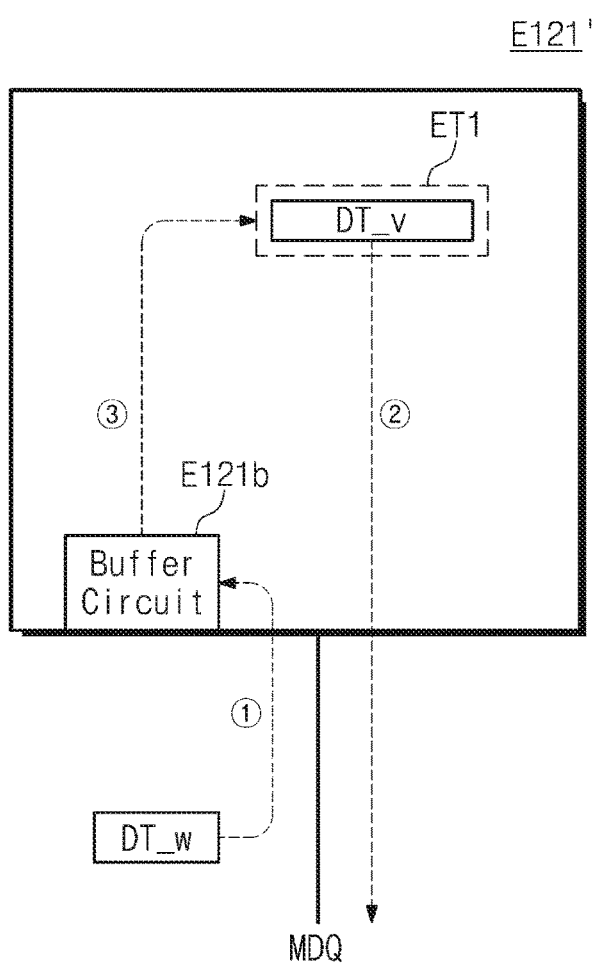

FIGS. 61 and 62 are drawings for describing the operation of the volatile memory of FIG. 59 in detail. For descriptive convenience, elements that are unnecessary to describe an operation of the volatile memory E 121 are omitted, and a detailed description about the above-described elements is omitted.

Referring to FIGS. 59 and 61, the volatile memory E121 may include an input/output (I/O) circuit E121a. The input/output circuit E121a may manage data provided to the volatile memory E121 and data output from the volatile memory E121.

The input/output circuit E121a may be connected with a plurality of data lines DL1 to DLi and DLi+1 to DLk and may send and receive data through the plurality of data lines DL1 to DLi and DLi+1 to DLk.

In example embodiments, the plurality of data lines DL1 to DLi and DLi+1 to DLk may be classified into a first group G1 and a second group G2. The first group G1 may include the data lined data lines DL1 to DLi, and the second group G2 may include the data lines DLi+1 to DLk.

In example embodiments, the data lines DL1 to DLi of the first group G1 may constitute the memory data line MDQ. That is, the input/output circuit E121a may be configured to receive write data DT_w through the data lines DL1 to DLi of the first group G1.

In example embodiments, the input/output circuit E121a may read data DT_v stored in the first entry ET1 using the data lines DLi+1 to DLk of the second group G2. For example, the input/output circuit E121a may drive voltages of the data lines DLi+1 to DLk of the second group G2 based on the data DT_v.

After receiving the write data DT_w through the data lines DLi+1 to DLk, the input/output circuit E121a may output the data DT_v through the data lines DL1 to DLi of the first group G1, by driving voltages of the data lines DL1 to DLi of the first group G1 based on the voltages of the data lines DLi+1 to DLk of the second group G2.

That is, as described above, the volatile memory E121 may read the data DT_v using data lines, which are not used as the memory data line MDQ, among the plurality of data lines, thereby making it possible to perform data (DT_v) read and output operations atomically.

Referring to FIGS. 1, 59, and 62, the volatile memory E121' may include a buffer circuit E121b. The buffer circuit E121b may be configured to temporarily store write data DT_w received through the memory data line MDQ. In example embodiments, the buffer circuit E121b may be composed of a part of a plurality of memory cells included in the volatile memory E121'. Alternatively, the buffer circuit E121b may be a separate storage area. Alternatively, the buffer circuit E121b may be a register circuit.

For example, as described above, the volatile memory E121' may receive the write data DT_w through the memory data line MDQ and may temporarily store the received write data DT_w in the buffer circuit 121b (①). The volatile memory E121' may output data DT_v stored in the first entry E1 through the memory data line MDQ (②). After the data DT_v is output through the memory data line MDQ, the volatile memory E121' may write the write data DT_w stored in the buffer circuit E121b in the first entry ET1 (③).

As described above, the volatile memory E121' may further include a separate buffer memory E121b. The volatile memory E121' may temporarily store the write data DT_w in the buffer memory E121b until the data DT_v from the first entry ET1 is output through the memory data line MDQ. Accordingly, the volatile memory E121' may perform operations of receiving the write data DT_w and reading and outputting the data DT_v atomically.

Figure 63:
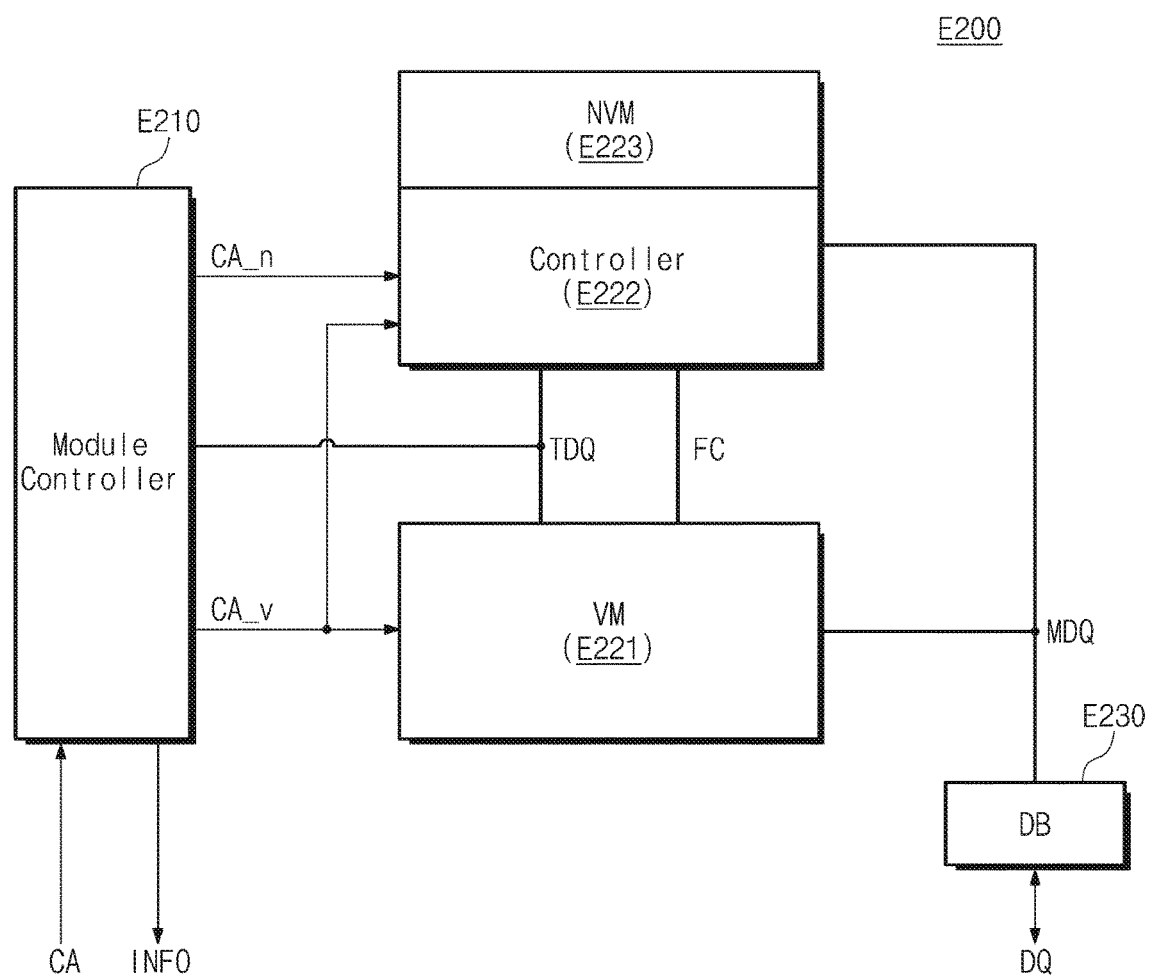
FIG. 63 is a block diagram illustrating the nonvolatile memory module of FIG. 2, according to example embodiments of the inventive concept.

FIG. 63 is a block diagram illustrating the nonvolatile memory module of FIG. 2, according to example embodiments of the inventive concept. Referring to FIGS. 1 and 63, a nonvolatile memory module E200 may include a module controller E210, a volatile memory E221, an NVM controller E222, a nonvolatile memory E223, and a data buffer E230. For descriptive convenience, a detailed description about above-described components may be omitted.

The nonvolatile memory module E200 of FIG. 63 may further include a flush channel FC. For example, the volatile memory E221 and the NVM controller E222 may be configured to share the memory data line MDQ and the tag data line TDQ. In addition, the volatile memory E221 and the NVM controller E222 may share the flush channel FC. The volatile memory E221 and the NVM controller E222 may exchange data with each other through the flush channel FC.

In example embodiments, the flush channel FC may include a plurality of data lines and a data strobe signal line. In example embodiments, the flush channel FC may be blocked according to a request of the processor 101.

Figure 64:
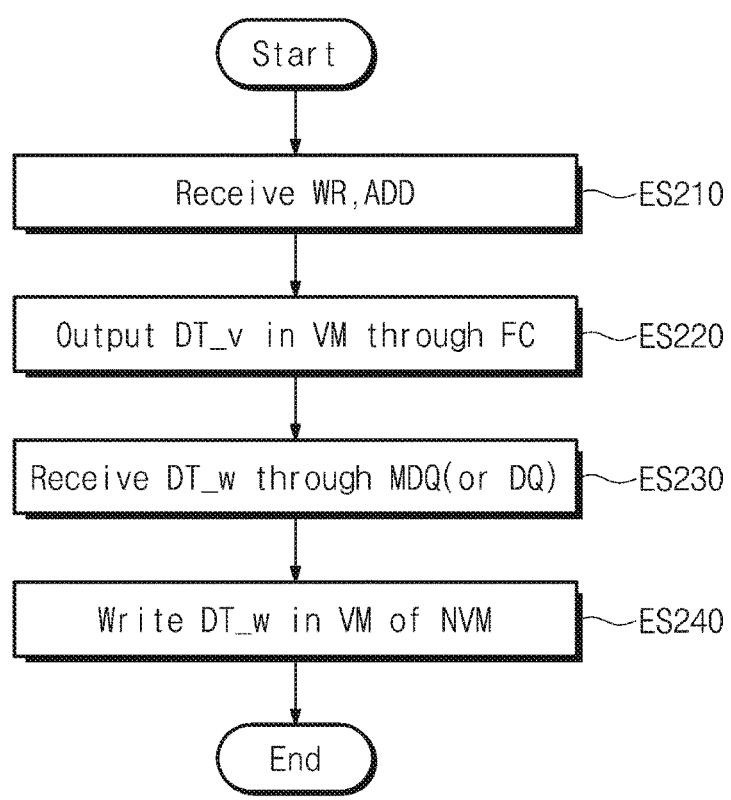
FIG. 64 is a flowchart illustrating an operation of the nonvolatile memory module of FIG. 63.

FIG. 64 is a flowchart illustrating an operation of the nonvolatile memory module of FIG. 63. For descriptive convenience, a detailed description about above-described components may be omitted. Referring to FIGS. 1, 63, and 64, in step ES210, the nonvolatile memory module E100 may receive a module write command and address (WR/ADD) from the processor 101.

In step ES220, the nonvolatile memory module E200 may output data DT_v from the volatile memory E221 through the flush channel FC. For example, the module controller E210 may receive the module write command and address (WR/ADD) and may send a VM read command and address (RD_v/ADD) to the volatile memory E221. The volatile memory 121 may output the data DT_v, which is stored in an entry corresponding to the address ADD, in response to the VM read command and address (RD_v/ADD). In example embodiments, the data DT_v output through the flush channel FC may be provided to the NVM controller E222.

In example embodiments, the NVM controller E222 may selectively program the data DT_v received through the flush channel FC in the nonvolatile memory E223. For example, the NVM controller E222 may receive a tag TAG about data DT_w received through the flush channel FC in the volatile memory E221. The NVM module E222 may determine whether a cache hit or a cache miss occurs, based on the tag TAG and the address ADD. The NVM controller E222 may selectively program the data DT_v received through the flush channel FC in the nonvolatile memory E223.

In step ES230, the nonvolatile memory module E200 may receive the data DT_w through the memory data line MDQ (or the data line DQ). For example, the processor 101 may send write data DT_w to the nonvolatile memory module E200 after a time elapses from a point in time when the module write command and address (WR/ADD) is sent to the nonvolatile memory module E100.

In example embodiments, an operation order of steps ES220 and ES230 may not be limited to this disclosure. For example, operations of steps ES220 and ES230 may be performed in parallel.

In step ES240, the nonvolatile memory module E200 may write the received write data DT_w in the volatile memory 121 or the nonvolatile memory 123. For example, the volatile memory E221 of the nonvolatile memory module E200 may receive the write data DT_w through the data line DQ and the memory data line MDQ. The volatile memory E221 may store the received write data DT_w under control of the module controller E210. The NVM controller E222 may write the received write data DT_w in the nonvolatile memory E223 under control of the module controller E210.

Figure 65:
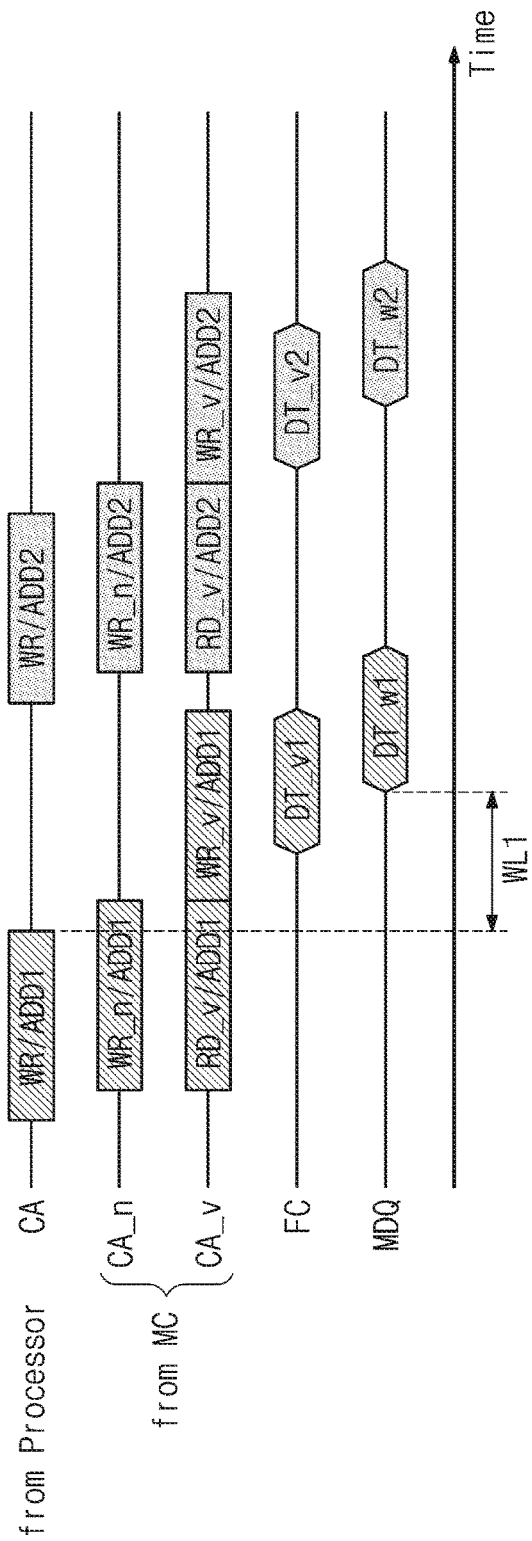
FIG. 65 is a timing diagram for describing, in detail, the operation according to the flowchart of FIG. 64.

FIG. 65 is a timing diagram for describing, in detail, the operation according to the flowchart of FIG. 64. Referring to FIGS. 1, 63, and 65, the module controller E210 may receive a module write command and first address (WR/ADD1) from the processor 101.

The module controller E210 may provide an NVM write command and first address (WR_n/ADD1) to the NVM controller E222 and a VM write command and first address (WR_v/ADD1) to the volatile memory E221 in response to the module write command and first address (WR/ADD1).

The volatile memory E221 may output first data DT_v1, which is stored in an entry corresponding to the first address ADD1 in response to the VM read command and first address (RD_v/ADD1).

In example embodiments, the processor 101 may send first write data DT_w1 to the nonvolatile memory module E200 after a time elapses from a point in time when the module write command and first address (WR/ADD1) is sent to the nonvolatile memory module E100. In this case, the volatile memory E221 and the NVM controller E222 may receive the first write data DT_w1 through the memory data line MDQ. The volatile memory E221 may store the first write data DT_w1 in an area corresponding to the first address ADD1 in response to the VM write command and first address (WR_v/ADD1), and the NVM controller E222 may store the first write data DT_w1 in an area corresponding to the first address ADD1 in response to the NVM write command and first address (WR_n/ADD1).

Likewise, the module controller E210 may receive a module write command and second address (WR/ADD2) and may provide an NVM write command and second address (WR_n/ADD2) to the NVM controller E222 and a VM write command and second address (WR_v/ADD2) to the volatile memory E221 in response to the module write command and second address (WR/ADD2). The volatile memory E221 may output first data DT_v2, which is stored in an entry corresponding to the second address ADD2, in response to the received signals. Afterwards, each of the volatile memory E221 and the NVM controller E222 may receive second write data DT_w2 through the memory data line MDQ. The volatile memory E221 and the NVM controller E222 may write the second write data DT_w2 in areas corresponding thereto, respectively.

In example embodiments, the output of the first and second data DT_v1 and DT_v2 of the volatile memory E221 and the receiving of the first and second write data DT_w1 and DT_w2 may be performed through different data buses. For example, the volatile memory E221 may output the first and second data DT_v1 and DT_v2 and may receive the first and second write data DT_w1 and DT_w2 through the memory data line MDQ. Because outputting and receiving data using different data buses, the volatile memory E221 may perform an operation of outputting the first and second data DT_v1 and DT_v2 and an operation of receiving the first and second write data DT_w1 and DT_w2 in a parallel or overlap manner. Accordingly, a read latency may be reduced.

Figure 66:
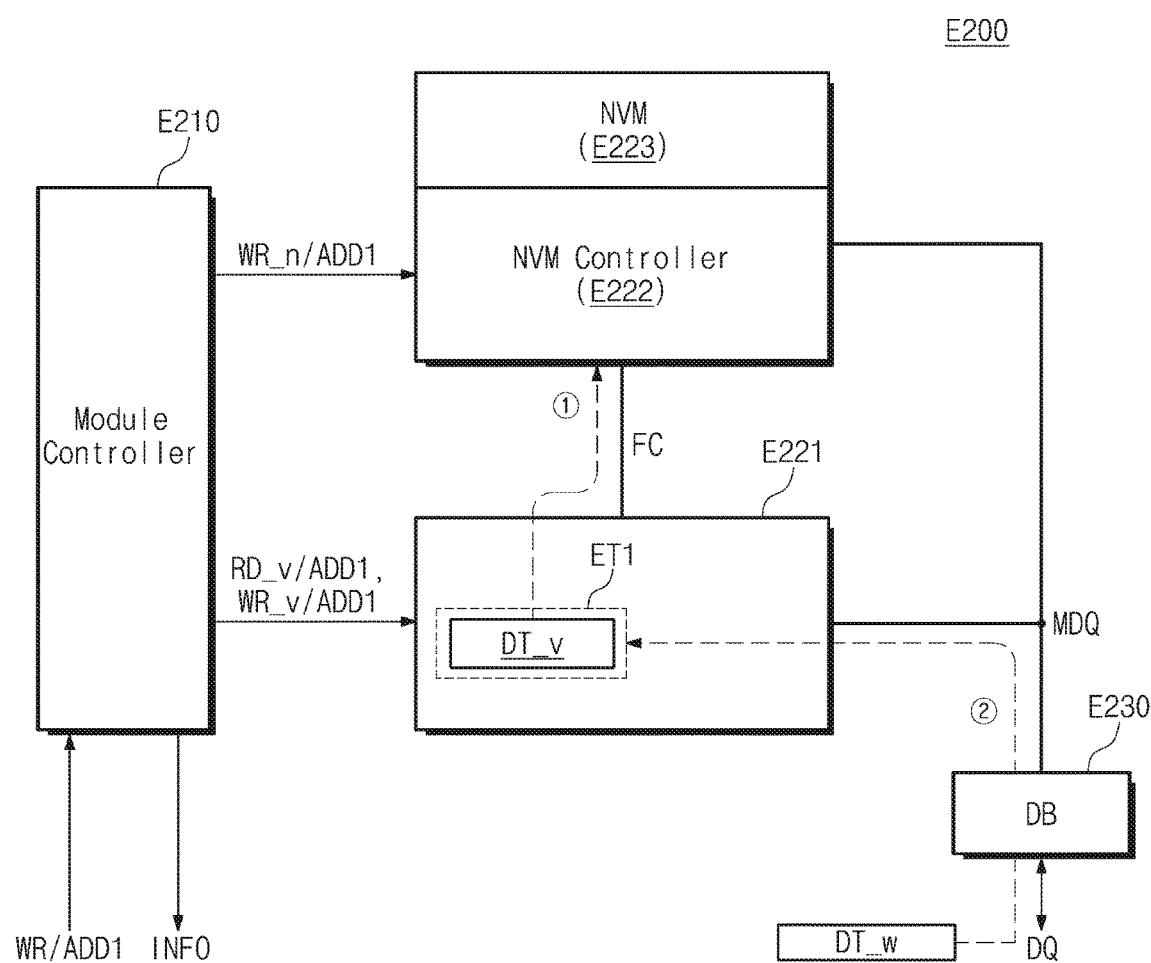
FIG. 66 is a block diagram for describing, in detail, the operation according to the timing diagram of FIG. 65.

FIG. 66 is a block diagram for describing, in detail, the operation according to the timing diagram of FIG. 65. Referring to FIGS. 1, 65, and 66, the nonvolatile memory module E200 may include the module controller E210, the volatile memory E221, the NVM controller E222, the nonvolatile memory E223, and the data buffer E230. For descriptive convenience, a detailed description about elements, which are unnecessary to describe an operation according to the timing diagram of FIG. 65, and the above-described elements is omitted.

The module controller E210 may receive a module write command and first address (WR/ADD1) from the processor 101 and may provide an NVM write command and first address (WR_n/ADD1) to the NVM controller E222 and a VM read command and first address (RD_v/ADD1) and a VM write command and first address (WR_v/ADD1) to the volatile memory E221 in response to the module write command and first address (WR/ADD1).

On the basis of the VM read command and first address (RD_v/ADD1), the volatile memory E221 may send data DT_v, which is stored in a first entry ET1 corresponding to the first address ADD1 to the NVM controller E222 through the flush channel FC.

As described above, the processor 101 may send write data DT_w to the nonvolatile memory module E200 after a time elapses from a point in time when the module write command and first address (WR/ADD1) is sent to the nonvolatile memory module E200. That is, the volatile memory E221 may receive the write data DT_w through the memory data line MDQ and may write the write data DT_w in the first entry ET1 corresponding to the first address ADD1 in response to the VM write command and first address (WR_v/ADD1).

In example embodiments, because an operation of outputting data and an operation of receiving data are performed through different data buses (e.g., the flush channel FC and the memory data line MDQ) in the volatile memory E221, the operations may be performed in a parallel or overlap manner.

Figure 67:
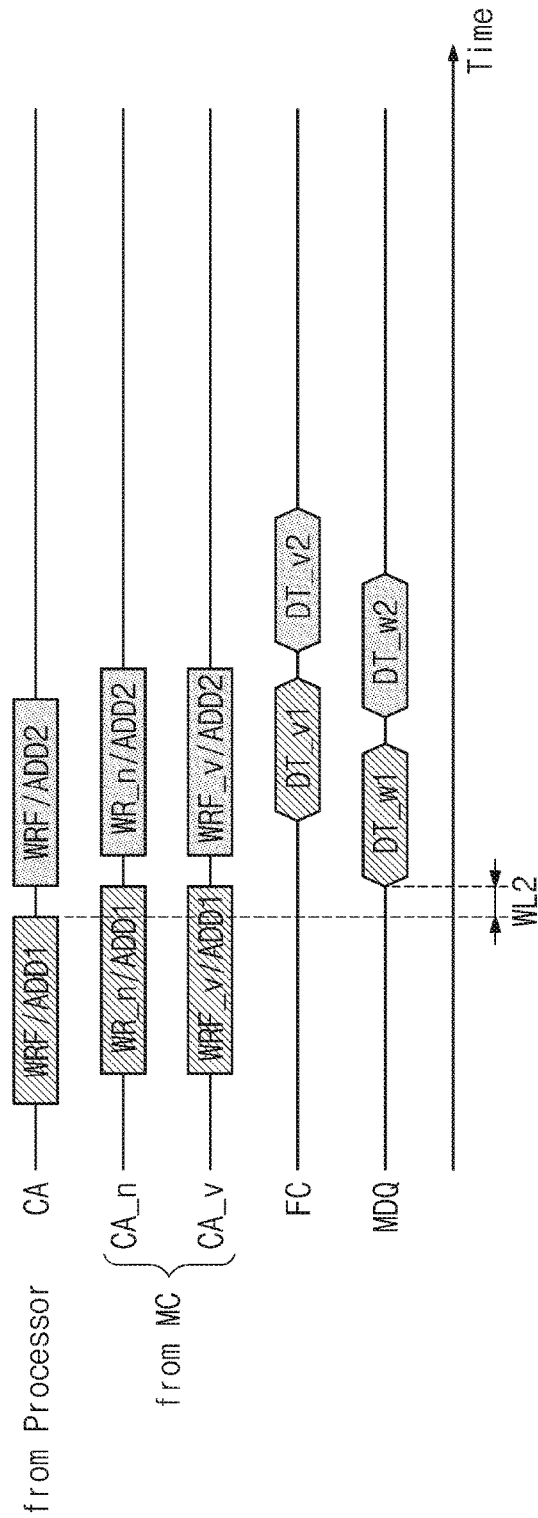
FIG. 67 is a timing diagram for describing, in detail, the operation according to the flowchart of FIG. 64, according to example embodiments of the inventive concept.

FIG. 67 is a timing diagram for describing, in detail, the operation according to the flowchart of FIG. 64, according to example embodiments of the inventive concept. Referring to FIGS. 1, 63, and 67, the nonvolatile memory module E200 may receive a module flush command and first address (WRF/ADD1) from the processor 101. In example embodiments, the module flush command SWF may be a command for writing write data in the nonvolatile memory module E300. The module flush command WRF may be a command for sending data DT_v from the volatile memory E221 of the nonvolatile memory module E200 to the NVM controller E222 through the flush channel FC. The module flush command WRF may be a command that is previously defined according to a communication protocol between the nonvolatile memory module E200 and the processor 101.

The module controller E210 may provide an NVM write command and first address (WR_n/ADD1) to the NVM controller E222 and a VM flush command and first address (WRF/ADD1) to the volatile memory E221 in response to the module flush command and first address (WRF/ADD1).

In example embodiments, the processor 101 may send first write data DT_w1 to the nonvolatile memory module E200 after a time elapses from a point in time when the module flush command and first address (WRF/ADD1) is sent to the nonvolatile memory module E200.

On the basis of the VM flush command and first address (WRF/ADD1), the volatile memory E221 may receive the first write data DT_w1 through the memory data line MDQ and may output first data DT_v1 through the flush channel FC. In this case, the first data DT_v1 may be data that is stored in an entry corresponding to the first address ADD1. The volatile memory E221 may store the received first write data DT_w1 in an entry that corresponds to the first address ADD.

Likewise, the module controller E210 may receive a module flush command and second address (WRF/ADD2) from the processor 101 and may provide an NVM write command and second address (WR_n/ADD2) to the NVM controller E222 and a VM flush command and second address (WRF/ADD2) to the volatile memory E221 in response to the received signals.

On the basis of the VM flush command and second address (WRF/ADD2), the volatile memory E321 may receive second write data DT_w2 through the memory data line MDQ and may output second data DT_v2 through the flush channel FC. In this case, the second data DT_v2 may be data that is stored in an entry corresponding to the second address ADD2. The volatile memory E221 may store the received second write data DT_w2 in an entry that corresponds to the second address ADD2.

In example embodiments, as illustrated in FIG. 67, the volatile memory E221 may perform an operation of receiving the first and second write data DT_w1 and DT_w2 and an operation of outputting the first and second data DT_v1 and DT_v2 in parallel. That is, the volatile memory E221 may perform data input and output operations in parallel so that the write latency may be reduced.

Figure 68:
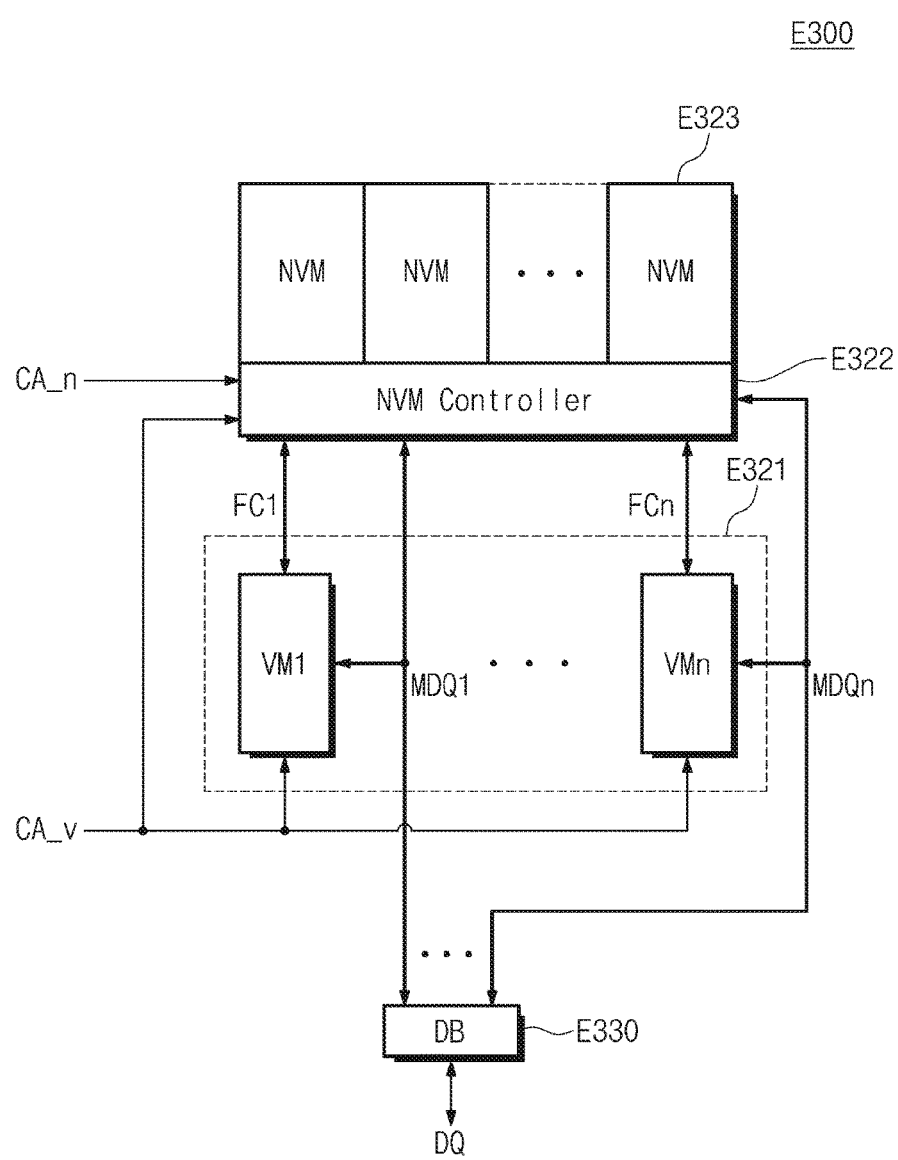
FIG. 68 is a block diagram illustrating the nonvolatile memory module of FIG. 2, according to example embodiments of the inventive concept.

FIG. 68 is a block diagram illustrating the nonvolatile memory module of FIG. 2, according to example embodiments of the inventive concept. For ease of illustration, elements (e.g., a module controller and an SPD) other than a heterogeneous memory device E120 and a data buffers E130 are omitted. For descriptive convenience, a detailed description about above-described components may be omitted. Referring to FIGS. 1, 2, and 68, a nonvolatile memory module E300 may include a volatile memory E321, an NVM controller E322, a nonvolatile memory E323, and a data buffer E330.

The volatile memory E321 may include a plurality of volatile memory chips VM1 to VMn. The nonvolatile memory E323 may include a plurality of nonvolatile memory chips NVM. Each of the plurality of volatile memory chips VM1 to VMn, the plurality of nonvolatile memory chips NVM, and the NVM controller E322 may be implemented with a separate chip or a separate package. Alternatively, the plurality of volatile memory chips VM1 to VMn, the plurality of nonvolatile memory chips NVM, and the NVM controller E322 may be implemented with a package through a multi-chip package way.

The plurality of volatile memory chips VM1 to VMn may be configured to share different memory data lines MDQ1 to MDQn with the NVM controller E322. For example, the first volatile memory VM1 may share the first memory data line MDQ1 with the NVM controller E322. The first memory data line MDQ1 may be connected with the data buffer E330. In example embodiments, the first memory data line MDQ1 may include eight lines. The n-th volatile memory VMn may share the n-th memory data line MDQn with the NVM controller E322. The n-th memory data line MDQn may be connected with the data buffer B330. In example embodiments, the n-th memory data line MDQn may include eight lines. That is, each of the plurality of volatile memories VM1 may share a corresponding one among the memory data lines MDQ1 to MDQn with the NVM controller E322, and the plurality of memory data lines MDQ1 to MDQn may be connected with one data buffer E330.

The data buffer E330 may be connected with the processor 101 (refer to FIG. 1) through the data line DQ. In this case, the number of data lines DQ may be determined according to the number of memory data lines MDQ1 to MDQn.

The plurality of volatile memory chips VM1 to VMn may be connected with the NVM controller E322 through a plurality of flush channels FC1 to FCn, respectively. That is, as described above, the plurality of volatile memory chips VM1 to VMn may send data to the NVM controller E322 through the plurality of flush channels FC1 to FCn, respectively. In example embodiments, each of the plurality of flush channels FC1 to FCn may include a plurality of data lines as a data transmission path and a plurality of data strobe signal lines for capturing signals of the plurality of data lines.

Figure 69:
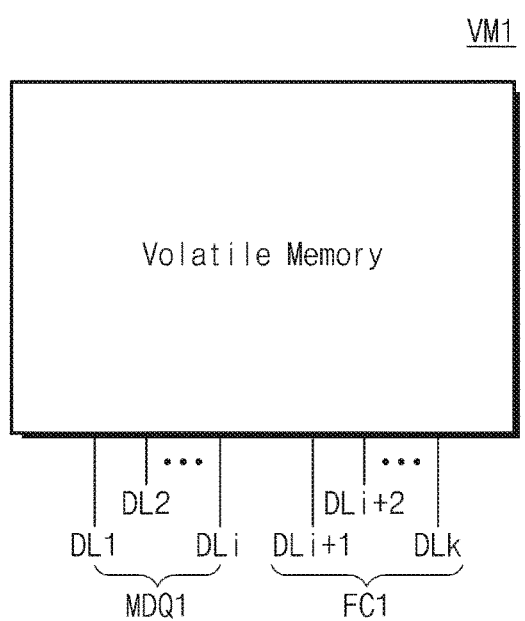
FIG. 69 is a block diagram for describing a method of implementing a first flush channel of the first volatile memory chip illustrated in FIG. 68.

FIG. 69 is a block diagram for describing a method of implementing a first flush channel of the first volatile memory chip illustrated in FIG. 68. For descriptive convenience, elements that are unnecessary to describe the first flush channel FC1 are omitted.

Referring to FIGS. 68 and 69, the first volatile memory chip VM1 may be connected with a plurality of data lines DL1 to DLi and DLi+1 to DLk. The first volatile memory chip VM1 may exchange data with an external device through the plurality of data lines DL1 to DLi and DLi+1 to DLk.

In example embodiments, a part (e.g., DL1 to DLi) of the plurality of data lines DL1 to DLi and DLi+1 to DLk connected with the first volatile memory chip VM1 may be used as the memory data line MDQ. That is, the first volatile memory chip VM1 may be connected with the data buffer E330 and the NVM controller E322 through the data line DL1 to DLi.

The others (e.g., DLi+1 to DLk) of the plurality of data lines DL1 to DLi and DLi+1 to DLk connected with the first volatile memory chip VM1 may be used as the first flush channel FC1. That is, the first volatile memory chip VM1 may be connected with the NVM controller E322 through the data lines DLi+1 to DLk and may send data stored therein to the NVM controller E322 under control of an external device (e.g., the module controller).

As described above, the volatile memory E321 may use a part of a plurality of lines as the memory data line MDQ and the others thereof as the flush channel FC.

Figure 70:
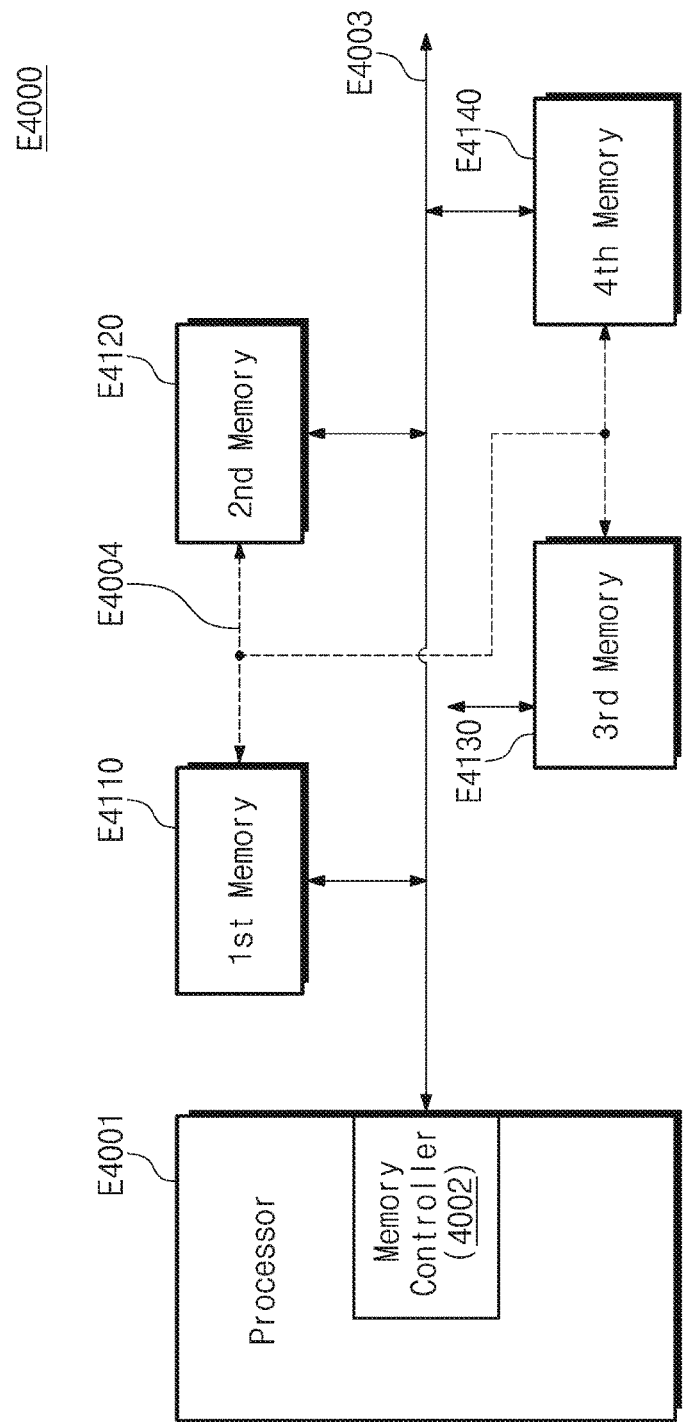
FIG. 70 is a block diagram illustrating another user system to which the nonvolatile memory module according to example embodiments of the inventive concept is applied.

FIG. 70 is a block diagram illustrating another user system to which the nonvolatile memory module according to example embodiments of the inventive concept is applied. Referring to FIG. 70, a computing system E4000 may include a processor E4001 and a plurality of memories E4110 to E4140. The processor E4001 may include a memory controller 4002. The processor E4001, the plurality of memories E4110 to E4140, and the memory controller 4002 are substantially the same as those of FIG. 26, and a detailed description thereof is thus omitted.

In example embodiments, the plurality of memories E4110 to E4140 of FIG. 70 may be interconnected through a separate channel E4004 (e.g., a flush dedicated channel). The plurality of memories E4110 to E4140 may exchange data with each other through the separate channel E4004. In example embodiments, as described with reference to FIGS. 1 to 26, the plurality of memories E4110 to E4140 may exchange data with each other through the separate channel E4004 (i.e., the flush dedicated channel) and may selectively store data received through the separate channel E4004.

In example embodiments, the separate channel E4004 may be a side band interface. For example, the separate channel E4004 may be a channel that is not connected with the processor E4001 or the memory controller 4002 and connects the plurality of memories E4110 to E4140.

In example embodiments, the separate channel E4004 may be provided based on the same interface (e.g., a DDR interface) of that of a bus E4003 between the plurality of memories E4110 to E4140 and the memory controller 4002. Alternatively, the separate channel E4004 may be provided based on an interface different from that of the bus E4003. For example, the separate channel E4004 may be provided based on a serial bus such as I2C, SMBus, PMBus, IPMI, or MCTP. The separate channel E4004 may be provided based on at least one among double data rate (DDR), DDR2, DDR3, DDR4, low power DDR (LPDDR), universal serial bus (USB), multimedia card (MMC), embedded MMC, peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), firewire, universal flash storage (UFS), or nonvolatile memory express (NVMe).

In example embodiments, each of the plurality of memories E4110 to E4140 may include separate signal pins or signal lines for connection with the separate channel E4004.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While the inventive concept has been described with reference to example embodiments, it will be apparent to those skilled in the art that various changes and modifications may be made without departing from the spirit and scope of the inventive concept. Therefore, it should be understood that the above example embodiments are not limiting, but illustrative.

What is claimed is:

1. A nonvolatile memory device comprising:
   a nonvolatile memory;
   a volatile memory being a cache memory of the nonvolatile memory;
   a first controller configured to control the nonvolatile memory; and
   a second controller configured to:
      receive a device write command and an address; and
      transmit, to the volatile memory through a first bus, a first read command and the address and a first write command and the address sequentially, and transmit a second write command and the address to the first controller through a second bus, in response to the device write command and the address being received.

2. The nonvolatile memory device of claim 1, wherein the volatile memory is configured to, in response to the first read command and the address being transmitted, transmit, through a memory data line, first data that is stored in an area corresponding to a part of the address, of the volatile memory, and transmit, through a tag data line, a tag that is stored in the area.

3. The nonvolatile memory device of claim 2, wherein the first controller is further configured to:
   receive the first data transmitted from the volatile memory through the memory data line;
   receive the tag transmitted from the volatile memory through the tag data line; and
   selectively store the first data that is received, in the nonvolatile memory based on the address and the tag that is received.

4. The nonvolatile memory device of claim 3, wherein the first controller is further configured to, in response to the tag that is received being different from the part of the address, store the first data that is received, in the nonvolatile memory.

5. The nonvolatile memory device of claim 1, wherein each of the volatile memory and the first controller is further configured to receive write data from an external device,
   wherein the volatile memory is configured to store the write data in a first area corresponding to the address, of the volatile memory, in response to the first write command and the address being transmitted, and
   wherein the first controller is further configured to store the write data in a second area corresponding to the address, of the nonvolatile memory, in response to the second write command and the address being transmitted.

6. The nonvolatile memory device of claim 5, wherein the second controller is further configured to transmit, to the volatile memory, a write tag corresponding to the write data, and wherein the volatile memory is further configured to store both the write data and the write tag in a third area corresponding to a part of the address, of the volatile memory.

7. The nonvolatile memory device of claim 5, wherein the write data is received from the external device through a memory data line after a time period elapses from a point in time when the device write command and the address are received from the external device.

8. The nonvolatile memory device of claim 7, further comprising a serial presence detect chip configured to transmit, to the external device, information of the time period.

9. The nonvolatile memory device of claim 1, further comprising a data buffer connected to an external device and configured to:
   share a memory data line with the volatile memory and the first controller; and
   operate based on a control of the second controller.

10. The nonvolatile memory device of claim 1, wherein the volatile memory is a direct mapping cache memory of the nonvolatile memory.

11. A nonvolatile memory device comprising:
   a nonvolatile memory;
   a volatile memory being a cache memory of the nonvolatile memory;
   a first controller configured to control the nonvolatile memory; and
   a second controller configured to:
      receive a first device read command and an address; and
      transmit a first read command and the address to the volatile memory through a first bus, and transmit a second read command and the address to the first controller through a second bus, in response to the first device read command and the address being received,
   wherein the volatile memory is configured to, in response to the first read command and the address being transmitted, transmit, through a memory data line, first data that is stored in a first area corresponding to a first part of the address, of the volatile memory, and transmit, through a tag data line, a first tag that is stored in the first area.

12. The nonvolatile memory device of claim 11, wherein the first data is transmitted to an external device after a time period elapses from a point in time when the first device read command and the address are received from the external device, and
   wherein the nonvolatile memory device further comprises a serial presence detect chip configured to transmit, to the external device, information of the time period.

13. The nonvolatile memory device of claim 11, wherein the second controller is further configured to:
   receive the first tag transmitted from the volatile memory through the tag data line;
   determine whether a cache hit occurs, based on the first tag that is received and the address; and
   transmit, to an external device, a result of the determination.

14. The nonvolatile memory device of claim 13, wherein the first controller is further configured to, in response to the determination that the cache hit does not occur, read second data from a second area corresponding to the address, of the nonvolatile memory.

15. The nonvolatile memory device of claim 14, wherein the second controller is further configured to:
   receive, from the external device, a second device read command and the address; and
   transmit a first write command and the address to the volatile memory through the first bus, and transmit a third read command and the address to the first controller through the second bus, in response to the second device read command and the address being received.

16. The nonvolatile memory device of claim 15, wherein the first controller is further configured to transmit the second data that is read, through the memory data line in response to the third read command and the address being transmitted.

17. The nonvolatile memory device of claim 16, wherein the volatile memory is further configured to receive the second data transmitted from the first controller through the memory data line, and store the second data that is received in the first area of the volatile memory, in response to the first write command and the address being transmitted.

18. The nonvolatile memory device of claim 16, wherein the first controller is further configured to transmit, through the tag data line, a second tag comprising a second part of the address in synchronization with a point in time when the second data is transmitted through the memory data line.

19. A nonvolatile memory device comprising:
   a nonvolatile memory;
   a volatile memory being a cache memory of the nonvolatile memory;
   a first controller configured to share a memory data line with the volatile memory, and control the nonvolatile memory; and
   a second controller configured to:
      share a tag data line with the volatile memory and the first controller;
      receive a first device read command and an address from an external device; and
      transmit a first read command and the address to the volatile memory through a first bus, and transmit a second read command and the address to the first controller through a second bus, in response to the first device read command and the address being received,
   wherein the volatile memory is configured to, in response to the first read command and the address being transmitted, transmit, through the memory data line, first data that is stored in a first area corresponding to a part of the address, of the volatile memory, and transmit, through the tag data line, a tag that is stored in the first area, and
   wherein the second controller is further configured to:
      receive the tag transmitted from the volatile memory through the tag data line;
      determine whether a cache hit occurs, based on the tag that is received and the address; and
      transmit, to the external device, a result of the determination.

* * * * *